United States Patent
Kawashima et al.

(10) Patent No.: US 6,292,408 B1
(45) Date of Patent: Sep. 18, 2001

(54) SEMICONDUCTOR MEMORY DEVICE AND A SEMICONDUCTOR INTEGRATED CIRCUIT

(76) Inventors: Shoichiro Kawashima; Toshihiko Mori; Makoto Hamaminato, all of c/o Fujitsu Limited, 1-1, Kamikodanaka 4-chome, Nakahara-ku, Kawasaki-shi, Kanagawa, 211 (JP)

( * ) Notice: Subject to any disclaimer, the term of this patent is extended or adjusted under 35 U.S.C. 154(b) by 0 days.

(21) Appl. No.: 09/479,236

(22) Filed: Jan. 7, 2000

Related U.S. Application Data

(62) Division of application No. 09/013,549, filed on Jan. 26, 1998.

(30) Foreign Application Priority Data

| Feb. 7, 1997 | (JP) | 9-24210 |
| Feb. 28, 1997 | (JP) | 9-44984 |
| Mar. 13, 1997 | (JP) | 9-58653 |

(51) Int. Cl.$^7$ ............................................ G11C 7/00
(52) U.S. Cl. .................. 365/189.11; 365/189.05; 365/189.06; 365/203
(58) Field of Search ............. 365/189.05, 189.06, 365/189.11, 203, 230.06, 45

(56) References Cited

U.S. PATENT DOCUMENTS

| 5,058,067 | 10/1991 | Kertis | 365/189.11 |
| 5,684,745 | 11/1997 | Kim et al. | 365/189.11 |
| 5,719,811 | 2/1998 | Kondou | 365/189.11 |
| 5,742,185 | * 4/1998 | Lee | 365/203 |
| 5,777,928 | * 7/1998 | Vidwans et al. | 365/189.05 |
| 5,833,841 | 3/1999 | Wendell | 365/189.11 |
| 5,870,326 | * 2/1999 | Schuelein | 365/94 |
| 5,886,947 | * 3/1999 | Lee | 365/203 |

FOREIGN PATENT DOCUMENTS

| 55-125780 | 9/1980 | (JP) |
| 63-305611 | 12/1988 | (JP) |
| 5-502312 | 4/1993 | (JP) |

\* cited by examiner

Primary Examiner—Son T. Dinh

(57) ABSTRACT

A semiconductor memory device which can reduce a power consumption by reducing a charging and discharging current for a gate capacity of a transistor used for pulling up a bit line which constitutes a write recovery circuit. A pair of first and second bit lines are connected to a memory cell. A potential of one of the first and second bit lines is decreased during a write cycle in accordance with write data. A first loading element is connected between a power source line and the first bit line. The power source line supplies a positive power source voltage. A second loading element is connected between the power source line and the second bit line. A first transistor is provided for pulling up the first bit line. The first transistor has a current input terminal connected to the power source line and a current output terminal connected to the first bit line. A second transistor is provided for pulling up the second bit line. The second transistor has a current input terminal connected to the power source line and a current output terminal connected to the second bit line. A transistor drive circuit drives, during a write recovery period, one of the first transistor and the second transistor which is connected to one of the first bit line and the second bit line which is set to a lower potential.

11 Claims, 47 Drawing Sheets

F I G. 10
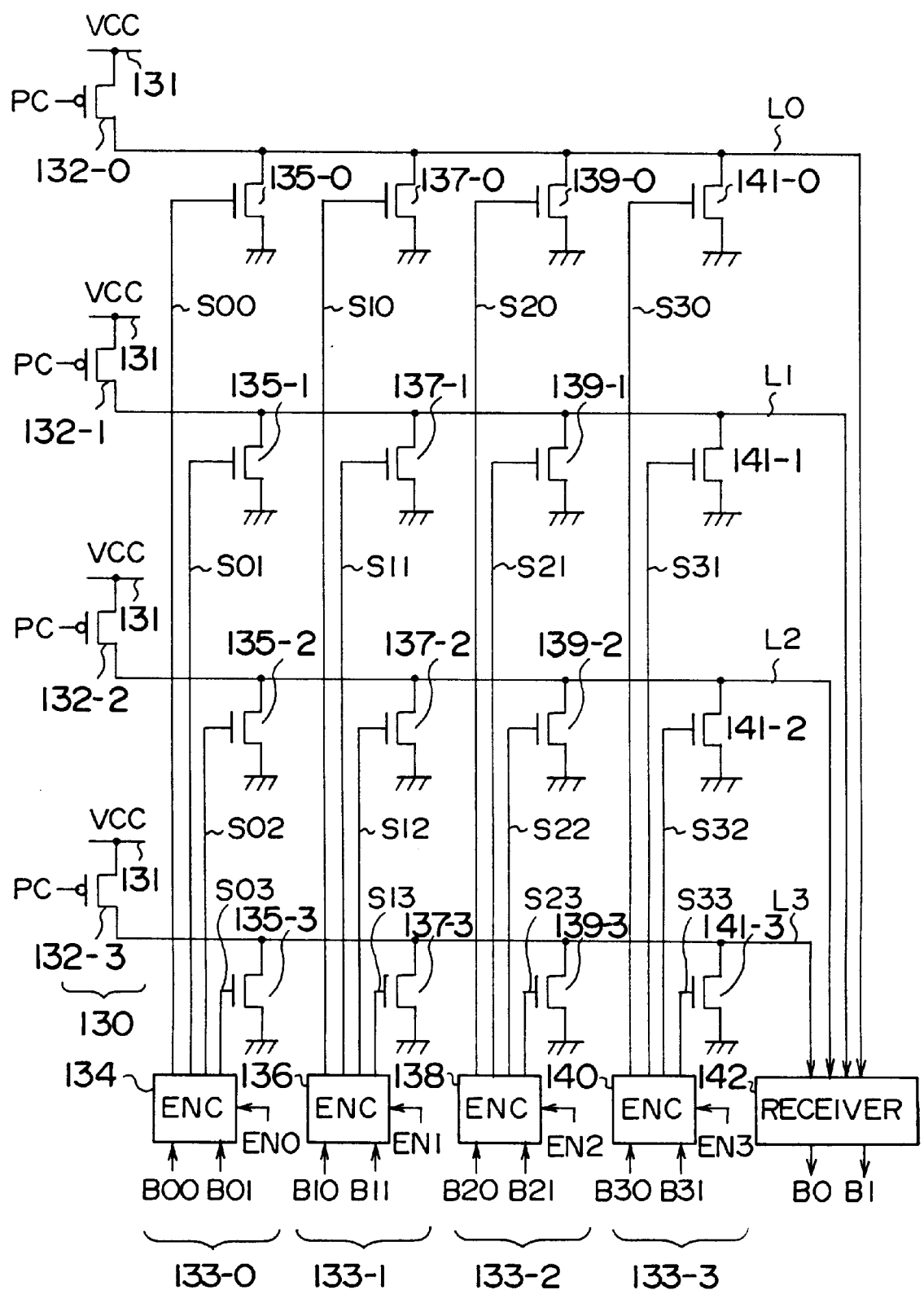

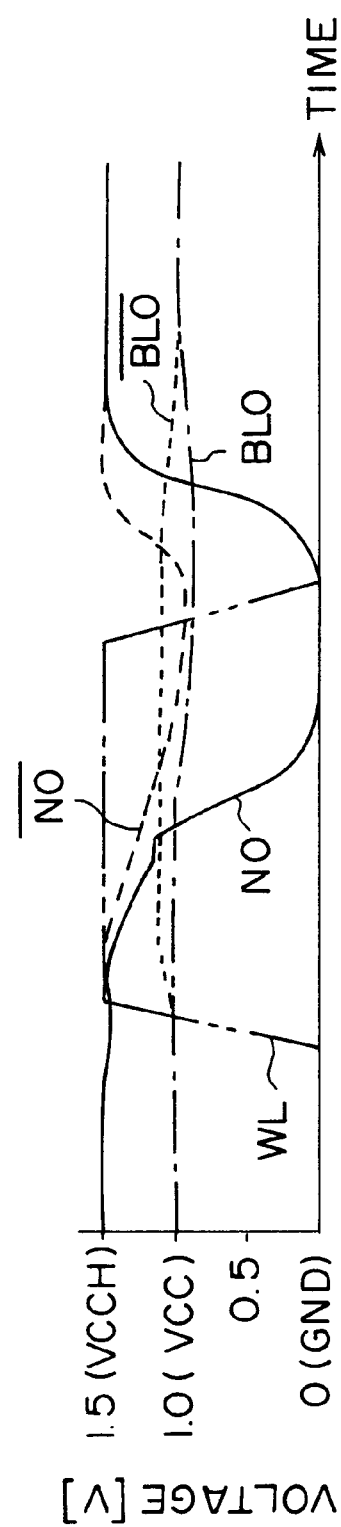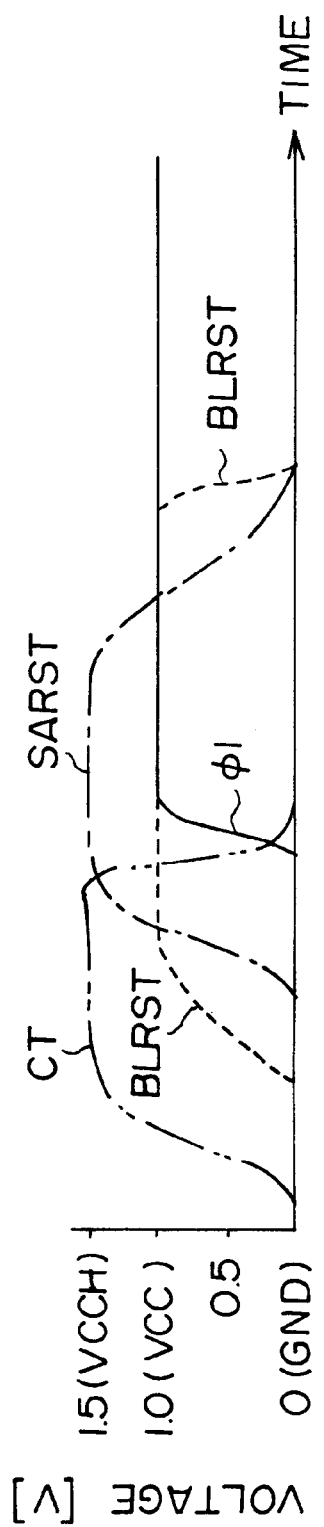

SEMICONDUCTOR MEMORY DEVICE AND A SEMICONDUCTOR INTEGRATED CIRCUIT

This application is a divisional application filed under 37 CFR §1.53(b) of parent application Ser. No. 09/013,549, filed Jan. 26, 1998.

FIELD OF THE INVENTION

The present invention relates to a semiconductor memory device and a semiconductor integrated circuit, and more particularly to a semiconductor memory device which converts write data provided from an external device into complementary data, and to a semiconductor integrated circuit having a plurality of data lines which are reset prior to transmission and a semiconductor integrated circuit which is provided with a clock signal having a predetermined phase difference with respect to a main clock signal.

A demand for a semiconductor memory device having low power consumption has been increased for extending a battery life of a portable device using semiconductor memory devices. Additionally, the demand has been also increased so as to maintain an amount of heat within an allowable range of a plastic package when the circuit scale is increased.

When data is transmitted through a data bus in the semiconductor memory device, an electric charge is provided to and removed from the data bus in the semiconductor memory device. The amount of electric charge is calculated by (voltage amplitude×capacity of data bus×number of switching operations×number of data buses).

In recent semiconductor integrated circuits, a width of a data bus has increased to 32 bits or 64 bits, and a signal frequency has increased to as high as 100 MHz. Additionally, since the data bus has a large capacity, a large power is consumed for transmission of data in the semiconductor integrated circuit. Accordingly, it is an important issue to reduce the power consumption of the data bus.

DESCRIPTION OF THE RELATED ART

FIG. 1 is a circuit diagram of a part of a conventional static random access memory (static RAM). In FIG. 1, the reference numeral 1 indicates a memory cell, 1A and 1B indicate data input/output nodes, and BL and /BL indicate bit lines.

The reference numeral 2 indicates a pMOS transistor having a 7-μm gate width. The pMOS transistor 2 corresponds to a loading element of the bit line BL. A source of the pMOS transistor 2 is connected to a VCC power source line 4 which provides a power source voltage VCC. A drain of the pMOS transistor is connected to the bit line BL.

The reference numeral 3 indicates a pMOS transistor having a gate width the same as that of the pMOS transistor 2. The pMOS transistor 3 corresponds to a loading element of the bit line /BL. A source of the pMOS transistor 3 is connected to the VCC power source line 4. A drain of the pMOS transistor 3 is connected to the bit line BL.

The reference numeral 5 indicates a write recovery circuit, and 6 indicates an inverter for inverting a write recovery signal WR which controls a write recovery operation. The write recovery signal WR is at a high logic level (H-level) during a write recovery period, and at a low logic level (L-level) during periods other than the write recovery period.

The reference numeral 7 indicates a pMOS transistor which is provided for pulling up the bit line BL. The pMOS transistor 7 which has a 18-μm gate width is provided for the bit line BL. A source of the pMOS transistor 7 is connected to the VCC power source line 4. A drain of the pMOS transistor 7 is connected to the bit line BL. The pMOS transistor 7 is controlled to be turned on and off by an output of the inverter 6.

The reference numeral 8 indicates a pMOS transistor which is provided for pulling up the bit line /BL. The pMOS transistor 8 has a gate width the same as that of the pMOS transistor 7. A source of the pMOS transistor 8 is connected to the VCC power source line 4. A drain of the pMOS transistor 8 is connected to the bit line /BL. The pMOS transistor 8 is controlled to be turned on and off by the output of the inverter 6.

In the static RAM having the above-mentioned structure, the VCC power source voltage is provided to the bit lines BL and /BL via the pMOS transistors 2 and 3, respectively. Thus, when the memory cell 1 is selected in a read cycle, one of the bit lines BL and /BL is maintained at the power source voltage VCC in accordance with read data from the memory cell 1 and the other one of the bit lines BL and /BL is set to a voltage slightly lower than the power source voltage VCC. Accordingly, a small voltage difference is generated between the bit lines BL and /BL, and is amplified by a sense amplifier (not shown in the figure).

On the other hand, when the memory cell 1 is selected in a write cycle, one of the bit lines BL and /BL is maintained at the power source voltage VCC in accordance with write data to the memory cell 1 and the other one of the bit lines BL and /BL is set to a ground level voltage (zero volts) so as to perform a write operation to the memory cell 1.

FIG.2 is a waveform chart for explaining an operation of the write recovery circuit 5. FIG. 2 indicates changes in voltages at the bit lines BL and /BL and changes in the write recovery signal WR when the operation is shifted as write cycle→read cycle A→read cycle B.

When the operation is shifted from the read cycle A to the read cycle B, the power source voltage VCC is provided, for example, to the bit line BL and a voltage slightly lower than the power source voltage VCC is provided to the bit line /BL during the read cycle A. Thereafter, the power source voltage VCC is provided to the bit line /BL and a voltage slightly lower than the power source voltage VCC is provided to the bit line BL during the read cycle B. In this case, the voltage provided to the bit line /BL must be increased to the power source voltage VCC during the read cycle B. This operation can be done by the pMOS transistor 3 which is a loading element of the bit line /BL.

On the other hand, when the operation is shifted from the write cycle to the read cycle A, the power source voltage VCC is provided, for example, to the bit line /BL and the bit line BL is set to the ground voltage (zero volts) during the write cycle. Then, if the power source voltage VCC is provided to the bit line BL and a voltage slightly lower than the power source voltage VCC is provided to the bit line /BL during the read cycle A, the voltage provided to the bit line BL must be increased from zero volts to the power source voltage VCC during the read cycle A.

When this operation is performed by the pMOS transistor 2 which is a loading element of the bit line BL, the voltage at the bit line BL cannot be rapidly increased to the power source voltage VCC as indicated by a double dashed chain line in FIG. 2. Accordingly, the small voltage difference due to the read data between the bit lines BL and /BL cannot be generated unless the period of the operation cycle is extended. Thus, a high-speed operation cannot be achieved.

In the above-mentioned static RAM, when a write cycle is shifted to a read cycle, the write recovery signal WR is set to the H-level during a predetermined period as a writer recovery period. The output of the inverter 6 is set to the L-level, and pMOS transistors 7 and 8 are turned on. When the bit line BL is at zero volts, the bit line BL is charged via the pMOS transistor 7 which has a greater gate width than that of the pMOS transistor 2 so that the voltage at the bit line BL is rapidly increased to the power source voltage VCC. When the bit line /BL is at zero volts, the bit line /BL is charged via the pMOS transistor 8 which, similarly, has a greater gate width than that of the pMOS transistor 3 so that the voltage of the bit line BL is rapidly increased to the power source voltage VCC.

In the static RAM, the pMOS transistor 8, which is provided for the bit line /BL and does not need to be pulled up, is driven during the write recovery period. Thus, a discharge is made for a gate capacity of the pMOS transistor 8, which does not need to be driven, during the write recovery period. Thereafter, when the write recovery period is terminated, a charge is performed for the gate capacity.

Since each of the pMOS transistors 7 and 8, which are provided for pulling up bit lines, has a large gate width, a large current flows for charging and discharging the gate capacity. This is one of the causes for increasing power consumption.

Additionally, there is a static RAM which performs an input and output operation for a plurality of bit lines at the same time. In such a static RAM, a plurality of data input buffers and a plurality of pairs of write buffer lines are provided in accordance with the write data comprising a plurality of bits. However, in the conventional static RAM, the plurality of data input buffers are collectively controlled by a single write signal.

In such a static RAM, when (x+y) data input buffers are provided and when the higher order (x) bits do not need to be changed and the lower (y) bits do need to be changed, the (x+y)-bit data is read first. Thereafter, lower order (n) bits are rewritten by an ALU, and then the (x+y) bit data is written.

In such a case, if only the lower order (y) bits should be rewritten, there is no need to drive pairs of write data lines corresponding to the bits which do not need to be rewritten. Thus, a charge and discharge current for the pairs of write data lines can be reduced, resulting in reduction in the power consumption of the static RAM.

FIG. 3 is a circuit diagram of a part of the conventional semiconductor integrated circuit. In FIG. 3, L0, L1, L2 and L3 indicate data lines which are arranged in parallel to transmit data. The reference numeral 10 indicates a data line precharge circuit which precharges the data lines L0, L1, L2 and L3 at a high-potential level (H-level) prior to transmission.

B0 and B1 indicate data to be transmitted. The reference numeral 11 indicates a transceiver for sending data; 12 indicates a driver for driving the data lines L0 and L1 when the data B0 to be transmitted is input; and 13 indicates a driver for driving the data lines L2 and L3 when the data B1 to be transmitted is input.

The driver 12 maintains the data line L1 at a floating state and discharges the data line L0 to a low potential level (L-level) when the data B0 is at the low level (L-level). Additionally, the driver 12 maintains the data line L0 at a floating state and discharges the data line L1 to the L-level when the data B0 is at the H-level.

The driver 13 maintains the data line L3 at a floating state and discharges the data line L2 to the L-level when the data B1 is at the L-level. Additionally, the driver 13 maintains the data line L2 at a floating state and discharges the data line L3 to the L-level when the data B1 is at the H-level.

Accordingly, a relationship between the logic levels of the data B0 and B1 to be transmitted and the logic levels of the data lines L0, L1, L2 and L3 is represented by the following Table 1.

TABLE 1

| B0 | B1 | L0 | L1 | L2 | L3 |
|----|----|----|----|----|----|
| L  | L  | L  | H  | L  | H  |
| L  | H  | L  | H  | H  | L  |
| H  | L  | H  | L  | L  | H  |
| H  | H  | H  | L  | H  | L  |

The reference numeral 14 indicates a receiver for receiving data; 15 indicates a regeneration circuit for regenerating the data B0 to be transmitted based on the logic levels of the data lines L0 and L1; and 16 indicates a regeneration circuit for regenerating the data B1 to be transmitted based on the logic levels of the data lines L2 and L3.

In the conventional semiconductor integrated circuit shown in FIG. 3, when the 2-bit data B0 and B1 are transmitted through the four data lines L0, L1, L2 and L3, two of the four data lines must always be discharged irrespective of contents of the data B0 and B1 to be transmitted. This invites a problem that a power consumption is increased.

A description will now be given of a problem in a semiconductor integrated circuit having a circuit which requires a clock signal having a predetermined phase difference from a main clock signal supplied by an external device.

Such a semiconductor device has a phase synchronization loop circuit which includes a voltage controlled oscillator. A clock signal output from the voltage controlled oscillator is supplied to circuits which require the clock signal having the predetermined phase difference which is generated by delaying the main clock signal. The clock signal is supplied to the circuits via a clock transmitting circuit composed of a plurality of gate circuits connected in series.

In the above-mentioned conventional semiconductor integrated circuit, a delay time determined by the clock transmission circuit varies due to a change in a process condition, a change in a temperature of the circuit and a change in a power source voltage. Accordingly, there is a problem in that an accurate clock signal cannot be supplied to the circuits which require the clock signal having the phase difference which is generated by delaying the main clock signal.

SUMMARY OF THE INVENTION

It is a general object of the present invention to provide an improved and useful semiconductor memory device and semiconductor integrated circuit in which the above-mentioned problems are eliminated.

A more specific object of the present invention is to provide a semiconductor memory device which can reduce a power consumption by reducing a charging and discharging current for a gate capacity of a transistor used for pulling up a bit line which constitutes a write recovery circuit.

Another object of the present invention is to provide a semiconductor memory device which can reduce a power consumption by reducing a charging and discharging current for a pair of write data lines.

Another object of the present invention is to provide a semiconductor integrated circuit in which a power consumption of a data line is reduced.

A further object of the present invention is to provide a semiconductor integrated circuit which can provide an accurate clock signal to a circuit which requires a clock signal generated by delaying a predetermined clock signal to produce a predetermined phase difference irrespective of changes in a process condition, a temperature and a power source voltage of the circuit.

In order to achieve the above-mentioned objects, there is provided according to one aspect of the present invention a semiconductor memory device comprising:

- a pair of first and second bit lines connected to a memory cell, a potential of one of the first and second bit lines being decreased during a write cycle in accordance with write data;
- a first loading element connected between a power source line and the first bit line, the power source line supplying a positive power source voltage;
- a second loading element connected between the power source line and the second bit line;
- a first transistor for pulling up the first bit line, the first transistor having a current input terminal connected to the power source line and a current output terminal connected to the first bit line;
- a second transistor for pulling up the second bit line, the second transistor having a current input terminal connected to the power source line and a current output terminal connected to the second bit line; and
- a transistor drive circuit for driving, during a write recovery period, one of the first transistor and the second transistor which is connected to one of the first bit line and the second bit line which is set to a lower potential.

According to the above-mentioned invention, during the write recovery period, a charge and discharge operation is performed for the gate capacity of the transistors connected to the bit lines which are set to a lower potential and for the gate capacity of the transistors included in the transistor drive circuit. However, since the total width of the gates of the transistors included in the transistor drive circuit can be smaller than the total width of the gates of the first and second transistors for pulling up the first and second bit lines, the charging and discharging current for the gate capacity can be reduced as compared to a case in which both the first and second transistors are driven.

In one embodiment of the present invention, the transistor drive circuit may drive the first transistor and the second transistor by controlling a potential of a first data transmission line including the first bit line, a potential of a second data transmission line including the second bit line and a write recovery signal for controlling a write recovery operation.

The transistor drive circuit may include a first NAND circuit and a second NAND circuit, the first NAND circuit driving the first transistor by performing a NAND operation on the write recovery signal and a potential of the second data transmission line, the second NAND circuit driving the second transistor by performing a NAND operation on the write recovery signal and a potential of the first data transmission line.

Additionally, the transistor drive circuit may comprise:

- a first p-channel insulated gate type field effect transistor having a source connected to the power source line and a drain connected to a first output node, the write recovery signal being provided to a gate of the first p-channel insulated gate type field effect transistor;
- a first n-channel insulated gate type field effect transistor having a drain connected to the first output node, a potential of the first data transmission line being provided to a source of the first n-channel insulated gate type field effect transistor, the write recovery signal being provided to a gate of the first n-channel insulated gate type field effect transistor;
- a second p-channel insulated gate type field effect transistor having a source connected to the power source line and a drain connected to a second output node, the write recovery signal being provided to a gate of the second p-channel insulated gate type field effect transistor; and
- a second n-channel insulated gate type field effect transistor having a drain connected to the second output node, a potential of the second data transmission line being provided to a source of the second n-channel insulated gate type field effect transistor, the write recovery signal being provided to a gate of the second n-type insulated gate type field effect transistor,
- wherein the first transistor and the second transistor are driven by voltages of the first output node and the second output node.

Additionally, there is provided according to another aspect of the present invention a semiconductor memory device for storing write data comprising n bits, n being an integer greater than 2, the semiconductor memory device comprising:

- n data input buffers each of which inputs a write control signal and a corresponding one of n bits of the write data; and
- n pairs of write data lines, each pair being connected to a respective one of the data input buffers,
- wherein an activation and deactivation of each of the data input buffers is controlled separately by the corresponding write control signal.

According to the above-mentioned invention, when an arbitrary bits are changed among n bits of the data, only data input buffers corresponding to the bits to be changed can be activated so as to rewrite the bits to be changed. Thus, there is no need to read whole data comprising n bits and write the whole data again so as to change the desired bits from among n bits.

In one embodiment according to this invention,

- each of the data input buffers maintains one of the write data lines connected thereto at a logic high level and sets the other one of the write data lines connected thereto to a logic low level when activated during a write cycle, and
- each of the data input buffers may maintain both the write data lines connected thereto at the logic high level when deactivated during the write cycle.

Additionally, each of the data input buffers may comprise:

- a first inverter, having an input terminal and an output terminal, for inverting the write data;
- a first switching element having a first terminal and a second terminal, the first terminal connected to the output of the first inverter, the first switching element being turned on when the write control signal and the data transfer signal input thereto are in an active state and turned off when the data transfer signal input thereto is in an inactive state;
- a first latch circuit including a second inverter and a first NOR circuit, the second inverter having an input terminal connected to the second terminal of the first switching element, the first NOR circuit having a first input terminal, a second input terminal and an output terminal, the first input terminal of the first NOR circuit connected to an output terminal of the second inverter, the output terminal of the first NOR circuit connected to the input terminal of the second inverter, a data line reset signal being provided to the second input terminal of the first NOR circuit;

a third inverter having an input terminal and an output terminal, the input terminal connected to the output terminal of the first inverter;

a second switching element having a first terminal and a second terminal, the first terminal connected to the output of the third inverter, the second switching element being turned on when the write control signal and the data transfer signal input thereto are in an active state and turned off when the data transfer signal input thereto is in an inactive state; and a second latch circuit including a fourth inverter and a second NOR circuit, the fourth inverter having an input terminal connected to the second terminal of the second switching element, the second NOR circuit having a first input terminal, a second input terminal and an output terminal, the first input terminal of the second NOR circuit connected to an output terminal of the fourth inverter, the output terminal of the second NOR circuit connected to the input terminal of the fourth inverter, the data line reset signal being provided to the second input terminal of the second NOR circuit.

Additionally, there is provided according to another aspect of the present invention a semiconductor integrated circuit comprising:

a plurality of data lines which are reset to a predetermined potential prior to transmitting data;

a transceiver connected to the data lines, the transceiver encoding transmission data which is to be transmitted so as to change a potential of one of the data lines in accordance with contents of the transmission data, the transmission data comprising a plurality of parallel bits; and a receiver connected to the data lines, the receiver decoding potentials of the data lines so as to regenerate the transmission data.

According to the above-mentioned invention, the transmission data comprising a plurality of parallel bits can be transmitted by changing one of a plurality of data lines, that is, by charging and discharging one of a plurality of data lines. Thus, power consumption of the data lines can be reduced.

The semiconductor integrated circuit according to the present invention may further comprise a data line precharge circuit which resets the plurality of the data lines by precharging the plurality of the data lines to a high potential level, wherein the transceiver includes a plurality of transceiver units, each of the transceiver units comprising:

a plurality of n-channel insulated gate type field effect transistors each of which is provided to a corresponding one of the plurality of the data lines, a drain of each of the n-channel insulated gate type field effect transistors being connected to the corresponding one of the data lines, a source of each of the n-channel insulated gate type field effect transistors being grounded;

an encoder controlled to be in one of an active state and an inactive state by a control signal, the encoder encoding the transmission data so that one of the plurality of the n-channel insulated gate type field effect transistors is turned on and the rest of the plurality of the n-channel insulated gate type transistors are turned off in accordance with contents of the transmission data when the encoder is set to the active state, all of the plurality of the n-channel insulated gate type field effect transistors being turned off when the encoder is set to the inactive state.

According to this invention, the transmission data comprising a plurality of parallel bits can be transmitted by charging and discharging one of a plurality of data lines. Additionally, the output circuit which drives the data lines is not an inverter but an open drain circuit comprising n-channel insulated gate type field effect transistors. This structure reduces a junction capacity of the output circuit which is connected to the data lines. Thus, power consumption of the data lines can be reduced.

Additionally, the semiconductor integrated circuit according to the present invention may further comprise a data line precharge circuit which resets the plurality of the data lines by precharging the plurality of the data lines to a high potential level, wherein the transceiver includes a plurality of transceiver units, each of the transceiver units comprising:

a plurality of p-channel insulated gate type field effect transistors each of which is provided to a corresponding one of the plurality of the data lines, a source of each of the p-channel insulated gate type field effect transistors being connected to the corresponding one of the data lines, a drain of each of the p-channel insulated gate type field effect transistors being grounded;

an encoder controlled to be in one of an active state and an inactive state by a control signal, the encoder encoding the transmission data so that one of the plurality of the p-channel insulated gate type field effect transistors is turned on and the rest of the plurality of the p-channel insulated gate type field effect transistors are turned off in accordance with contents of the transmission data when the encoder is set to the active state, all of the plurality of the p-channel insulated gate type field effect transistors being turned off when the encoder is set to the inactive state.

According to this invention, the transmission data comprising a plurality of parallel bits can be transmitted by charging and discharging one of a plurality of data lines. Additionally, the output circuit which drives the data lines is not an inverter but a source follower circuit comprising p-channel insulated gate type field effect transistors. This structure reduces a junction capacity of the output circuit which is connected to the data lines, and also reduces an amplitude of the output voltage. Thus, power consumption of the data lines can be reduced. Additionally, since the source follower circuit has a high capability of driving a current in an initial stage and a voltage difference greater than that generated by a receiving sensitivity can be generated at a high speed, a high-speed data transmission can be achieved.

In one embodiment according to the present invention, the encoder may comprise a path gate logic circuit.

Additionally, the semiconductor integrated circuit according to the present invention may further comprise a data line precharge circuit which resets the plurality of the data lines by precharging the plurality of the data lines to a high potential level, wherein the transceiver comprises:

a plurality of latch circuits which hold data read from memory cells as complementary data; and a first path gate logic circuit connected between the plurality of the data lines and complementary data holding nodes of the plurality of the latch circuits, the first path gate logic circuit encoding the complementary data held by the plurality of the latch circuits as the transmission data so as to discharge one of the plurality of the data lines in accordance with contents of the complementary data.

According to the above invention, the transmission data comprising a plurality of parallel bits can be transmitted by changing one of a plurality of data lines, that is, by charging and discharging one of a plurality of data lines. Thus, power consumption of the data lines can be reduced. Additionally, a number of transistors which are necessary for constituting the encoder can be reduced. Accordingly, an area of patterns of the semiconductor device can be reduced, and a delay in data transmission can be reduced.

Additionally, the receiver may comprise:

a second path gate logic circuit which decodes potentials of the plurality of the data lines so as to regenerate the complementary data held by the plurality of the latch circuits; and an amplifying circuit which amplifies an output of the second path gate logic circuit.

According to this invention, a number of transistors which are necessary for constituting the decoder can be reduced. Accordingly, an area of patterns of the semiconductor device can be reduced, and a delay in data transmission can be reduced.

Additionally, the receiver may comprise:

an analog multiplying circuit which decodes potentials of the plurality of the data lines so as to regenerate the complementary data held by the plurality of the latch circuits; and an amplifying circuit which amplifies an output of the analog multiplying circuit.

According to this invention, potentials of the data lines can be decoded even when the discharge potential is a middle level and a change in the potential of the data line to be driven has a small amplitude. Thus, a high-speed data transmission can be achieved.

In one embodiment according to the present invention, a number of the plurality of data lines may be four, and the plurality of the latch circuits may include a first latch circuit and a second latch circuit, wherein the first latch circuit includes a first n-channel insulated gate type field effect transistor and a second n-channel insulated gate type field effect transistor, drains and gates of the first and second n-channel insulated gate type field effect transistors being cross connected, the drains of the first and second n-channel insulated gate type field effect transistors being connected to a pair of a first bit line and a second bit line which are connected to the memory cells when the transmission data is read from the memory cells; and the second latch circuit includes a third n-channel insulated gate type field effect transistor and a fourth n-channel insulated gate type field effect transistor, drains and gates of the third and fourth n-channel insulated gate type field effect transistors being cross connected, the drains of the third and fourth n-channel insulated gate type field effect transistors being connected to a pair of a third bit line and a fourth bit line which are connected to the memory cells when the transmission data is read from the memory cells.

Additionally, the first path gate logic circuit may include first, second, third and fourth p-channel insulated gate type field effect transistors, a source of each off the first, second, third and fourth p-channel insulated gate type field effect transistors being connected to a corresponding one of the data lines, a drain of each of the first, second, third and fourth p-channel insulated gate type field effect transistors being connected to a corresponding one of the complementary data holding nodes of the first and second latch circuits, a gate of each of the first, second, third and fourth p-channel insulated gate type field effect transistors being connected to a corresponding one of the complementary data holding nodes of the first and second latch circuits so that one of the four data lines is discharged in accordance with contents of the complementary data held by the first and second latch circuits when the transmission data is transmitted.

Additionally, in one embodiment according to the present invention, the receiver may comprise:

a second path gate logic circuit which includes fifth, sixth, seventh, eighth, ninth, tenth, eleventh and twelfth p-channel insulated gate type field effect transistors, sources and gates of the fifth and sixth p-channel insulated gate type field effect transistors being cross connected, the drains of the fifth and sixth p-channel insulated gate type field effect transistors being connected to a first node, each of the sources of the fifth and sixth p-channel insulated gate type field effect transistors being connected to a corresponding one of the plurality of the four data lines, sources and gates of the seventh and eighth p-channel insulated gate type field effect transistors being cross connected, the drains of the seventh and eighth p-channel insulated gate type field effect transistors being connected to a second node, each of the sources of the seventh and eighth p-channel insulated gate type field effect transistors being connected to a corresponding one of the plurality of the four data lines, sources and gates of the ninth and tenth p-channel insulated gate type field effect transistors being cross connected, the drains of the ninth and tenth p-channel insulated gate type field effect transistors being connected to a third node, each of the sources of the ninth and tenth p-channel insulated gate type field effect transistors being connected to a corresponding one of the plurality of the four data lines, sources and gates of the eleventh and twelfth p-channel insulated gate type field effect transistors being cross connected, the drains of the eleventh and twelfth p-channel insulated gate type field effect transistors being connected to a fourth node, each of the sources of the eleventh and twelfth p-channel insulated gate type field effect transistors being connected to a corresponding one of the plurality of the four data lines;

a reset circuit which resets the first, second, third and fourth nodes to a ground potential prior to a transmission of the transmission data;

a third latch circuit including fifth and sixth n-channel insulated gate type field effect transistors, drains and gates of the fifth and sixth n-channel insulated gate type field effect transistors being cross connected, the drains of the fifth and sixth n-channel insulated gate type field effect transistors being connected to the first and second nodes, respectively; and a fourth latch circuit including seventh and eighth n-channel insulated gate type field effect transistors, drains and gates of the seventh and eighth n-channel insulated gate type field effect transistors being cross connected, the drains of the seventh and eighth n-channel insulated gate type field effect transistors being connected to the third and fourth nodes, respectively.

Additionally, in one embodiment according to the present invention, the receiver may comprise a first decoder which regenerates the complementary data held by the first latch circuit and a second decoder which regenerates the complementary data held by the second latch circuit, the first decoder including:

a first analog amplifying circuit including ninth, tenth, eleventh and twelfth n-channel insulated gate type field effect transistors, wherein a drain of the ninth n-channel insulated gate type field effect transistor is connected to a fifth node, a gate of the ninth n-channel insulated gate type field effect transistor being connected to a corresponding one of the data lines, a drain of the tenth n-channel insulated gate type field effect transistor being connected to a source of the ninth n-channel insulated gate type field effect transistor, a gate of the tenth n-channel insulated gate type field effect transistor being connected to a corresponding one of the data lines, a source of the tenth n-channel insulated gate type field effect transistor being connected to a sixth node, a drain of the eleventh n-channel insulated gate type field effect transistor being connected to the fifth node, a gate of the eleventh n-channel insulated gate type field effect transistor being connected to a gate of the tenth n-channel insulated gate type field effect transistor, a drain of the twelfth n-channel insulated gate type field effect transistor being connected a source of the eleventh n-channel insulated gate type field effect transistor, a gate of the twelfth n-channel insulated gate type field effect transistor being connected to a gate of the ninth n-channel insulated gate type field effect transistor, a source of the twelfth n-channel insulated gate type field effect transistor being connected to the sixth node;

a second analog amplifying circuit including thirteenth, fourteenth, fifteenth and sixteenth n-channel insulated gate type field effect transistors, wherein a drain of the thirteenth n-channel insulated gate type field effect transistor is connected to a seventh node, a gate of the thirteenth n-channel insulated gate type field effect transistor being connected to a corresponding one of the data lines, a drain of the fourteenth n-channel insulated gate type field effect transistor being connected to a source of the thirteenth n-channel insulated gate type field effect transistor, a gate of the fourteenth n-channel insulated gate type field effect transistor being connected to a corresponding one of the data lines, a source of the fourteenth n-channel insulated gate type field effect transistor being connected to an eighth node, a drain of the fifteenth n-channel insulated gate type field effect transistor being connected to the seventh node, a gate of the fifteenth n-channel insulated gate type field effect transistor being connected to the gate of the fourteenth n-channel insulated gate type field effect transistor, a drain of the sixteenth n-channel insulated gate type field effect transistor being connected to a source of the fifteenth n-channel insulated gate type field effect transistor, a gate of the sixteenth n-channel insulated gate type field effect transistor being connected to the gate of the thirteenth n-channel insulated gate type field effect transistor, a source of the sixteenth n-channel insulated gate type field effect transistor being connected to the eighth node;

a fifth latch circuit including thirteenth and fourteenth p-channel insulated gate type field effect transistors and seventeenth and eighteenth n-channel insulated gate type field effect transistors, wherein gates and drains of the thirteenth and fourteenth p-channel insulated gate type field effect transistors are cross connected, the drains of the thirteenth and fourteenth p-channel insulated gate type field effect transistors being connected to the fifth and seventh nodes, respectively, a power source voltage being provided to sources of the thirteenth and fourteenth p-channel insulated gate type field effect transistors, a drain of the seventeenth n-channel insulated gate type field effect transistor being connected to the sixth node, a gate of the seventeenth n-channel insulated gate type field effect transistor being connected to the seventh node, a drain of the eighteenth n-channel insulated gate type field effect transistor being connected to the eighth node, a gate of the eighteenth n-channel insulated gate type field effect transistor being connected to the fifth node; and a first reset circuit including fifteenth and sixteenth p-channel insulated gate type field effect transistors and nineteenth and twentieth n-channel insulated gate type field effect transistors, wherein a drain of the fifteenth p-channel insulated gate type field effect transistor is connected to the fifth node, the power source voltage being provided to a source of the fifteenth p-channel insulated gate type field effect transistor, an on/off operation of the fifteenth p-channel insulated gate type field effect transistor being controlled by a reset signal, a drain of the sixteenth p-channel insulated gate type field effect transistor being connected to the seventh node, the power source voltage being provided to a source of the sixteenth p-channel insulated gate type field effect transistor, an on/off operation of the sixteenth p-channel insulated gate type field effect transistor being controlled by the reset signal, a drain of the nineteenth n-channel insulated gate type field effect transistor being connected to a source of the seventeenth n-channel insulated gate type field effect transistor, a ground voltage being provided to a source of the nineteenth n-channel insulated gate type field effect transistor, an on/off operation of the nineteenth n-channel insulated gate type field effect transistor being controlled by the reset signal, a drain of the twentieth n-channel insulated gate type field effect transistor being connected to a source of the eighteenth n-channel insulated gate type field effect transistor, the ground voltage being provided to a source of the twentieth n-channel insulated gate type field effect transistor, an on/off operation of the twentieth n-channel insulated gate type field effect transistor being controlled by the reset signal, and the second decoder including:

a third analog amplifying circuit including twenty-first, twenty-second, twenty third and twenty-fourth n-channel insulated gate type field effect transistors, wherein a drain of the twenty-first n-channel insulated gate type field effect transistor is connected to a ninth node, a gate of the twenty-first n-channel insulated gate type field effect transistor being connected to a corresponding one of the data lines, a drain of the twenty-second n-channel insulated gate type field effect transistor being connected to a source of the twenty-first n-channel insulated gate type field effect transistor, a gate of the twenty-second n-channel insulated gate type field effect transistor being connected to a corresponding one of the data lines, a source of the twenty-second n-channel insulated gate type field effect transistor being connected to a tenth node, a drain of the twenty-third n-channel insulated gate type field effect transistor being connected to the ninth node, a gate of the twenty-third n-channel insulated gate type field effect transistor being connected to a gate of the twenty-second n-channel insulated gate type field effect transistor, a drain of the twenty-fourth n-channel insulated gate type field effect transistor being connected a source of the twenty-third n-channel insulated gate type field effect transistor, a gate of the twenty-fourth n-channel insulated gate type field effect transistor being connected to a gate of the twenty-first n-channel insulated gate type field effect transistor, a source of the twenty-fourth n-channel insulated gate type field effect transistor being connected to the tenth node;

a fourth analog amplifying circuit including twenty-fifth, twenty-sixth, twenty-seventh and twenty-eighth n-channel insulated gate type field effect transistors, wherein a drain of the twenty-fifth n-channel insulated gate type field effect transistor is connected to an eleventh node, a gate of the twenty-fifth n-channel insulated gate type field effect transistor being connected to a corresponding one of the data lines, a drain of the twenty-sixth n-channel insulated gate type field effect transistor being connected to a source of the twenty-fifth n-channel insulated gate type field effect transistor, a gate of the twenty-sixth n-channel insulated gate type field effect transistor being connected to a corresponding one of the data lines, a source of the twenty-sixth n-channel insulated gate type field effect transistor being connected to a twelfth node, a drain of the twenty-seventh n-channel insulated gate type field effect transistor being connected to the eleventh node, a gate of the twenty-seventh n-channel insulated gate type field effect transistor being connected to the gate of the twenty-sixth n-channel insulated gate type field effect transistor, a drain of the twenty-eighth n-channel insulated gate type field effect transistor being connected to a source of the twenty-seventh n-channel insulated gate type field effect transistor, a gate of the twenty-eighth n-channel insulated gate type field effect transistor being connected to the gate of the twenty-fifth n-channel insulated gate type field effect transistor, a source of the twenty-eighth n-channel insulated gate type field effect transistor being connected to the twelfth node;

a sixth latch circuit including seventeenth and eighteenth p-channel insulated gate type field effect transistors and twenty-ninth and thirtieth n-channel insulated gate type field effect transistors, wherein gates and drains of the seventeenth and eighteenth p-channel insulated gate type field effect transistors are cross connected, the drains of the seventeenth and eighteenth p-channel insulated gate type field effect transistors being connected to the ninth and eleventh nodes, respectively, the power source voltage being provided to sources of the seventeenth and eighteenth p-channel insulated gate type field effect transistors, a drain of the twenty-ninth n-channel insulated gate type field effect transistor being connected to the tenth node, a gate of the twenty-ninth n-channel insulated gate type field effect transistor being connected to the eleventh node, a drain of the thirtieth n-channel insulated gate type field effect transistor being connected to the twelfth node, a gate of the thirtieth n-channel insulated gate type field effect transistor being connected to the ninth node; and a second reset circuit including nineteenth and twentieth p-channel insulated gate type field effect transistors and thirty-first and thirty-second n-channel insulated gate type field effect transistors, wherein a drain of the nineteenth p-channel insulated gate type field effect transistor is connected to the ninth node, the power source voltage being provided to a source of the nineteenth p-channel insulated gate type field effect transistor, an on/off operation of the nineteenth p-channel insulated gate type field effect transistor being controlled by the reset signal, a drain of the twentieth p-channel insulated gate type field effect transistor being connected to the eleventh node, the power source voltage being provided to a source of the twentieth p-channel insulated gate type field effect transistor, an on/off operation of the twentieth p-channel insulated gate type field effect transistor being controlled by the reset signal, a drain of the thirty-first n-channel insulated gate type field effect transistor being connected to a source of the twenty-ninth n-channel insulated gate type field effect transistor, the ground voltage being provided to a source of the thirty-first n-channel insulated gate type field effect transistor, an on/off operation of the thirty-first n-channel insulated gate type field effect transistor being controlled by the reset signal, a drain of the thirty-second n-channel insulated gate type field effect transistor being connected to a source of the thirtieth n-channel insulated gate type field effect transistor, the ground voltage being provided to a source of the thirty-second n-channel insulated gate type field effect transistor, an on/off operation of the thirty-second n-channel insulated gate type field effect transistor being controlled by the reset signal.

There is provided according to another aspect of the present invention a semiconductor integrated circuit which receives a first clock signal and outputs a second clock signal having a predetermined phase difference with respect to the first clock signal, the second clock signal being generated by delaying the first clock signal, the semiconductor integrated circuit adapted to be connected to an external circuit which requires the second clock signal, the semiconductor integrated circuit comprising:

A) a clock transmission circuit which provides the second clock signal to the external circuit, the clock transmission circuit including m gate circuits connected in series, each of the m gate circuits providing a delay time TA;

B) a delay circuit which delays the first clock signal, the delay circuit including:
  B-1) a variable delay circuit to which the first clock signal is input; and
  B-2) a fixed delay circuit which includes n gate circuits connected in series, each of the n gate circuits providing the delay time TA, n being greater than m, the first stage gate circuit being connected to an output terminal of the variable delay circuit, one of the output terminal of the variable delay circuit and an output terminal of the (n−m)th gate circuit of the fixed delay circuit being connected to an input terminal of the clock transmission circuit, a third clock signal being output from the final stage gate circuit of the fixed delay circuit; and C) a delay locked loop circuit including a delay time control circuit which controls a delay time of the variable delay circuit so that a phase of the third clock signal is the same as a phase of the second clock signal output from the clock transmission circuit.

According to the above-mentioned invention, the number of the gate circuits of the fixed delay circuit from (n−m−1)th stage gate circuit to the final stage gate circuit is m which is equal to the number of the gate circuits of the clock transmission circuit, and the phase of the third clock signal obtained at the final stage gate circuit of the fixed delay circuit is controlled to be the same as the phase of the second clock signal which is output from the clock transmission circuit. Thus, the second clock signal output from the clock transmission circuit has a constant phase irrespective of a process condition, a temperature change or a level of a power source voltage.

Additionally, there is provided according to another aspect of the present invention a semiconductor integrated circuit which receives a first clock signal and outputs a second clock signal having a predetermined phase difference with respect to the first clock signal, the second clock signal being generated by delaying the first clock signal, the semiconductor integrated circuit adapted to be connected to an external circuit which requires the second clock signal, the semiconductor integrated circuit comprising:

A) a clock transmission circuit which provides the second clock signal to the external circuit, the clock transmission circuit including m gate circuits connected in series, each of the m gate circuits providing a delay time TA;

B) a delay circuit which delays the first clock signal, the delay circuit comprising:
  B-1) a plurality of delay circuit units each of which includes:
    B-1-1) a variable delay circuit; and
    B-1-2) a fixed delay circuit which includes n gate circuits connected in series, each of the n gate circuits providing the delay time TA, n being greater than m, an input terminal of the first stage delay circuit unit connected to a node to which the first clock signal is provided, one of an output terminal of the variable delay circuit of one of the delay circuits and an output terminal of the (n−m)th gate circuit of the fixed delay circuit of the one of the delay circuit units being connected to an input terminal of the clock transmission circuit, a third clock signal being output from a final stage gate circuit of the fixed delay circuit of a final stage delay circuit unit; and C) a delay locked loop circuit including a delay time control circuit which controls a delay time of the variable delay circuit of each of the delay circuit units so that the third clock signal synchronizes with one of the first clock signal and a fourth clock signal having a predetermined phase difference with respect to the first clock signal.

According to the above invention, the number of the gate circuits of the fixed delay circuit of a predetermined delay circuit unit from the (n−m−1)th stage gate circuit to the final stage gate circuit is m which is equal to the number of the gate circuits of the clock transmission circuit, and the third clock signal obtained at the final stage gate circuit of the final stage fixed delay circuit is synchronized with the first clock signal or the fourth clock signal which has the predetermined phase difference with respect to the first clock signal. Thus, the phase of the second clock signal output from the clock transmission circuit is the same as the phase of the clock signal which is output from the final stage gate circuit of the fixed delay circuit of a predetermined delay circuit unit irrespective of a process condition, a temperature change or a level of a power source voltage.

Additionally, there is provided according to another aspect of the present invention a semiconductor integrated circuit which receives a first clock signal and outputs a second clock signal having a predetermined phase difference with respect to the first clock signal, the second clock signal being generated by delaying the first clock signal, the semiconductor integrated circuit adapted to be connected to an external circuit which requires the second clock signal, the semiconductor integrated circuit comprising:

A) a clock transmission circuit which provides the second clock signal to the external circuit, the clock transmission circuit including m gate circuits connected in series, each of the m gate circuits providing a delay time TA;

B) a delay locked loop circuit comprising:
  B-1) a delay circuit delaying the first clock signal, the delay circuit comprising:
    B-1-1) a first variable delay circuit including L gate circuits, connected in series, each of which provides a delay time TL;
    B-1-2) a first fixed delay circuit including n gate circuits, connected in series, each of which provides the delay time TA;
    B-1-3) a second variable delay circuit including L gate circuits, connected in series, each of which provides a delay time TL; and
    B-1-4) a second fixed delay circuit including n gate circuits, connected in series, each of which provides the delay time TA, a third clock signal being output from a final stage gate circuit of the second fixed delay circuit; and
  B-2) a delay time control circuit controlling the delay time of each of the first and second variable delay circuits so that a phase of the third clock signal is the same as a phase of the second clock signal; and C) a third fixed delay circuit including k gate circuits, connected in series, each of which provides the delay time TA, an input terminal of the third fixed delay circuit being connected to one of an output terminal of the first variable delay circuit and an output terminal of the {2n+(TL/TA)L−m−k}th gate circuit of the first fixed delay circuit, where n, m, L and k are positive integers satisfying relationships n<m<(TL/TA)L+n and 1<2n+(TL/TA)L−m−k<n, an output terminal of the third fixed delay circuit being connected to an input terminal of the clock transmission circuit.

According to the above invention, the number of the gate circuits from the first stage gate circuit of the first fixed delay circuit to the final stage gate circuit of the third fixed delay circuit is 2n+(TL/TA)L−m which is equal to the number of the gate circuits from the first stage gate circuit of the first fixed delay circuit to the (n−m)th stage gate circuit of the second fixed delay circuit. Additionally, the phase of the third clock signal obtained at the final stage gate circuit of the fixed delay circuit of the second fixed delay circuit is controlled to be the same as the phase of the second clock signal which is output from the clock transmission circuit. Thus, the second clock signal output from the clock transmission circuit has a required phase irrespective of a process condition, a temperature change or a level of a power source voltage.

Additionally, there is provided according to another aspect of the present invention a semiconductor integrated circuit which receives a first clock signal and outputs a second clock signal having a predetermined phase difference with respect to the first clock signal, the second clock signal being generated by delaying the first clock signal, the semiconductor integrated circuit adapted to be connected to an external circuit which requires the second clock signal, the semiconductor integrated circuit comprising:

A) a clock transmission circuit which provides the second clock signal to the external circuit, the clock transmission circuit including m gate circuits connected in series, each of the m gate circuits providing a delay time TA;

B) a delay locked loop circuit comprising:
   B-1) a delay circuit delaying the first clock signal, the delay circuit comprising:
       B-1-1) a plurality of delay circuit units connected in series each of which comprises:
           B-1-1-1) a variable delay circuit including L gate circuits, connected in series, each of which provides a delay time TL; and
           B-1-1-2) a fixed delay circuit including n gate circuits, connected in series, each of which provides the delay time TA,
   an input terminal of the variable delay circuit of a first stage delay circuit unit being connected to a node to which the first clock signal is input, a third clock signal being output from a final stage gate circuit of a final stage fixed delay circuit of a final stage delay circuit,
   B-2) a delay time control circuit controlling the delay time of the variable delay circuit of each of the delay circuits so that a phase of the third clock signal is the same as one of a phase of the first clock signal and a phase of a fourth clock signal having a predetermined phase difference with respect to the first clock signal; and
C) a third fixed delay circuit including k gate circuits, connected in series, each of which provides the delay time TA, an input terminal of the third delay circuit being connected to one of an output terminal of the first variable delay circuit and an output terminal of the {2n+(TL/TA)L−m−k}th gate circuit of the first fixed delay circuit, where n, m, L and k are positive integers satisfying relationships n<m<(TL/TA)L+n and 1<2n+(TL/TA)L−m−k<n, an output terminal of the third fixed delay circuit being connected to an input terminal of the clock transmission circuit.

According to the above invention, the number of the gate circuits from the first stage gate circuit of the predetermined fixed delay circuit to the final stage gate circuit of the third fixed delay circuit is 2n+(TL/TA)L−m which is equal to the number of the gate circuits from the first stage gate circuit of the first stage fixed delay circuit of a predetermined delay circuit unit to the (n−m)th stage gate circuit of the fixed delay circuit subsequent to the predetermined fixed delay circuit. Additionally, the phase of the third clock signal obtained at the final stage gate circuit of the fixed delay circuit of the final fixed delay circuit is controlled to be the same as the phase of the first clock signal or the fourth clock signal having a predetermined phase difference with respect to the first clock signal. Thus, the second clock signal output from the clock transmission circuit has a required phase irrespective of a process condition, a temperature change or a level of a power source voltage.

Additionally, there is provided according to the present invention a semiconductor integrated circuit which receives a first clock signal and outputs a second clock signal having a predetermined phase difference with respect to the first clock signal, the second clock signal being generated by delaying the first clock signal, the semiconductor integrated circuit adapted to be connected to an external circuit which requires the second clock signal, the semiconductor integrated circuit comprising:

A) a clock transmission circuit which provides the second clock signal to the external circuit, the clock transmission circuit including m gate circuits connected in series, each of the m gate circuits providing a delay time TA;

B) a delay locked loop circuit comprising:
   B-1) a delay circuit for delaying the first clock signal, the delay circuit comprising:
       B-1-1) a first variable delay circuit including L gate circuits, connected in series, each of which provides a delay time TL;
       B-1-2) a first fixed delay circuit including n gate circuits, connected in series, each of which provides the delay time TA, an input terminal of the first gate circuit of the fixed delay circuit being connected to an output terminal of the first variable delay circuit, an output terminal of the {2n+(TL/TA)L−m−k}th gate circuit of the first fixed delay circuit being connected to an input terminal of the clock transmission circuit, where n, m, L and k are positive integers satisfying relationships n<m<(TL/TA)L+n and 1<2n+(TL/TA)L−m−k<n;
       B-1-3) a second variable delay circuit including L gate circuits, connected in series, each of which provides a delay time TL, an input terminal of the second variable delay circuit being connected to an output terminal of a final stage gate circuit of the first fixed delay circuit; and
       B-1-4) a second fixed delay circuit including n gate circuits, connected in series, each of which provides the delay time TA, an input terminal of a first stage gate circuit of the second fixed delay circuit being connected to an output terminal of the second variable delay circuit, a third clock signal being output from an output terminal of a final stage gate circuit of the second fixed delay circuit, and
   B-2) a delay time control circuit controlling the delay time of each of the first and second variable delay circuits so that a phase of the third clock signal is delayed from the second clock signal by a predetermined delay time; and
C) a third fixed delay circuit providing the predetermined delay time, the third fixed delay circuit including k gate circuits, connected in series, each of which provides the delay time TA, the third fixed delay circuit being positioned on an upstream side of the delay circuit, the third fixed delay circuit delaying the first clock signal in cooperation with the delay circuit.

According to the above invention, the sum of the number of the gate circuits of the third fixed delay circuit and the number of the gate circuits from the first stage gate circuit of the first fixed delay circuit to the {2n+(TL/TA)L−m−k}th stage gate circuit of the first fixed delay circuit is 2n+(TL/TA)L−m which is equal to the number of the gate circuits from the first stage gate circuit of the first fixed delay circuit to the (n−m)th stage gate circuit of the second fixed delay circuit. Additionally, the phase of the third clock signal obtained at the final stage gate circuit of the second fixed delay circuit is controlled to be delayed from the phase of the second clock signal by the delay time provided by the third fixed delay circuit. Thus, the second clock signal output from the clock transmission circuit has a required phase irrespective of a process condition, a temperature change or a level of a power source voltage.

Additionally, there is provided according to the present invention a semiconductor integrated circuit which receives a first clock signal and outputs a second clock signal having a predetermined phase difference with respect to the first clock signal, the second clock signal being generated by delaying the first clock signal, the semiconductor integrated circuit adapted to be connected to an external circuit which requires the second clock signal, the semiconductor integrated circuit comprising:
   A) a clock transmission circuit which provides the second clock signal to the external circuit, the clock transmission circuit including m gate circuits connected in series, each of the m gate circuits providing a delay time TA;
   B) a delay locked loop circuit comprising:
      B-1) a delay circuit for delaying the first clock signal, the delay circuit comprising:
         B-1-1) a plurality of delay circuit units each of which comprises:
            B-1-1-1) a variable delay circuit including L gate circuits, connected in series, each of which provides a delay time TL; and
            B-1-1-2) a fixed delay circuit including n gate circuits, connected in series, each of which provides the delay time TA, an input terminal of a first stage gate circuit of the fixed delay circuit being connected to an output terminal of the variable delay circuit,
      an output terminal of the $\{2n+(TL/TA)L-m-k\}$th gate circuit of one of the delay circuit units being connected to an input terminal of the clock transmission circuit, where n, m, L and k are positive integers satisfying relationships $n<m<(TL/TA)L+n$ and $1<2n+(TL/TA)L-m-k<n$, a third clock signal being obtained at an output terminal of a final stage gate circuit of the fixed delay circuit of a final stage delay circuit unit, a fourth clock signal being input to a first stage delay circuit unit; and
         B-2) a delay time control circuit controlling the delay time of the variable delay circuit of each of the delay circuit units so that the third clock signal synchronizes with the fourth clock signal and a fifth clock signal having a predetermined phase difference with respect to the fourth clock signal; and
   C) a third fixed delay circuit including k gate circuits, connected in series, each of which provides the delay time TA, an input terminal of the third fixed delay circuit being connected to a node to which the first clock signal is supplied, an output terminal of the third fixed delay circuit being connected to an input terminal of the first stage delay circuit unit.

According to the above invention, the sum of the number of the gate circuits of the third fixed delay circuit and the number of the gate circuits from the first stage gate circuit of the fixed delay circuit of a predetermined delay circuit unit to the $\{2n+(TL/TA)L-m-k\}$th stage gate circuit of the delay circuit of the predetermined delay circuit unit is $2n+(TL/TA)L-m$ which is equal to the number of the gate circuits from the first stage gate circuit of the fixed delay circuit of the predetermined delay circuit unit to the (n−m)th stage gate circuit of the fixed delay circuit of the delay circuit unit subsequent to the predetermined delay circuit unit. Additionally, the third clock signal obtained at the final stage gate circuit of the fixed delay circuit of the final stage delay circuit unit is controlled to be synchronized with the fourth clock signal or the fifth clock signal having a predetermined phase difference with respect to the fourth clock signal. Thus, the phase of the second clock signal output from the clock transmission circuit is the same as the phase of a clock signal which is output from the final stage gate circuit of the fixed delay circuit of the delay circuit unit subsequent to the predetermined delay circuit unit irrespective of a process condition, a temperature change or a level of a power source voltage.

Additionally, there is provided according to another aspect of the present invention a semiconductor integrated circuit which receives a first clock signal and outputs a second clock signal having a predetermined phase difference with respect to the first clock signal, the second clock signal being generated by delaying the first clock signal, the semiconductor integrated circuit adapted to be connected to an external circuit which requires the second clock signal, the semiconductor integrated circuit comprising:
   A) a clock transmission circuit which provides the second clock signal to the external circuit, the clock transmission circuit including m gate circuits connected in series, each of the m gate circuits providing a delay time TA;
   B) a delay locked loop circuit comprising:
      B-1) a delay circuit delaying the first clock signal, the delay circuit comprising:
         B-1-1) a first variable delay circuit including L gate circuits, connected in series, each of which provides a delay time TL;
         B-1-2) a first fixed delay circuit including n gate circuits, connected in series, each of which provides the delay time TA;
         B-1-3) a second variable delay circuit including L gate circuits, connected in series, each of which provides a delay time TL; and
         B-1-4) a second fixed delay circuit including n gate circuits, connected in series, each of which provides the delay time TA, a third clock signal being output from a final stage gate circuit of the second fixed delay circuit; and
      B-2) a delay time control circuit controlling the delay time of each of the first and second variable delay circuits so that a phase of the third clock signal is delayed from the second clock signal by a predetermined delay time;
   C) a third fixed delay circuit providing the predetermined delay time, the third fixed delay circuit including k1 gate circuits, connected in series, each of which provides the delay time TA, the third fixed delay circuit being positioned on an upstream side of the delay circuit, the third fixed delay circuit delaying the first clock signal in cooperation with the delay circuit; and
   D) a fourth fixed delay circuit including k2 gate circuits, connected in series, each of which provides the delay time TA, an input terminal of the fourth fixed delay circuit being connected to one of an output terminal of the first variable delay circuit and an output terminal of the $\{2n+(TL/TA)L-m-k1-k2\}$th gate circuit of the first fixed delay circuit, where n, m, L, k1 and k2 are positive integers satisfying relationships $n<m$ and $1<2n+(TL/TA)L-m-k1-k2$, an output terminal of the fourth fixed delay circuit being connected to an input terminal of the clock transmission circuit.

According to the above invention, the sum of the number of the gate circuits of the third fixed delay circuit and the number of the gate circuits from the first stage gate circuit of the first fixed delay circuit to the final stage gate circuit of the fourth fixed delay circuit is $2n+(TL/TA)L-m$ which is equal to the number of the gate circuits from the first stage gate circuit of the first fixed delay circuit to the (n−m)th stage gate circuit of the second fixed delay circuit. Additionally, the phase of the third clock signal obtained at the final stage gate circuit of the second fixed delay circuit is controlled to be delayed from the phase of the second clock signal by the delay time provided by the third fixed delay circuit. Thus, the second clock signal output from the clock transmission circuit has a required phase irrespective of a process condition, a temperature change or a level of a power source voltage.

Additionally, there is provided according to the present invention a semiconductor integrated circuit which receives a first clock signal and outputs a second clock signal having a predetermined phase difference with respect to the first clock signal, the second clock signal being generated by delaying the first clock signal, the semiconductor integrated circuit adapted to be connected to an external circuit which requires the second clock signal, the semiconductor integrated circuit comprising:

A) a clock transmission circuit which provides the second clock signal to the external circuit, the clock transmission circuit including m gate circuits connected in series, each of the m gate circuits providing a delay time TA;

B) a delay locked loop circuit comprising:
  B-1) a delay circuit delaying the first control signal, the delay circuit comprising:
    B-1-1) a plurality of delay circuit units connected in series each of which comprises:
      B-1-1-1) a variable delay circuit including L gate circuits, connected in series, each of which provides a delay time TL; and
      B-1-1-2) a fixed delay circuit including n gate circuits, connected in series, each of which provides the delay time TA,
    a third clock signal being output from a final stage gate circuit of the fixed delay circuit of a final stage delay circuit unit, a fourth clock signal being input to a first stage delay circuit unit; and
  B-2) a delay time control circuit controlling the delay time of the variable delay circuit of each of the delay circuit units so that the third clock signal synchronizes with one of the fourth clock signal and a fifth clock signal having a predetermined phase difference with respect to the fourth clock signal;

C) a third fixed delay circuit including k1 gate circuits, connected in series, each of which provides the delay time TA, an input terminal of the third delay circuit being connected to a node to which the first clock signal is input, an output terminal of the third delay circuit being connected to an input terminal of the first stage delay circuit unit; and D) a fourth fixed delay circuit including k2 gate circuits, connected in series, each of which provides the delay time TA, an input terminal of the fourth delay circuit being connected to one of an output terminal of one of the delay circuit units and an output terminal of the {2n+(TL/TA)L−m−k1-k2}th gate circuit of the one of the delay circuit units, where n, m, L, k1 and k2 are positive integers satisfying relationships n<m and 1<2n+(TL/TA)L−m−k1-k2, an output terminal of the fourth fixed delay circuit being connected to an input terminal of the clock transmission circuit.

According to the above invention, the sum of the number of the gate circuits of the third fixed delay circuit and the number of the gate circuits from the first stage gate circuit of the fixed delay circuit of a predetermined delay circuit unit to the final stage gate circuit of the fixed delay circuit of the fourth delay circuit is 2n+(TL/TA)L−m which is equal to the number of the gate circuits from the first stage gate circuit of the fixed delay circuit of the predetermined delay circuit unit to the (n−m)th stage gate circuit of the fixed delay circuit of the delay circuit unit subsequent to the predetermined delay circuit unit. Additionally, the third clock signal obtained at the final stage gate circuit of the fixed delay circuit of the final stage delay circuit unit is controlled to be synchronized with the fourth clock signal or the fifth clock signal having a predetermined phase difference with respect to the fourth clock signal. Thus, the phase of the second clock signal output from the clock transmission circuit is the same as the phase of a clock signal which is output from the final stage gate circuit of the fixed delay circuit of the delay circuit unit subsequent to the predetermined delay circuit unit irrespective of a process condition, a temperature change or a level of a power source voltage.

Additionally, in one embodiment according to the present invention, the variable delay circuit may comprise a plurality of gate circuits, connected in series, each of the gate circuits of the variable delay circuit comprising:

a first p-channel insulated gate type field effect transistor having a source connected to a power source line;

a second p-channel insulated gate type field effect transistor having a source connected to a drain of the first p-channel insulated gate type field effect transistor;

a first n-channel insulated gate type field effect transistor having a drain connected to a drain of the second p-channel insulated gate type field effect transistor and a gate connected to a gate of the second p-channel insulated gate type field effect transistor;

a second n-channel insulated gate type field effect transistor having a drain connected to a source of the first n-channel insulated gate type field effect transistor and a source connected to a ground line;

a clock input node connected to each of the gate of the second p-channel insulated gate type field effect transistor and the gate of the first n-channel insulated gate type field effect transistor; and a clock output node connected to each of the drain of the second p-channel insulated gate type field effect transistor and the drain of the first n-channel insulated gate type field effect transistor, wherein a first delay time control voltage is provided to a gate of the first p-channel insulated gate type field effect transistor, and a second delay time control voltage is provided to a gate of the second n-channel insulated gate type field effect transistor.

Alternatively, the variable delay circuit may comprise:

A) a first p-channel insulated gate type field effect transistor having a source connected to a power source line;

B) a plurality of gate circuits, connected in series, each of which comprises:
  B-1) a second p-channel insulated gate type field effect transistor having a source connected to a drain of the first p-channel insulated gate type field effect transistor;
  B-2) a first n-channel insulated gate type field effect transistor having a drain connected to a drain of the second p-channel insulated gate type field effect transistor;
  B-3) a clock input node connected to each of a gate of the second p-channel insulated gate type field effect transistor and a gate of the first n-channel insulated gate type field effect transistor; and
  B-4) a clock output node connected to each of the drain of the second p-channel insulated gate type field effect transistor and the drain of the first n-channel insulated gate type field effect transistor; and C) a second n-channel insulated gate type field effect transistor having a source connected to a ground line, wherein a first delay time control voltage is provided to a gate of the first p-channel insulated gate type field effect transistor, and a second delay time control voltage is provided to a gate of the second n-channel insulated gate type field effect transistor.

Additionally, the delay time control circuit may include:

a starter circuit;

a first capacitor having a first terminal connected to the ground line and a second terminal at which the first delay time control voltage is generated;

a second capacitor having a first terminal connected to the power source and a second terminal at which the second delay time control voltage is generated; and a phase comparison and charge pump circuit which charges and discharges the first and second capacitors by comparing a reference clock signal for a delay control with a clock signal output from the delay circuit included in the delay locked loop circuit, a start of an operation of the phase comparison and charge pump circuit being controlled by the starter circuit, wherein the phase comparison and charge pump circuit charges the second capacitor until a time period corresponding to a predetermined number of clock cycles has passed when a starter signal is input to the starter circuit, and the phase comparison and charge pump circuit performs a regular operation after the time period has passed.

Additionally, the phase comparison and charge pump circuit may comprise:

A) a first phase comparison and charge pump circuit which charges and discharges the first capacitor, the first phase comparison and charge pump circuit including:

A-1) a plurality of p-channel insulated gate type field effect transistors, connected in series, each of which serves as a pull-up element; and A-2) a plurality of n-channel insulated gate type field effect transistors, connected in series, each of which serves as a pull-down element, wherein on/off operations of the plurality of the p-channel insulated gate type field effect transistors and the plurality of the n-channel insulated gate type field effect transistors are controlled by a plurality of clock signals including a clock signal input to the delay circuit, a clock signal output from the delay circuit and a clock signal output to a predetermined node of the delay circuit; and B) a second phase comparison and charge pump circuit which charges and discharges the second capacitor, the first phase comparison and charge pump circuit including:

B-1) a plurality of p-channel insulated gate type field effect transistors, connected in series, each of which serves as a pull-up element; and B-2) a plurality of n-channel insulated gate type field effect transistors, connected in series, each of which serves as a pull-down element, wherein on/off operations of the plurality of the p-channel insulated gate type field effect transistors and the plurality of the n-channel insulated gate type field effect transistors are controlled by a plurality of clock signals including a clock signal input to the delay circuit, a clock signal output from the delay circuit and a clock signal output to a predetermined node of the delay circuit.

Additionally, in the semiconductor integrated circuit according to the present invention, the variable delay circuit may comprise a plurality of gate circuits, connected in series, each of which comprises:

a first p-channel insulated gate type field effect transistor having a source connected to a power source line;

a second p-channel insulated gate type field effect transistor having a source connected to a drain of the first p-channel insulated gate type field effect transistor;

a first n-channel insulated gate type field effect transistor having a drain connected to a drain of the second p-channel insulated gate type field effect transistor;

a second n-channel insulated gate type field effect transistor having a drain connected to a drain of the first n-channel insulated gate type field effect transistor, a gate connected to the gate of the first p-channel insulated gate type field effect transistor and a source connected to a ground line;

a clock input node connected to each of a gate of the first p-channel insulated gate type field effect transistor and a gate of the second n-channel insulated gate type field effect transistor; and a clock output node connected to each of the drain of the second p-channel insulated gate type field effect transistor and the drain of the first n-channel insulated gate type field effect transistor, wherein a first delay time control voltage is provided to a gate of the second p-channel insulated gate type field effect transistor, and a second delay time control voltage is provided to a gate of the first n-channel insulated gate type field effect transistor.

Other objects, features and advantages of the present invention will become more apparent from the following detailed description when read in conjunction with the accompanying drawings.

BRIEF DESCRIPTION OF THE DRAWINGS

FIG. 10 is a circuit diagram of a part of a semiconductor integrated circuit according to a fifth embodiment of the present invention;

FIGS. 15A and 15B are waveform charts indicating operations of the charge transfer amplifier and the sense amplifier shown in FIG. 14;

DETAILED DESCRIPTION OF THE PREFERRED EMBODIMENTS

Figure 4:
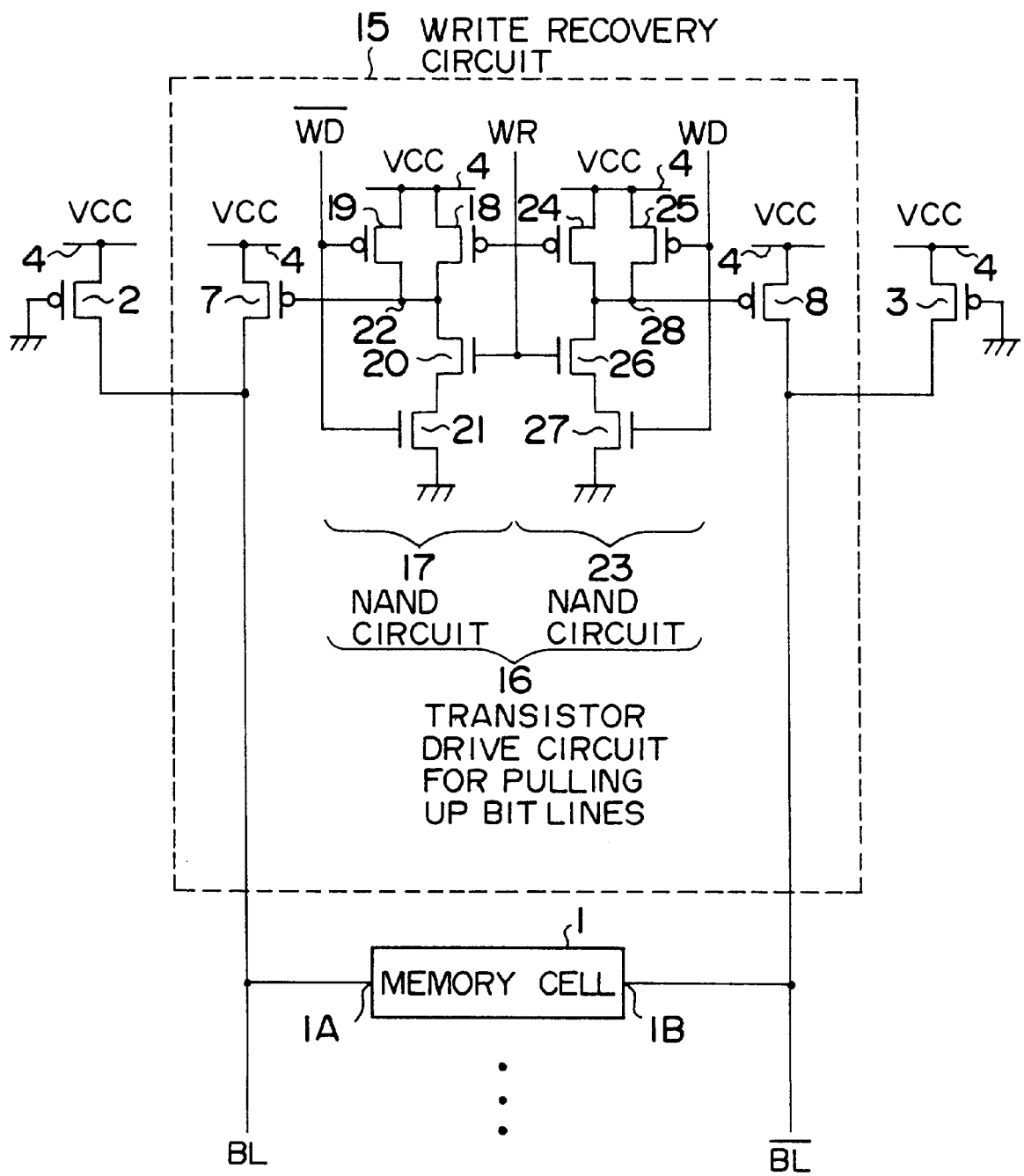
FIG. 4 is a circuit diagram of a part of a static RAM according to a first embodiment of the present invention.

A description will now be given, with reference to FIG. 4, of a first embodiment of the present invention. FIG. 4 is a circuit diagram of a part of a static RAM according to the first embodiment of the present invention.

Figure 1:
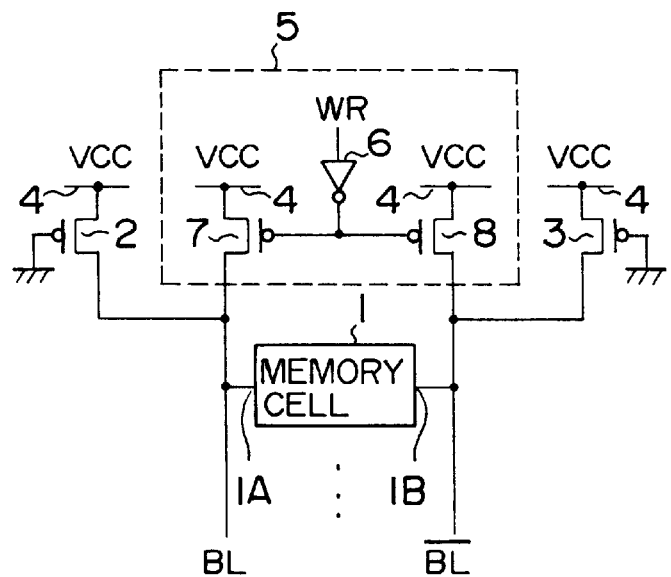
FIG. 1 is a circuit diagram of a part of a conventional static random access memory.
Figure 2:
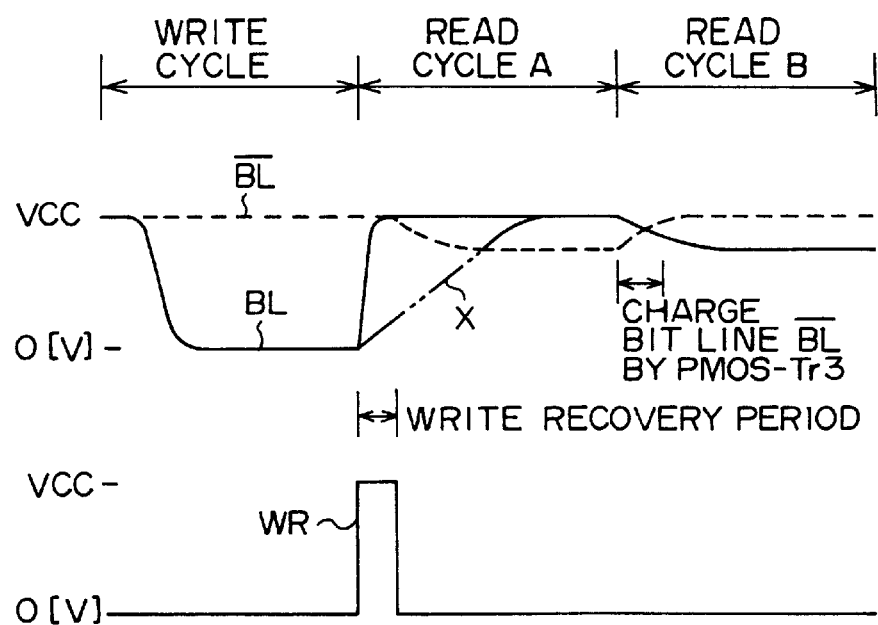
FIG. 2 is a waveform chart for explaining an operation of a write recovery circuit shown in FIG. 1.
Figure 3:
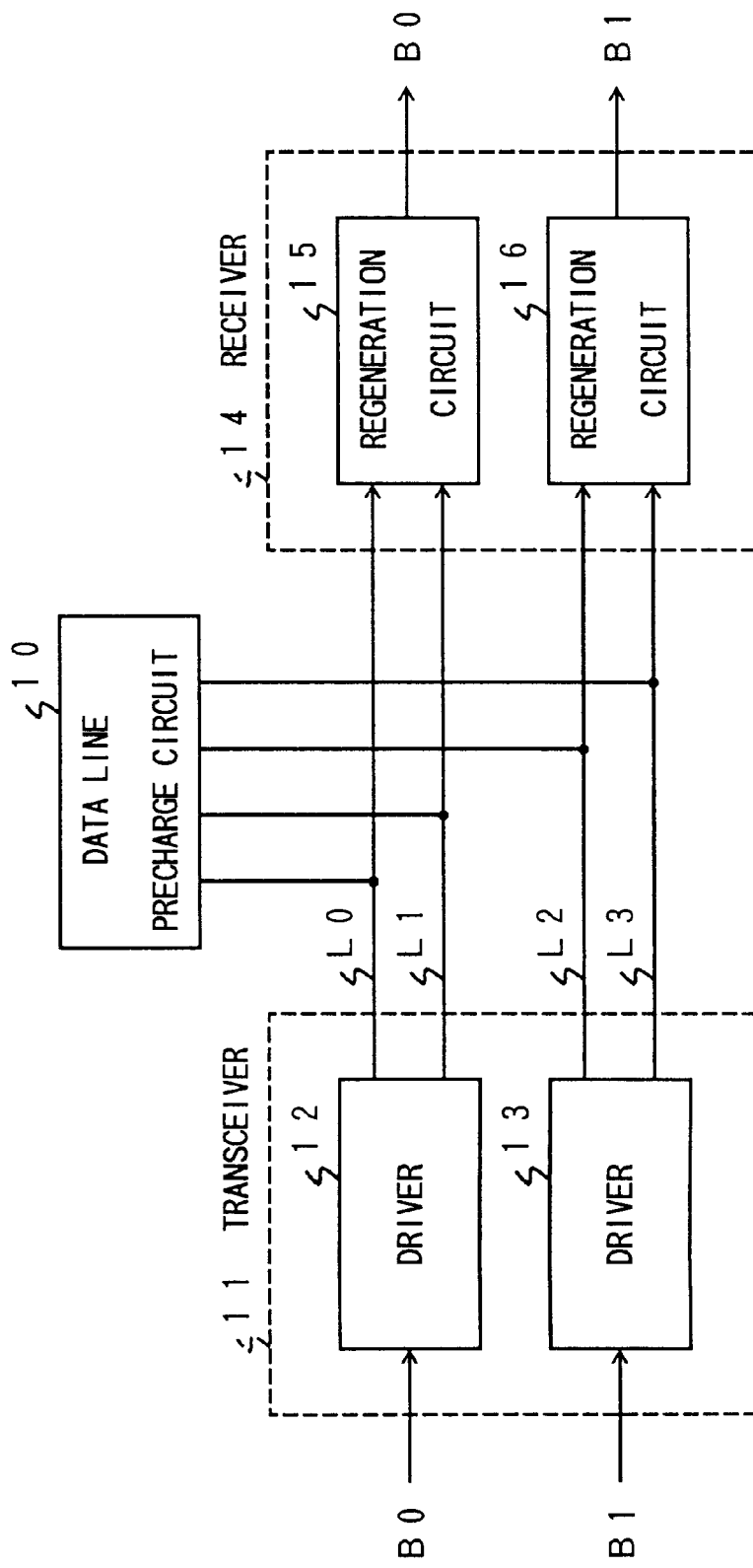
FIG. 3 is a circuit diagram of a part of a conventional semiconductor integrated circuit.

The static RAM according to the first embodiment of the present invention is provided with a write recovery circuit 15 instead of the write recovery circuit provided in the conventional write recovery circuit shown in FIG. 1. Other parts are the same as the conventional static RAM shown in FIG. 1.

The write recovery circuit 15 of the present embodiment has the same circuit structure as the write recovery circuit except for a transistor drive circuit 16 being provided instead of the inverter 6 provided in the write recovery circuit shown in FIG. 1. The write recovery circuit 15 comprises two NAND circuits 17 and 23, and is used for pulling up the bit lines BL and /BL.

The transistor drive circuit 16 comprises a pair of write data lines WD and /WD. The write data lines WD and /WD are complimentarily driven by an input buffer to which write data is input from an external device. The data line WD is connected to the bit line BL via a write amplifier, and the data line /WD is connected to the bit line /BL via a write amplifier.

The NAND circuit 17 drives pMOS transistor 7 by performing a NAND operation on the write recovery signal WR and a potential on the write data line /WD. The NAND circuit 17 comprises pMOS transistors 18 and 19 and nMOS transistors 20 and 21. In this specification, a pMOS transistor generally refers to a p-channel insulated gate type field effect transistor, and an nMOS transistor generally refers to an n-channel insulated gate type field effect transistor.

A source of the pMOS transistor 18 is connected to a VCC power source line 4. A drain of the pMOS transistor 18 is connected to an output node 22. The write recovery signal WR is provided to a gate of the pMOS transistor 18 so that an on/off operation of the pMOS transistor 18 is controlled by the write recovery signal WR. The output node 22 is connected to a gate of the pMOS transistor 7.

A source of the pMOS transistor 19 is connected to the VCC power source line 4. A drain of the pMOS transistor 19 is connected to the output node 22. A gate of the pMOS transistor 19 is connected to the write data line /WD. An on/off operation of the pMOS transistor 19 is controlled by the potential on the write data line /WD.

A drain of the nMOS transistor 20 is connected to the output node 22. The write recovery signal WR is provided to a gate of the nMOS transistor 20 so that an on/off operation of the nMOS transistor 20 is controlled by the write recovery signal WR.

A drain of the NMOS transistor 21 is connected to the source of the nMOS transistor 20. A source of the nMOS transistor 21 is connected to a ground line. A gate of the nMOS transistor 21 is connected to the write data line /WD. An on/off operation of the nMOS transistor 21 is controlled by a potential on the write data line /WD.

The NAND circuit 23 drives PMOS transistor 8 by performing a NAND operation on the write recovery signal WR and a potential on the write data line WD. The NAND circuit 23 comprises pMOS transistors 24 and 25 and nMOS transistors 26 and 27.

A source of the pMOS transistor 24 is connected to the VCC power source line 4. A drain of the pMOS transistor 24 is connected to an output node 28. The write recovery signal WR is provided to a gate of the pMOS transistor 24 so that an on/off operation of the pMOS transistor 24 is controlled by the write recovery signal WR. The output node 28 is connected to a gate of the pMOS transistor 8.

A source of the pMOS transistor 25 is connected to the VCC power source line 4. A drain of the pMOS transistor 25 is connected to the output node 28. A gate of the pMOS transistor 25 is connected to the write data line WD. An on/off operation of the pMOS transistor 25 is controlled by the potential on the write data line WD.

A drain of the nMOS transistor 26 is connected to the output node 28. The write recovery signal WR is provided to a gate of the nMOS transistor 26 so that an on/off operation of the nMOS transistor 26 is controlled by the write recovery signal WR.

A drain of the nMOS transistor 27 is connected to the source of the nMOS transistor 26. A source of the nMOS transistor 27 is connected to a ground line. A gate of the nMOS transistor 27 is connected to the write data line WD. An on/off operation of the nMOS transistor 27 is controlled by a potential on the write data line WD.

In the write recovery circuit 15 according to the first embodiment of the present invention, the write recovery signal WR is set to zero volts during a write cycle. As a result, in the NAND circuit 17, the pMOS transistor 18 is on; the nMOS transistor 20 is off; and the potential of the output node 22 is equal to VCC. Additionally, in the NAND circuit 23, the pMOS transistor 24 is on; the nMOS transistor 26 is off; and the potential of the output node 28 is equal to VCC. Accordingly, both the pMOS transistors 7 and 8 are off.

On the other hand, during a write recovery period, the write recovery signal WR is set to VCC. In the NAND circuit 17, the pMOS transistor 18 is off and the nMOS transistor 20 is on. Additionally, in the NAND circuit 23, the pMOS transistor 24 is off, and the nMOS transistor 26 is on.

As a result, when the operation of the static RAM is shifted from a write cycle to a read cycle, and when the bit line BL is set to the power source voltage VCC and the bit line /BL is set to zero volts during the write cycle, the pMOS transistor 19 is on, and the nMOS transistor 21 is off in the NAND circuit 17 during the write recovery period. Additionally, in the NAND circuit 23, the pMOS transistor 25 is off and the nMOS transistor 27 is on during the write recovery period.

Accordingly, the potential of the output node 22 of the NAND circuit 17 is set to the power source voltage VCC, and the potential of the output node 28 of the NAND circuit 23 is set to zero volts. Thus, the pMOS transistor 7 is maintained to be off, and the pMOS transistor 8 is turned on. Accordingly, the bit line /BL which was at zero volts during the write cycle is pulled up.

After the write recovery period is terminated, the write recovery signal WR is set to zero volts. In the NAND circuit 17, the pMOS transistor 18 is turned on, and the nMOS transistor 20 is turned off. Thus, the potential of the output node 22 is maintained at the power source voltage VCC, and the pMOS transistor 7 is maintained to be off. Additionally, in the NAND circuit 23, the pMOS transistor 24 is turned on, and the nMOS transistor 26 is turned off. Thus, the potential of the output node 28 is set to the power source voltage VCC, and the pMOS transistor 8 is turned off.

On the other hand, during a write recovery period, when the potential of the bit line BL is set to zero volts and the potential of the bit line /BL is set the power source voltage VCC, that is, when the potential of the write data line WD is set to zero volts and the potential of the write data line /WD is set to the power source voltage VCC, the pMOS transistor 19 is turned off and the nMOS transistor 21 is turned on during the write recovery period. Additionally, in the NAND circuit 23, the pMOS transistor 25 is turned on and the nMOS transistor 27 is turned off.

As a result, the output node 22 of the NAND circuit 17 is set to zero volts, and the output node 28 of the NAND circuit 23 is set to the power source voltage VCC. Thus, the pMOS transistor 8 is maintained to be off and the pMOS transistor 7 is turned on. Accordingly, the bit line BL which was at zero volts during the write cycle is pulled up.

After the write recovery period is terminated, the write recovery signal WR is set to zero volts. In the NAND circuit 17, the pMOS transistor 18 is turned on, and the nMOS transistor 20 is turned off. Thus, the potential of the output node 22 is set to the power source voltage VCC, and the pMOS transistor 7 is turned off. In the NAND circuit 23, the pMOS transistor 24 is turned on, and the nMOS transistor 26 is turned off. Thus, the potential of the output node 28 is set to the power source voltage VCC, and the pMOS transistor 8 is maintained to be off.

As mentioned above, in the first embodiment, when the bit line BL is set to the power source voltage VCC and the bit line /BL is set to zero volts during the write recovery period, the gate voltage of the pMOS transistor 7 is maintained to be the power source voltage VCC and the gate voltage of the pMOS transistor 8 is changed as VCC→zero volts→VCC so that the gate capacity of the pMOS transistor 8 alone is charged and discharged. That is, only the pMOS transistor 8 is driven so as to perform the write recovery operation.

On the other hand, when the bit line BL is set to zero volts and the bit line /BL is set to the power source voltage VCC, the gate voltage of the pMOS transistor 8 is maintained to be the power source voltage VCC and the gate voltage of the pMOS transistor 7 is changed as VCC→zero volts→VCC so that the gate capacity of the pMOS transistor 7 alone is charged and discharged. That is, only the pMOS transistor 7 is driven so as to perform the write recovery operation.

It should be noted that when the write recovery operation is performed when the bit line /BL is at zero volts, the gate capacity of the pMOS transistors 18, 19 and 24 and the nMOS transistors 20, 21 and 26 must be charged and discharged. Additionally, when the write recovery operation is performed when the bit line BL is at zero volts, the gate capacity of the pMOS transistors 18, 24 and 25 and the nMOS transistors 20, 26 and 27 must be charged and discharged.

However, the total width of the gates of the pMOS transistors 18, 19 and 24 and the nMOS transistors 20, 21 and 26 can be made smaller than the width of the gate of the pMOS transistor 7, and the total width of the gates of the pMOS transistors 18, 24 and 25 and the nMOS transistors 20, 26 and 27 can be made smaller than the width of the gate of the pMOS transistor 8.

Thus, according to the first embodiment of the present invention, power consumption of the static RAM can be reduced by reducing the charge and discharge current for the gate capacity of the pMOS transistors 7 and 8 which are transistors for pulling up the bit lines BL and /BL in the write recovery circuit 15.

Figure 5:
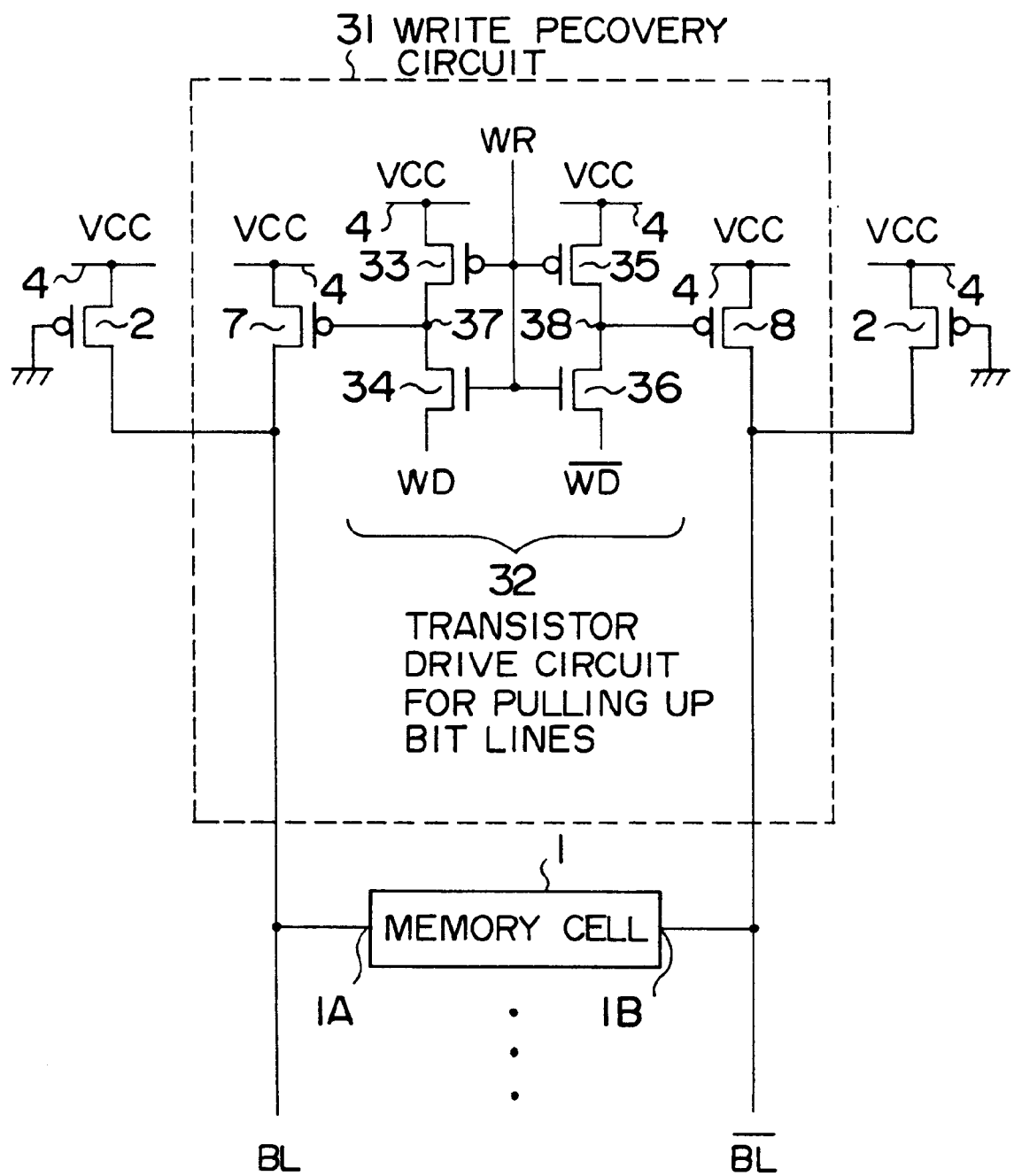
FIG. 5 is a circuit diagram of a part of a static RAM according to a second embodiment of the present invention.

A description will now be given, with reference to FIG. 5, of a second embodiment of the present invention. FIG. 5 is a circuit diagram of a part of a static RAM according to the second embodiment of the present invention.

The structure of the static RAM according to the second embodiment of the present invention is the same as that of the first embodiment except for the write recovery circuit 15 being replaced by a write recovery circuit 31.

The structure of the write recovery circuit 31 of the second embodiment is the same as that of the write recovery circuit 15 of the first embodiment except for the transistor drive circuit 16 being replaced by a transistor drive circuit 32 for pulling up the bit lines BL and /BL.

In the transistor drive circuit 32, a pMOS transistor 33 is provided in relation to the pMOS transistor 7; an nMOS transistor 34 is provided in relation to the pMOS transistor 7; a pMOS transistor 35 is provided in relation to the pMOS transistor 8; and an nMOS transistor 36 is provided in relation to the pMOS transistor 8.

A source of the pMOS transistor 33 is connected to the VCC power source line 4. A drain of the pMOS transistor 33 is connected to an output node 37. The write recovery signal WR is supplied to a gate of the pMOS transistor 33 so that an on/off operation of the pMOS transistor 33 is controlled by the write recovery signal WR. The output node 37 is connected to the gate of the pMOS transistor 7.

A drain of the nMOS transistor 34 is connected to the output node 37. A source of the nMOS transistor 34 is connected to the write data line WD. The write recovery signal WR is provided to a gate of the nMOS transistor 34.

Accordingly, when the potential of the write data line WD is zero volts and the write recovery signal WR is at the power source voltage VCC, the nMOS transistor 34 is on. When the write recovery signal WR is set to zero volts or the potential of the write data line WD is at the power source voltage VCC and the write recovery signal WR is at the power source voltage VCC, the nMOS transistor 34 is turned off.

A source of the pMOS transistor 35 is connected to the VCC power source line 4. A drain of the pMOS transistor 35 is connected to an output node 38. The write recovery signal WR is provided to a gate of the pMOS transistor 35 so that an on/off operation of the pMOS transistor 35 is controlled by the write recovery signal WR. The output node 38 is connected to the gate of the pMOS transistor 8.

A drain of the nMOS transistor 36 is connected to the output node 38. A source of the nMOS transistor 36 is connected to the write data line /WD. The write recovery signal WR is provided to a gate of the nMOS transistor 36.

Accordingly, the nMOS transistor 36 is turned on when the potential of the write data line /WD is zero volts and the write recovery signal WR is at the power source voltage VCC. The nMOS transistor 36 is turned off when the write recovery signal WR is zero volts or the potential of the write data line /WD is at the power source voltage VCC.

In the second embodiment, the write recovery signal WR is set to zero volts during the write cycle. As a result, during the write cycle, the pMOS transistor 33 is on, the nMOS transistor 34 is off, the pMOS transistor 35 is on, the nMOS transistor 36 is off, the potential of the output node 37 is at the power source voltage VCC, the potential of the output node 38 is at the power source voltage VCC, the pMOS transistor 7 is off, and the pMOS transistor 8 is off.

On the other hand, during the write recovery period, the write recovery signal WR is set to the power source voltage VCC. Thus, the pMOS transistor 33 is turned off and the pMOS transistor 35 is turned off.

As a result, during the write cycle, when the potential of the bit line BL is set to the power source voltage VCC and the potential of the bit line /BL is set to zero volts, that is, when the potential of the write data line WD is at the power source voltage VCC and the write data line /WD is at zero volts, the nMOS transistor 34 is turned off and the nMOS transistor 36 is turned on.

Accordingly, the potential of the output node 37 is maintained to be the power source voltage VCC and the potential of the output node 38 is set to zero volts. Thus, the pMOS transistor 7 is maintained to be off and the pMOS transistor 8 is turned on. Accordingly, the bit line /BL which was at zero volts during the write cycle is pulled up.

After the write recovery period is terminated, the write recovery signal WR is set to zero volts. Thus, the pMOS transistor 33 is turned on, the potential of the output node 37 is set to the power source voltage VCC, the pMOS transistor 7 is maintained to be off, and the pMOS transistor 35 is turned on. Accordingly, the potential of the output node 38 is set to the power source voltage VCC, and the pMOS transistor 8 is turned off.

On the other hand, during the write cycle, when the potential of the bit line BL is set to zero volts and the potential of the bit line /BL is set to the power source voltage VCC, that is, when the potential of the write data line WD is set to zero volts and the potential of the write data line /WD is set to the power source voltage VCC, the nMOS transistor 34 is turned on and the nMOS transistor 36 is turned off during the write recovery period.

Accordingly, the potential of the output node 38 is maintained to be the power source voltage VCC and the potential of the output node 37 is set to zero volts. Thus, the pMOS transistor 8 is maintained to be off and the pMOS transistor 7 is turned on. Accordingly, the bit line BL which was at zero volts during the write cycle is pulled up.

After the write recovery period is terminated, the write recovery signal WR is set to zero volts. Thus, the pMOS transistor 33 is turned on, the potential of the output node 37 is set to the power source voltage VCC, the pMOS transistor 7 is turned off and the pMOS transistor 35 is turned on. Accordingly, the potential of the output node 38 is set to the power source voltage VCC, and the pMOS transistor 8 is maintained to be off.

As mentioned above, in the second embodiment of the present invention, when the bit line BL is set to the power source voltage VCC and the bit line /BL is set to zero volts during the write recovery period, the gate voltage of the pMOS transistor 7 is maintained to be the power source voltage VCC and the gate voltage of the pMOS transistor 8 is changed as VCC→zero volts→VCC so that the gate capacity of the pMOS transistor 8 alone is charged and discharged. That is, only the pMOS transistor 8 is driven so as to perform the write recovery operation.

On the other hand, when the bit line BL is set to zero volts and the bit line /BL is set to the power source voltage VCC, the gate voltage of the pMOS transistor 8 is maintained to be the power source voltage VCC and the gate voltage of the pMOS transistor 7 is changed as VCC→zero volts→VCC so that the gate capacity of the pMOS transistor 7 alone is charged and discharged. That is, only the pMOS transistor 7 is driven so as to perform the write recovery operation.

It should be noted that when the write recovery operation is performed when the bit line /BL is at zero volts, the gate capacity of the pMOS transistors 33 and 35 and the nMOS transistors 34 and 36 must be charged and discharged. However, the total width of the gates of the pMOS transistors 33 and 35 and the nMOS transistors 34 and 36 can be made smaller than the width of the gate of each of the pMOS transistors 7 and 8.

For example, when the width of the gate of each of the pMOS transistors 7 and 8 is set to 18 μm, the width of the gate of each of the pMOS transistors 33 and 35 and the nMOS transistors 34 and 36 can be 2 μm.

Thus, according to the second embodiment of the present invention, power consumption of the static RAM can be reduces by reducing the charge and discharge current for the gate capacity of the pMOS transistors 7 and 8 which are transistors for pulling up the bit lines BL and /BL in the write recovery circuit 15. Additionally, the write recovery circuit 31 can be constructed by a simple structure.

Figure 6:
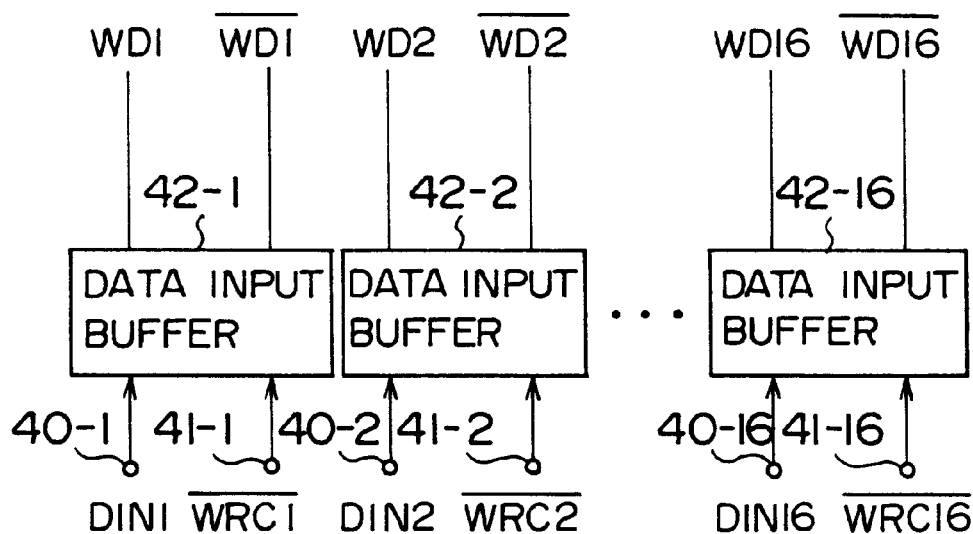
FIG. 6 is a block diagram of a part of a static RAM according to a third embodiment of the present invention.

A description will now be given, with reference to FIG. 6, of a third embodiment of the present invention. FIG. 6 is a block diagram of a part of a static RAM according to the third embodiment of the present invention. The third embodiment is constructed to be capable of performing a parallel inputting and outputting operation for 16-bit data, at the maximum.

Figure 16:
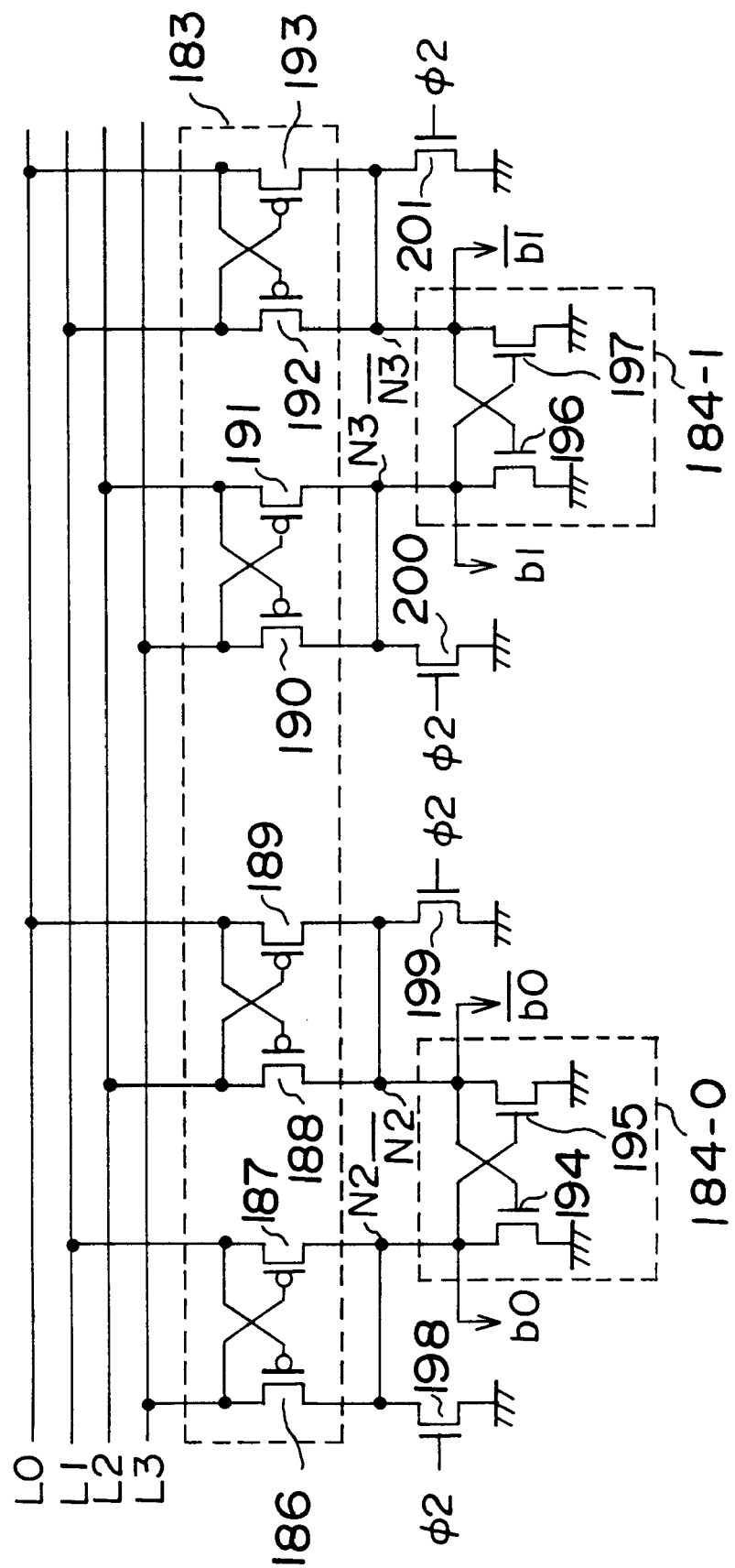
FIG. 16 is a circuit diagram of a decoder and latch circuits shown in FIG. 12.

The static RAM according to the third embodiment has sixteen data input buffers 42-1, 42-2, . . . , 42-16, as shown in FIG. 16. Write data DIN1, DIN2, . . . , DIN16 are input to the external terminals 40-1, 40-2, . . . , 40-16, respectively, through external data lines. Write control signals /WRC1, /WRC2, . . . , /WRC16 are input to the external terminals 41-1, 41-2, . . . , 41-16, respectively, through external write control signal lines.

The external terminals 40-1 and 41-1 are provided for the data input buffer 42-1; the external terminals 40-2 and 41-2 are provided for the data input buffer 42-2; . . . ; and the external terminals 40-16 and 41-16 are provided for the data input buffer 42-16. A pair of data input lines WD1 and /WD1 are connected to the data input buffer 42-1; a pair of data input lines WD2 and /WD2 are connected to the data input buffer 42-2; . . . ; and a pair of data input lines WD16 and /WD16 are connected to the data input buffer 42-16.

Figure 7:
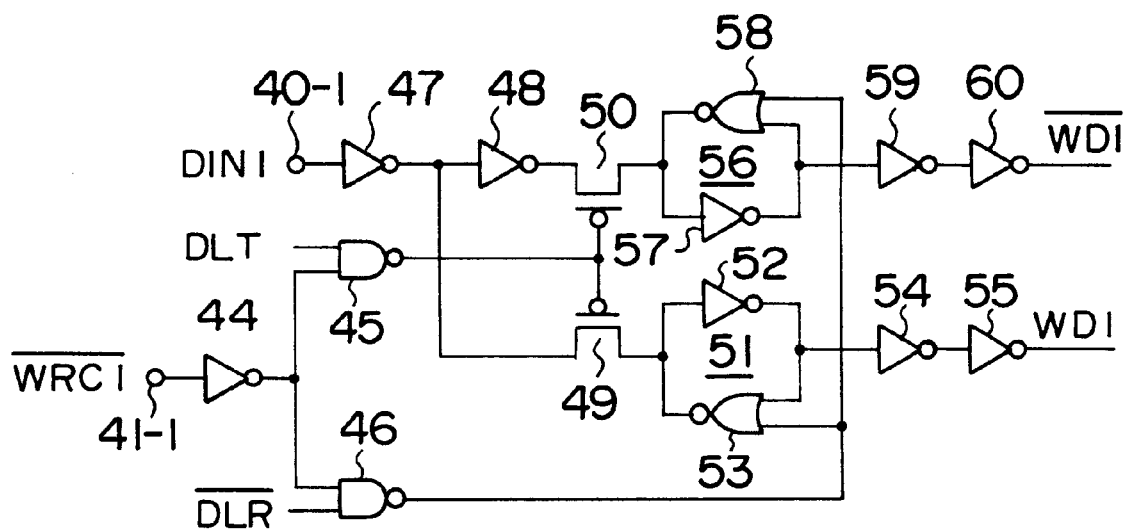
FIG. 7 is a circuit diagram of a data input buffer shown in FIG. 6.

FIG. 7 is a circuit diagram of the data input buffer 42-1. Other data input buffers 42-2, 42-3, . . . , 42-16 have the same structure. As shown in FIG. 7, the write control signal /WRC1 is inverted by an inverter 44. An output of the inverter 44 and a data transfer signal DLT are subjected to a NAND operation by a NAND circuit 45. An output of the inverter 44 and a data reset signal /DLR are subjected to a NAND operation by a NAND circuit 46.

The write data DIN1 is input to an inverter 47 from the external terminal 40. The write data DIN1 is inverted by the inverter 47, and is output to an inverter 48 and a pMOS transistor 49. An output of the inverter 48 is input to a pMOS transistor 50. An on/off operation of the pMOS transistor 49 is controlled by the output of the NAND circuit 45 so as to control a transfer of the output of the inverter 47. An on/off operation of the pMOS transistor 50 is controlled by the output of the NAND circuit 45 so as to control a transfer of the output of the inverter 48.

The output of the inverter 47, which is supplied via the pMOS transistor 49, is latched by a latch circuit 51. The latch circuit 51 includes an inverter 52 and a NOR circuit 53. The NOR circuit 53 performs a NOR operation on the output of the inverter 52 and the output of the NAND circuit 46. The output of the latch circuit 51 is inverted by an inverter 54. The output of the inverter 54 is inverted by an inverter 55 so as to drive the write data line WD1.

The output of the inverter 48, which is supplied via the pMOS transistor 50, is latched by a latch circuit 56. The latch circuit 56 includes an inverter 57 and a NOR circuit 58. The NOR circuit 58 performs a NOR operation on the output of the inverter 57 and the output of the NAND circuit 46. The output of the latch circuit 56 is inverted by an inverter 59. The output of the inverter 59 is inverted by an inverter 60 so as to drive the write data line /WD1.

Figure 8:
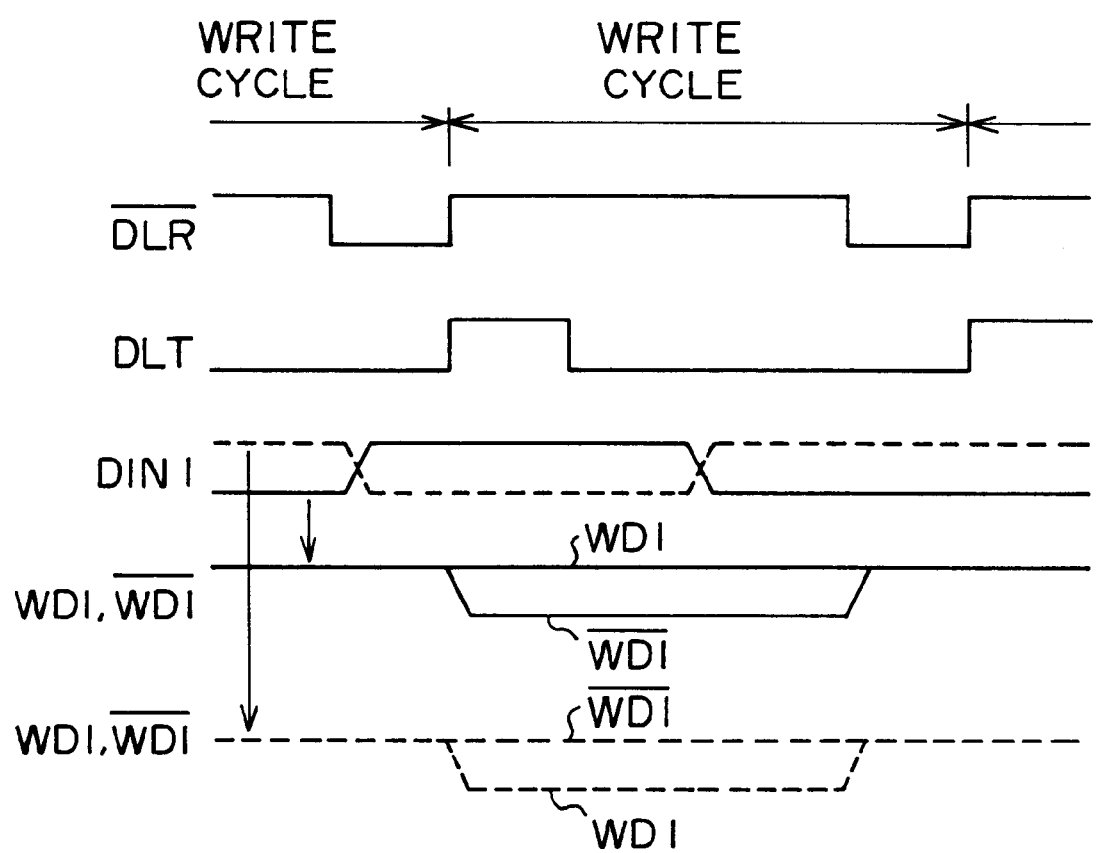
FIG. 8 is a waveform chart for explaining an operation of the data input buffer shown in FIG. 6.

FIG. 8 is a waveform chart for explaining an operation of the data input buffer 42-1. FIG. 8 shows a case in which the write control signal /WRC1 is at the L-level, that is, the data input buffer 42-1 is activated so as to input the write data DIN1.

In this case, the output of the inverter 44 is set to the H-level so that the NAND circuit 45 functions as an inverter with respect to the data transfer signal DLT and the NAND circuit 46 functions as an inverter with respect to the data reset signal /DLR.

During a write cycle, first the data reset signal /DLR is set to the H-level, and also the data transfer signal DLT is set to the H-level. Thus, the output of the NAND circuit 45 is set to the L-level, the pMOS transistor 49 is turned on, and the pMOS transistor 50 is turned on.

Additionally, the output of the NAND circuit 46 is set to the L-level so that the NOR circuit 53 functions as an inverter with respect to the output of the inverter 52 and the NOR circuit 58 functions as an inverter with respect to the output of the inverter 57.

In the above-mentioned state, when the write data DIN1 is set to the H-level, the output of the inverter 47 is set to the L-level, the output of the inverter 52 is set to the H-level, the output of the inverter 54 is set to the L-level, the output of the inverter 55 is set to the H-level, and the potential of the write data line WD1 is set to the H-level. Additionally, the output of the inverter 48 is set to the H-level, the output of the inverter 57 is set to the L-level, the output of the inverter 59 is set to the H-level, the output of the inverter 60 is set to the L-level, and the potential of the write data line /WD1 is set to the L-level.

Thereafter, the data transfer signal DLT is set to the L-level so that the output of the NAND circuit 45 is set to the H-level, the pMOS transistor 49 is turned off and the pMOS transistor 50 is turned off. Accordingly, each of the latch circuits 51 and 56 performs a latch operation so that the output of the latch circuit 51 is maintained to be the H-level and the output of the latch circuit 56 is maintained to be the L-level.

Thereafter, the data line reset signal /DLR is set to the L-level. Accordingly, the output of the NAND circuit 46 is reset to the H-level, the output of the NOR circuit 58 is reset to the L-level, the output of the inverter 57 is reset to the H-level, the output of the inverter 59 is reset to the L-level, the output of the inverter 60 is reset to the H-level, and the potential of the write data line /WD1 is reset to the H-level.

On the other hand, when the write data DIN1 is set to the L-level, the output of the inverter 47 is set to the H-level, the output of the inverter 52 is set to the L-level, the output of the inverter 54 is set to the H-level, the output of the inverter 55 is set to the L-level, and the potential of the write data line WD1 is set to the L-level. Additionally, the output of the inverter 48 is set to the L-level, the output of the inverter 57 is set to the H-level, the output of the inverter 59 is set to the L-level, the output of the inverter 60 is set to the H-level, and the potential of the write data line /WD1 is set to the H-level.

Thereafter, the data transfer signal DLT is set to the L-level so that the output of the NAND circuit 45 is set to the H-level, the pMOS transistor 49 is turned off, and the pMOS transistor 50 is turned off. Accordingly, each of the latch circuits 51 and 56 performs a latch operation so that the output of the latch circuit 51 is maintained to be the L-level and the output of the latch circuit 56 is maintained to be the H-level.

Thereafter, the data line reset signal /DLR is set to the L-level. Accordingly, the output of the NAND circuit 46 is reset to the H-level, the output of the NOR circuit 53 is reset to the L-level, the output of the inverter 52 is reset to the H-level, the output of the inverter 54 is reset to the L-level, the output of the inverter 55 is reset to the H-level, and the potential of the write data line WD1 is reset to the H-level.

On the other hand, when the data input buffer 42-1 is not activated and the write data DIN1 is not input, the write control signal /WRC1 is set to the H-level. Thus, the output of the inverter 44 is set to the L-level, the output of the NAND circuit 45 is set to the H-level, the pMOS transistor 49 is turned off, and the pMOS transistor 50 is turned off.

Additionally, in this case, the output of the NAND circuit 46 is set to the H-level. Accordingly, the output of the NOR circuit 53 is set to the L-level, the output of the inverter 52 is set to the H-level, the output of the inverter 54 is set to the L-level, the output of the inverter 55 is set to the H-level. Thus, the potential of the write data line WD1 is set to the H-level. Also, the output of the NOR circuit 58 is set to the L-level, the output of the inverter 56 is set to the H-level, the output of the inverter 59 is set to the L-level, the output of the inverter 60 is set to the H-level. Thus, the potential of the write data line /WD1 is set to the H-level.

As mentioned above, in the third embodiment of the present invention, the data input buffers 42-1, 42-2, ..., 42-16 can be activated separately by the respective write control signals /WRC1, /WRC2, ..., /WRC16. Thus, only an arbitrary input data buffer can be activated among the input data buffers 42-1, 42-2, ..., 42-16.

Accordingly, if it is required to rewrite arbitrary bits in the 16-bit data, there is no need to perform an unnecessary operation in which the entire 16-bit data is read to rewrite the desired bits and write the 16-bit data again. That is, the desired bits can be rewritten by activating only pairs of write data lines corresponding to the desired bits.

Thus, according to the third embodiment of the present invention, power consumption can be reduced by reducing the charging and discharging current for the pairs of write data lines WD1 and /WD1, WD2 and /WD2, ..., WD16 and /WD16.

Figure 9:
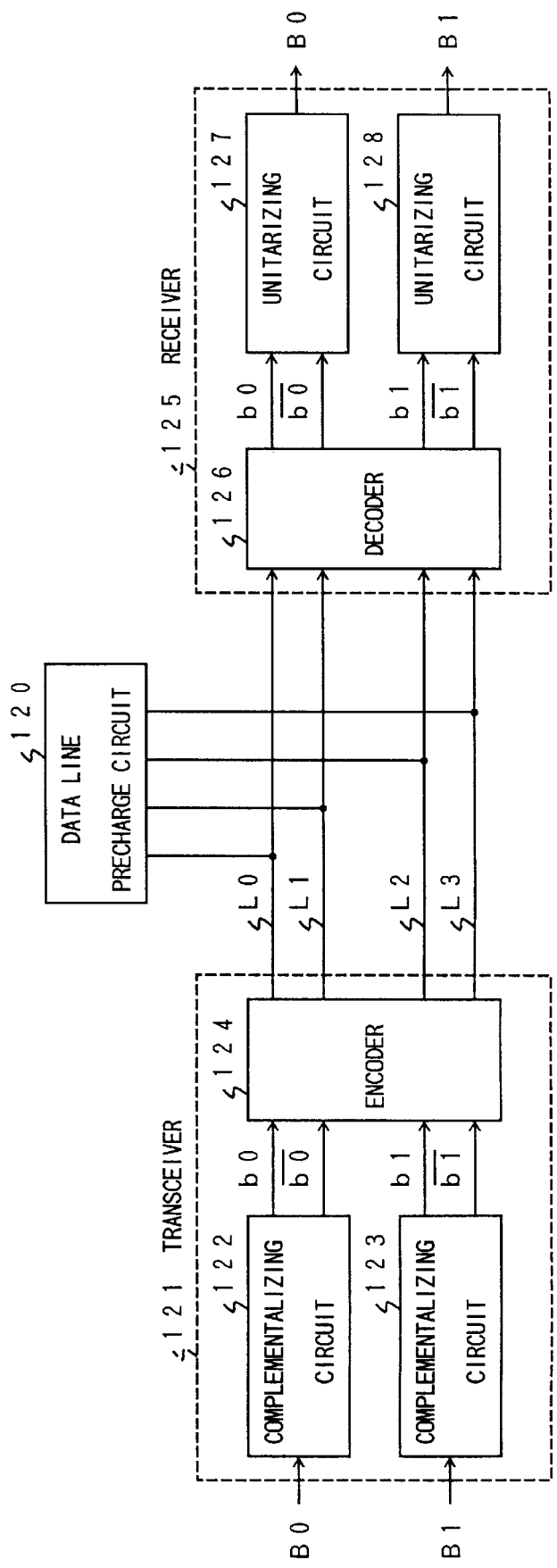
FIG. 9 is a block diagram of a semiconductor integrated circuit according to a fourth embodiment of the present invention.

A description will now be given of fourth to eighth embodiments of the present invention. FIG. 9 is a block diagram of a semiconductor integrated circuit according to the fourth embodiment of the present invention. The semiconductor integrated circuit comprises a transceiver 121, a receiver 125 and a data precharge circuit 120. The transceiver 121 and the receiver 125 are connected by data lines L0, L1, L2 and L3 arranged in a parallel relationship. The data precharge circuit 120 precharges the data lines L0, L1, L2 and L3.

The transceiver 121 comprises complementalizing circuits 122 and 123 and an encoder 124. Data B0 and B1, which are to be transmitted, are input to the complementalizing circuits 122 and 123, respectively. The complementalizing circuit 122 converts the data B0 into data b0 and data /b0 having an inverted logic level of b0. The complementalizing circuit 123 converts the data B1 into data b1 and data /b1 having an inverted logic levels. Table 2 represents the function of the complementalizing circuit 122, and Table 3 represents the function of the complementalizing circuit 123.

TABLE 2

| B0 | b0 | /b0 |
|----|----|-----|
| L  | L  | H   |
| H  | H  | L   |

TABLE 3

| B1 | b1 | /b1 |
|----|----|-----|
| L  | L  | H   |
| H  | H  | L   |

The encoder 124 encodes the complementary data b0, /b0, b1, /b1 so as to drive the data lines L0, L1, L2 and L3. The encoder operates as follows.

The encoder 124 maintains the data lines L1, L2 and L3 in a floating state and discharges the data line L0 when the complementary data b0=L, /b0=H, b1=L and /b1=H. The encoder 124 maintains the data lines L0, L2 and L3 in a floating state and discharges the data line L1 when the complementary data b0=H, /b0=L, b1=L and /b1=H. The encoder 124 maintains the data lines L0, L1 and L3 in a floating state and discharges the data line L2 when the complementary data b0=L, /b0=H, b1=H and /b1=L. The encoder 124 maintains the data lines L0, L1 and L2 in a floating state and discharges the data line L3 when the complementary data b0=H, /b0=L, b1=H and /b1=L.

Accordingly, a relationship between the logic levels of the data B0 and B1 and the logic levels of the complementary data b0, /b0 and b1, /b1 is represented by the following Table 4.

TABLE 4

| B0 | B1 | b0 | /b0 | b1 | /b1 | L0 | L1 | L2 | L3 |
|----|----|----|-----|----|-----|----|----|----|----|
| L | L | L | H | L | H | L | H | H | H |
| H | L | H | L | L | H | H | L | H | H |
| L | H | L | H | H | L | H | H | L | H |
| H | H | H | L | H | L | H | H | H | L |

The receiver 125 receives the data transmitted through the data lines L0, L1, L2 and L3. The receiver 125 comprises a decoder 126 and a unitizing circuits 127 and 128.

The decoder 126 decodes the logic levels of the data lines L0, L1, L2 and L3 so as to regenerate the complementary data b0, /b1 and b1, /b1. The unitizing circuit 127 unitizes the complementary data b0 and /b0 into data B0 to be transmitted. The unitizing circuit 128 unitizes the complementary data b1 and /b1 into data B1 to be transmitted.

According to the fourth embodiment of the present invention, when the data B0 and B1 are transmitted, the data B0 and B1 are converted into complementary data b0, /b0 and b1, /b1. However, since the data is transmitted by discharging only one of the data lines L0, L1, L2 and L3 which are precharged at the power source voltage VCC, power consumption of the data lines L0, L1, L2 and L3 is reduced. It should be noted that, in the conventional circuit, tow data lines must be discharged after the complementary data is transmitted.

A description will now be given of a fifth embodiment according to the present invention. FIG. 10 is a circuit diagram of a part of a semiconductor integrated circuit according to the fifth embodiment of the present invention. In FIG. 10, the data lines L0, L1, L2 and L3, which are provided for transmitting data, are arranged in a parallel relationship. The semiconductor integrated circuit according to the fifth embodiment comprises a precharge circuit 130, transceivers 133-0, 133-1, 133-2, and 133-3 and a receiver 142.

The precharge circuit 130 precharges the data lines L0, L1, L2 and L3 at the power source voltage VCC prior to transmitting the data. The precharge circuit 130 comprises pMOS transistors 132-0, 132-1, 132-2 and 132-3 which are connected to a VCC power source line 131. An on/off operation of each of the pMOS transistors 132-0, 132-1, 132-2 and 132-3 is controlled by a data line precharge signal PC.

A source of the pMOS transistor 132-0 is connected to the VCC power source line 131, and a drain of the pMOS transistor 132-0 is connected to the data line L0. A source of the pMOS transistor 132-1 is connected to the VCC power source line 131, and a drain of the pMOS transistor 132-1 is connected to the data line L1. A source of the pMOS transistor 132-2 is connected to the VCC power source line 131, and a drain of the pMOS transistor 132-2 is connected to the data line L2. A source of the pMOS transistor 132-3 is connected to the VCC power source line 131, and a drain of the pMOS transistor 132-3 is connected to the data line L3.

Transceivers 133-0, 133-1, 133-2 and 133-3 transmit data input thereto. The transceiver 133-0 transmits the data B00 and B01. The transceiver 133-1 transmits the data B10 and B11. The transceiver 133-2 transmits the data B20 and B21. The transceiver 133-3 transmits the data B30 and B31.

The transceiver 133-0 comprises an encoder (ENC) 134 and nMOS transistors 135-0, 135-1, 135-2 and 135-3 each of which constitutes an output circuit. Activation and deactivation of the encoder 134 is controlled by an encoder activating signal ENO. When the encoder 134 is activated, the data B00 and B01 to be transmitted are encoded so as to generate output control signals S00, S01, S02 and S03 as shown in the following Table 5. When the encoder 134 is deactivated, the output control signals S00, S01, S02 and S03 are set to the L-level.

TABLE 5

| B00 | B01 | S00 | S01 | S02 | S03 |
|-----|-----|-----|-----|-----|-----|
| L | L | H | L | L | L |
| H | L | L | H | L | L |
| L | H | L | L | H | L |
| H | H | L | L | L | H |

An on/off operation of the nMOS transistor 135-0 is controlled by the output control signal S00. An on/off operation of the nMOS transistor 135-1 is controlled by the output control signal S01. An on/off operation of the nMOS transistor 135-2 is controlled by the output control signal S02. An on/off operation of the nMOS transistor 135-3 is controlled by the output control signal S03.

A drain of the nMOS transistor 135-0 is connected to the data line L0, and a source of the nMOS transistor 135-0 is connected to the ground line. A drain of the nMOS transistor 135-1 is connected to the data line L1, and a source of the nMOS transistor 135-1 is connected to the ground line. A drain of the nMOS transistor 135-2 is connected to the data line L2, and a source of the nMOS transistor 135-2 is connected to the ground line. A drain of the nMOS transistor 135-3 is connected to the data line L3, and a source of the nMOS transistor 135-3 is connected to the ground line.

Accordingly, when the transceiver 133-0 is selected and the encoder 134 is set to an active state, a relationship between the logic levels of the data B00 and B01, the logic levels of the output control signals S00, S01, S02 and S03 and the logic levels of the data lines L0, L1, L2 and L3 is represented by the following Table 6.

TABLE 6

| B00 | B01 | S00 | S01 | S02 | S03 | L0 | L1 | L2 | L3 |
|-----|-----|-----|-----|-----|-----|----|----|----|----|
| L | L | H | L | L | L | L | H | H | H |
| H | L | L | H | L | L | H | L | H | H |
| L | H | L | L | H | L | H | H | L | H |
| H | H | L | L | L | H | H | H | H | L |

The transceiver 133-1 comprises an encoder (ENC) 136 and nMOS transistors 137-0, 137-1, 137-2 and 137-3 each of which constitutes an output circuit. Activation and deactivation of the encoder 136 is controlled by an encoder activating signal EN1. When the encoder 136 is activated, the data B10 and B11 to be transmitted are encoded so as to generate output control signals S10, S11, S12 and S13 as shown in the following Table 7. When the encoder 136 is deactivated, the output control signals S10, S11, S12 and S13 are set to the L-level.

TABLE 7

| B10 | B11 | S10 | S11 | S12 | S13 |
|-----|-----|-----|-----|-----|-----|
| L | L | H | L | L | L |
| H | L | L | H | L | L |
| L | H | L | L | H | L |
| H | H | L | L | L | H |

An on/off operation of the nMOS transistor 137-0 is controlled by the output control signal S10. An on/off operation of the nMOS transistor 137-1 is controlled by the output control signal S11. An on/off operation of the nMOS transistor 137-2 is controlled by the output control signal S12. An on/off operation of the nMOS transistor 137-3 is controlled by the output control signal S13.

A drain of the nMOS transistor 137-0 is connected to the data line L0, and a source of the nMOS transistor 137-0 is connected to the ground line. A drain of the nMOS transistor 137-1 is connected to the data line L1, and a source of the nMOS transistor 137-1 is connected to the ground line. A drain of the nMOS transistor 137-2 is connected to the data line L2, and a source of the nMOS transistor 137-2 is connected to the ground line. A drain of the nMOS transistor 137-3 is connected to the data line L3, and a source of the nMOS transistor 137-3 is connected to the ground line.

Accordingly, when the transceiver 133-1 is selected and the encoder 136 is set to an active state, a relationship between the logic levels of the data B10 and B11, the logic levels of the output control signals S10, S11, S12 and S13 and the logic levels of the data lines L0, L1, L2 and L3 is represented by the following Table 8.

TABLE 8

| B10 | B11 | S10 | S11 | S12 | S13 | L0 | L1 | L2 | L3 |
|-----|-----|-----|-----|-----|-----|----|----|----|----|
| L | L | H | L | L | L | L | H | H | H |
| H | L | L | H | L | L | H | L | H | H |
| L | H | L | L | H | L | H | H | L | H |
| H | H | L | L | L | H | H | H | H | L |

The transceiver 133-2 comprises an encoder (ENC) 138 and nMOS transistors 139-0, 139-1, 139-2 and 139-3 each of which constitutes an output circuit. Activation and deactivation of the encoder 138 is controlled by an encoder activating signal EN2. When the encoder 138 is activated, the data B20 and B21 to be transmitted are encoded so as to generate output control signals S20, S21, S22 and S23 as shown in the following Table 9. When the encoder 138 is deactivated, the output control signals S20, S21, S22 and S23 are set to the L-level.

TABLE 9

| B20 | B21 | S20 | S21 | S22 | S23 |
|-----|-----|-----|-----|-----|-----|
| L | L | H | L | L | L |
| H | L | L | H | L | L |
| L | H | L | L | H | L |
| H | H | L | L | L | H |

An on/off operation of the nMOS transistor 139-0 is controlled by the output control signal S20. An on/off operation of the nMOS transistor 139-1 is controlled by the output control signal S21. An on/off operation of the nMOS transistor 139-2 is controlled by the output control signal S22. An on/off operation of the nMOS transistor 139-3 is controlled by the output control signal S23.

A drain of the nMOS transistor 139-0 is connected to the data line L0, and a source of the nMOS transistor 139-0 is connected to the ground line. A drain of the nMOS transistor 139-1 is connected to the data line L1, and a source of the nMOS transistor 139-1 is connected to the ground line. A drain of the nMOS transistor 139-2 is connected to the data line L2, and a source of the nMOS transistor 139-2 is connected to the ground line. A drain of the nMOS transistor 139-3 is connected to the data line L3, and a source of the nMOS transistor 139-3 is connected to the ground line.

Accordingly, when the transceiver 133-2 is selected and the encoder 138 is set to an active state, a relationship between the logic levels of the data B20 and B21, the logic levels of the output control signals S20, S21, S22 and S23 and the logic levels of the data lines L0, L1, L2 and L3 is represented by the following Table 10.

TABLE 10

| B20 | B21 | S20 | S21 | S22 | S23 | L0 | L1 | L2 | L3 |
|-----|-----|-----|-----|-----|-----|----|----|----|----|
| L | L | H | L | L | L | L | H | H | H |
| H | L | L | H | L | L | H | L | H | H |
| L | H | L | L | H | L | H | H | L | H |
| H | H | L | L | L | H | H | H | H | L |

The transceiver 133-3 comprises an encoder (ENC) 140 and nMOS transistors 141-0, 141-1, 141-2 and 141-3 each of which constitutes an output circuit. Activation and deactivation of the encoder 140 is controlled by an encoder activating signal EN3. When the encoder 140 is activated, the data B30 and B31 to be transmitted are encoded so as to generate output control signals S30, S31, S32 and S33 as shown in the following Table 11. When the encoder 140 is deactivated, the output control signals S30, S31, S32 and S33 are set to the L-level.

TABLE 11

| B30 | B31 | S30 | S31 | S32 | S33 |
|-----|-----|-----|-----|-----|-----|
| L | L | H | L | L | L |
| H | L | L | H | L | L |
| L | H | L | L | H | L |
| H | H | L | L | L | H |

An on/off operation of the nMOS transistor 141-0 is controlled by the output control signal S30. An on/off operation of the nMOS transistor 141-1 is controlled by the output control signal S31. An on/off operation of the nMOS transistor 141-2 is controlled by the output control signal S32. An on/off operation of the nMOS transistor 141-3 is controlled by the output control signal S33.

A drain of the nMOS transistor 141-0 is connected to the data line L0, and a source of the nMOS transistor 141-0 is connected to the ground line. A drain of the nMOS transistor 141-1 is connected to the data line L1, and a source of the nMOS transistor 141-1 is connected to the ground line. A drain of the nMOS transistor 141-2 is connected to the data line L2, and a source of the nMOS transistor 141-2 is connected to the ground line. A drain of the nMOS transistor 141-3 is connected to the data line L3, and a source of the nMOS transistor 141-3 is connected to the ground line.

Accordingly, when the transceiver 133-3 is selected and the encoder 140 is set to an active state, a relationship between the logic levels of the data B30 and B31, the logic levels of the output control signals S30, S31, S32 and S33 and the logic levels of the data lines L0, L1, L2 and L3 is represented by the following Table 12.

TABLE 12

| B30 | B31 | S30 | S31 | S32 | S33 | L0 | L1 | L2 | L3 |
|-----|-----|-----|-----|-----|-----|----|----|----|----|
| L | L | H | L | L | L | L | H | H | H |
| H | L | L | H | L | L | H | L | H | H |
| L | H | L | L | H | L | H | H | L | H |
| H | H | L | L | L | H | H | H | H | L |

The receiver 142 decodes the logic levels of the data lines L0, L1, L2 and L3 so as to regenerate the data B0 and B1 to be transmitted. The following Table 13 represents a function of the receiver 142.

TABLE 13

| L0 | L1 | L2 | L3 | B0 | B1 |
|----|----|----|----|----|----|
| L  | H  | H  | H  | L  | L  |
| H  | L  | H  | H  | H  | L  |
| H  | H  | L  | H  | L  | H  |
| H  | H  | H  | L  | H  | H  |

According to the fifth embodiment of the present invention, one of the pairs of the data B00 and B01, B10 and B11, B20 and B21 and B30 and B31 are selectively transmitted by discharging one of the data lines L0, L1, L2 and L3 which are precharged to the power source voltage VCC. Additionally, each of the output circuits which drives the corresponding one of the data lines L0, L1, L2 and L3 is not an inverter but an open drain circuit which comprises the four nMOS transistors 135-0 to 135-3, for example. Accordingly, a capacity of output junctions provided to the data lines L0, L1, L2 and L3 is reduced. Thus, power consumption of the data lines L0, L1, L2 and L3 can be further reduced.

Figure 11:
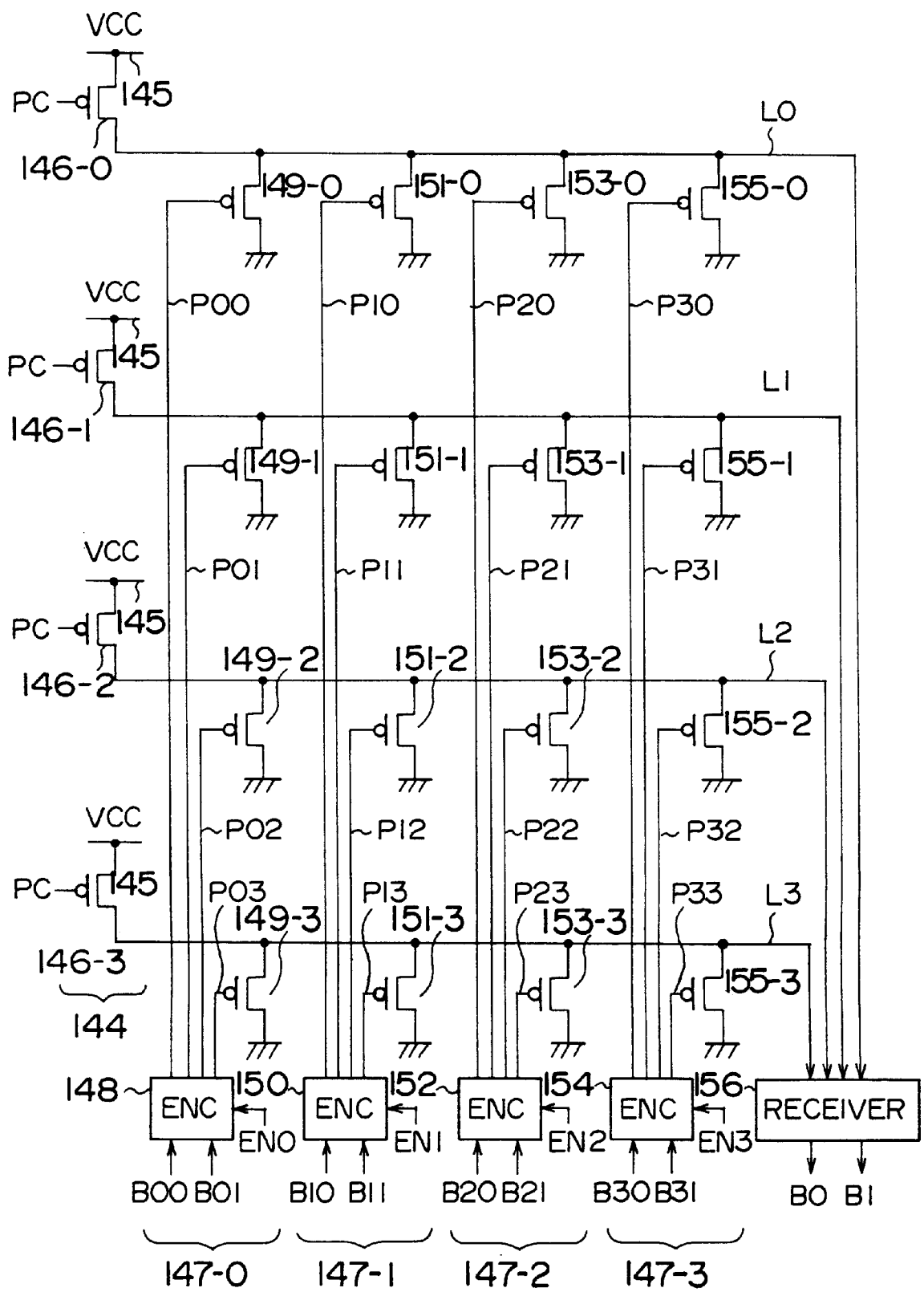
FIG. 11 is a circuit diagram of a part of a semiconductor integrated circuit according to a sixth embodiment of the present invention.

A description will now be given of a sixth embodiment according to the present invention. FIG. 11 is a circuit diagram of a part of a semiconductor integrated circuit according to the sixth embodiment of the present invention. In FIG. 11, the data lines L0, L1, L2 and L3, which are provided for transmitting data, are arranged in a parallel relationship. The semiconductor integrated circuit according to the sixth embodiment comprises a precharge circuit 144, transceivers 147-0, 147-1, 147-2, and 147-3 and a receiver 156.

The precharge circuit 144 precharges the data lines L0, L1, L2 and L3 at the power source voltage VCC prior to transmitting the data. The precharge circuit 144 comprises pMOS transistors 146-0, 146-1, 146-2 and 146-3 which are connected to a VCC power source line 145. An on/off operation of each of the pMOS transistors 146-0, 146-1, 146-2 and 146-3 is controlled by a data line precharge signal PC.

A source of the pMOS transistor 146-0 is connected to the VCC power source line 145, and a drain of the pMOS transistor 146-0 is connected to the data line L0. A source of the pMOS transistor 146-1 is connected to the VCC power source line 145, and a drain of the pMOS transistor 146-1 is connected to the data line L1. A source of the pMOS transistor 146-2 is connected to the VCC power source line 145, and a drain of the pMOS transistor 146-2 is connected to the data line L2. A source of the pMOS transistor 146-3 is connected to the VCC power source line 145, and a drain of the pMOS transistor 146-3 is connected to the data line L3.

Transceivers 147-0, 147-1, 147-2 and 147-3 transmit data input thereto. The transceiver 147-0 transmits the data B00 and B01. The transceiver 147-1 transmits the data B10 and B11. The transceiver 147-2 transmits the data B20 and B21. The transceiver 147-3 transmits the data B30 and B31.

The transceiver 147-0 comprises an encoder (ENC) 148 and pMOS transistors 149-0, 149-1, 149-2 and 149-3 each of which constitutes an output circuit. Activation and deactivation of the encoder 148 is controlled by an encoder activating signal EN0. When the encoder 148 is activated, the data B00 and B01 to be transmitted are encoded so as to generate output control signals P00, P01, P02 and P03 as shown in the following Table 14. When the encoder 148 is deactivated, the output control signals P00, P01, P02 and P03 are set to the H-level.

TABLE 14

| B00 | B01 | P00 | P01 | P02 | P03 |
|-----|-----|-----|-----|-----|-----|
| L   | L   | L   | H   | H   | H   |
| H   | L   | H   | L   | H   | H   |
| L   | H   | H   | H   | L   | H   |
| H   | H   | H   | H   | H   | L   |

An on/off operation of the pMOS transistor 149-0 is controlled by the output control signal P00. An on/off operation of the pMOS transistor 149-1 is controlled by the output control signal P01. An on/off operation of the pMOS transistor 149-2 is controlled by the output control signal P02. An on/off operation of the pMOS transistor 149-3 is controlled by the output control signal P03.

A source of the pMOS transistor 149-0 is connected to the data line L0, and a drain of the pMOS transistor 149-0 is connected to the ground line. A source of the pMOS transistor 149-1 is connected to the data line L1, and a drain of the pMOS transistor 149-1 is connected to the ground line. A source of the pMOS transistor 149-2 is connected to the data line L2, and a drain of the pMOS transistor 149-2 is connected to the ground line. A source of the pMOS transistor 149-3 is connected to the data line L3, and a drain of the pMOS transistor 149-3 is connected to the ground line.

Accordingly, when the transceiver 147-0 is selected and the encoder 148 is set to an active state, a relationship between the logic levels of the data B00 and B01, the logic levels of the output control signals P00, P01, P02 and P03 and the logic levels of the data lines L0, L1, L2 and L3 is represented by the following Table 15.

TABLE 15

| B00 | B01 | P00 | P01 | P02 | P03 | L0 | L1 | L2 | L3 |
|-----|-----|-----|-----|-----|-----|----|----|----|----|
| L   | L   | L   | H   | H   | H   | L  | H  | H  | H  |
| H   | L   | H   | L   | H   | H   | H  | L  | H  | H  |
| L   | H   | H   | H   | L   | H   | H  | H  | L  | H  |
| H   | H   | H   | H   | H   | L   | H  | H  | H  | L  |

The transceiver 147-1 comprises an encoder (ENC) 150 and pMOS transistors 151-0, 151-1, 151-2 and 151-3 each of which constitutes an output circuit. Activation and deactivation of the encoder 150 is controlled by an encoder activating signal EN1. When the encoder 150 is activated, the data B10 and B11 to be transmitted are encoded so as to generate output control signals P10, P11, P12 and P13 as shown in the following Table 16. When the encoder 150 is deactivated, the output control signals P10, P11, P12 and P13 are set to the H-level.

TABLE 16

| B10 | B11 | P10 | P11 | P12 | P13 |
|-----|-----|-----|-----|-----|-----|
| L   | L   | L   | H   | H   | H   |
| H   | L   | H   | L   | H   | H   |
| L   | H   | H   | H   | L   | H   |
| H   | H   | H   | H   | H   | L   |

An on/off operation of the pMOS transistor 151-0 is controlled by the output control signal P10. An on/off operation of the pMOS transistor 151-1 is controlled by the output control signal P11. An on/off operation of the pMOS transistor 151-2 is controlled by the output control signal P12. An on/off operation of the pMOS transistor 151-3 is controlled by the output control signal P13.

A source of the pMOS transistor 151-0 is connected to the data line L0, and a drain of the nMOS transistor 151-0 is connected to the ground line. A source of the pMOS transistor 151-1 is connected to the data line L1, and a drain of the pMOS transistor 151-1 is connected to the ground line. A source of the pMOS transistor 151-2 is connected to the data line L2, and a drain of the pMOS transistor 151-2 is connected to the ground line. A source of the pMOS transistor 151-3 is connected to the data line L3, and a drain of the pMOS transistor 151-3 is connected to the ground line.

Accordingly, when the transceiver 147-1 is selected and the encoder 150 is set to an active state, a relationship between the logic levels of the data B10 and B11, the logic levels of the output control signals P10, P11, P12 and P13 and the logic levels of the data lines L0, L1, L2 and L3 is represented by the following Table 17.

TABLE 17

| B10 | B11 | P10 | P11 | P12 | P13 | L0 | L1 | L2 | L3 |
|-----|-----|-----|-----|-----|-----|----|----|----|----|
| L | L | L | H | H | H | L | H | H | H |
| H | L | H | L | H | H | H | L | H | H |
| L | H | H | H | L | H | H | H | L | H |
| H | H | H | H | H | L | H | H | H | L |

The transceiver 147-2 comprises an encoder (ENC) 152 and pMOS transistors 153-0, 153-1, 153-2 and 153-3 each of which constitutes an output circuit. Activation and deactivation of the encoder 152 is controlled by an encoder activating signal EN2. When the encoder 152 is activated, the data B20 and B21 to be transmitted are encoded so as to generate output control signals P20, P21, P22 and P23 as shown in the following Table 18. When the encoder 152 is deactivated, the output control signals P20, P21, P22 and P23 are set to the H-level.

TABLE 18

| B20 | B21 | P20 | P21 | P22 | P23 |
|-----|-----|-----|-----|-----|-----|
| L | L | L | H | H | H |
| H | L | H | L | H | H |
| L | H | H | H | L | H |
| H | H | H | H | H | L |

An on/off operation of the pMOS transistor 153-0 is controlled by the output control signal P20. An on/off operation of the pMOS transistor 153-1 is controlled by the output control signal P21. An on/off operation of the pMOS transistor 153-2 is controlled by the output control signal P22. An on/off operation of the pMOS transistor 153-3 is controlled by the output control signal P23.

A source of the pMOS transistor 153-0 is connected to the data line L0, and a drain of the pMOS transistor 153-0 is connected to the ground line. A source of the pMOS transistor 153-1 is connected to the data line L1, and a drain of the pMOS transistor 153-1 is connected to the ground line. A source of the pMOS transistor 153-2 is connected to the data line L2, and a source of the pMOS transistor 153-2 is connected to the ground line. A source of the pMOS transistor 153-3 is connected to the data line L3, and a drain of the pMOS transistor 153-3 is connected to the ground line.

Accordingly, when the transceiver 147-2 is selected and the encoder 152 is set to an active state, a relationship between the logic levels of the data B20 and B21, the logic levels of the output control signals P20, P21, P22 and P23 and the logic levels of the data lines L0, L1, L2 and L3 is represented by the following Table 19.

TABLE 19

| B20 | B21 | P20 | P21 | P22 | P23 | L0 | L1 | L2 | L3 |
|-----|-----|-----|-----|-----|-----|----|----|----|----|
| L | L | L | H | H | H | L | H | H | H |
| H | L | H | L | H | H | H | L | H | H |
| L | H | H | H | L | H | H | H | L | H |
| H | H | H | H | H | L | H | H | H | L |

The transceiver 147-3 comprises an encoder (ENC) 154 and pMOS transistors 155-0, 155-1, 155-2 and 155-3 each of which constitutes an output circuit. Activation and deactivation of the encoder 154 is controlled by an encoder activating signal EN3. When the encoder 154 is activated, the data B30 and B31 to be transmitted are encoded so as to generate output control signals P30, P31, P32 and P33 as shown in the following Table 20. When the encoder 154 is deactivated, the output control signals P30, P31, P32 and P33 are set to the H-level.

TABLE 20

| B30 | B31 | P30 | P31 | P32 | P33 |
|-----|-----|-----|-----|-----|-----|
| L | L | L | H | H | H |
| H | L | H | L | H | H |
| L | H | H | H | L | H |
| H | H | H | H | H | L |

An on/off operation of the pMOS transistor 155-0 is controlled by the output control signal P30. An on/off operation of the pMOS transistor 155-1 is controlled by the output control signal P31. An on/off operation of the pMOS transistor 155-2 is controlled by the output control signal P32. An on/off operation of the pMOS transistor 155-3 is controlled by the output control signal P33.

A source of the pMOS transistor 155-0 is connected to the data line L0, and a drain of the pMOS transistor 155-0 is connected to the ground line. A source of the pMOS transistor 155-1 is connected to the data line L1, and a drain of the pMOS transistor 155-1 is connected to the ground line. A source of the pMOS transistor 155-2 is connected to the data line L2, and a drain of the pMOS transistor 155-2 is connected to the ground line. A source of the pMOS transistor 155-3 is connected to the data line L3, and a drain of the pMOS transistor 155-3 is connected to the ground line.

Accordingly, when the transceiver 147-3 is selected and the encoder 154 is set to an active state, a relationship between the logic levels of the data B30 and B31, the logic levels of the output control signals P30, P31, P32 and P33 and the logic levels of the data lines L0, L1, L2 and L3 is represented by the following Table 21.

TABLE 21

| B30 | B31 | P30 | P31 | P32 | P33 | L0 | L1 | L2 | L3 |
|-----|-----|-----|-----|-----|-----|----|----|----|----|
| L | L | L | H | H | H | L | H | H | H |
| H | L | H | L | H | H | H | L | H | H |
| L | H | H | H | L | H | H | H | L | H |
| H | H | H | H | H | L | H | H | H | L |

The receiver 156 decodes the logic levels of the data lines L0, L1, L2 and L3 so as to regenerate the data B0 and B1 to be transmitted. The following Table 22 represents a function of the receiver 156.

TABLE 22

| L0 | L1 | L2 | L3 | B0 | B1 |
|----|----|----|----|----|----|
| L  | H  | H  | H  | L  | L  |
| H  | L  | H  | H  | H  | L  |
| H  | H  | L  | H  | L  | H  |
| H  | H  | H  | L  | H  | H  |

According to the sixth embodiment of the present invention, one of the pairs of the data B00 and B01, B10 and B11, B20 and B21 and B30 and B31 are selectively transmitted by discharging one of the data lines L0, L1, L2 and L3 which are precharged to the power source voltage VCC. Additionally, each of the output circuits which drives the corresponding one of the data lines L0, L1, L2 and L3 is not an inverter but an open drain circuit which comprises the four pMOS transistors 149-0 to 149-3, for example. Accordingly, a capacity of output junctions provided to the data lines L0, L1, L2 and L3 is reduced. Thus, power consumption of the data lines L0, L1, L2 and L3 can be further reduced. Also, according to the pMOS source follower pull-down scheme, since the L-levels of the data lines L0 to L3 are pMOS threshold voltage level, a voltage swing of the data lines L0 to L3 is reduced and the power consumption is reduced.

Figure 12:
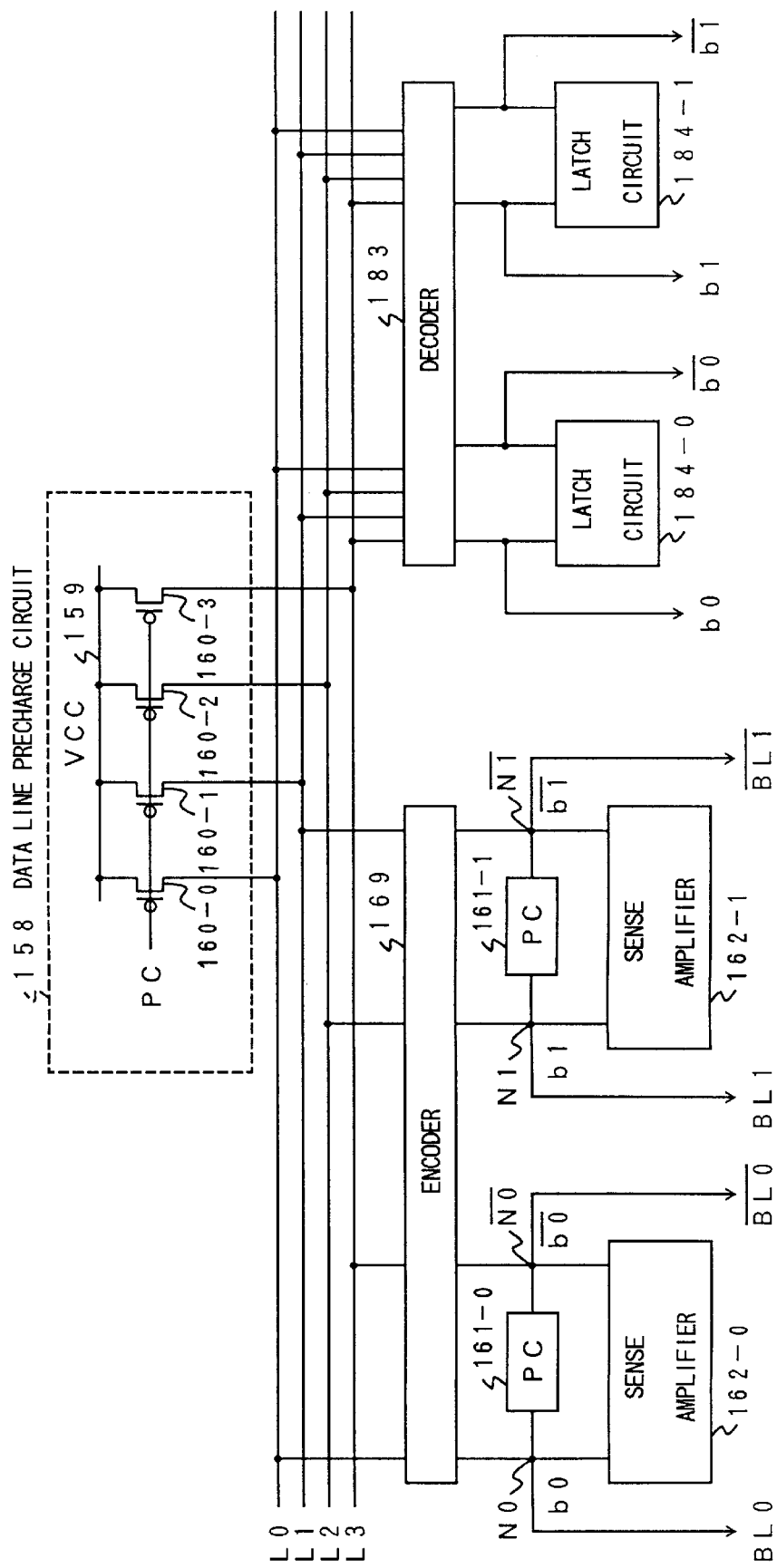
FIG. 12 is a block diagram of a part of a semiconductor integrated circuit according to a seventh embodiment of the present invention.

A description will now be given, with reference to FIGS. 12 to 16, of a seventh embodiment according to the present invention. FIG. 12 is a block diagram of a part of a semiconductor integrated circuit according to the seventh embodiment of the present invention. The semiconductor integrated circuit shown in FIG. 12 is applied to a static random access memory (SRAM).

In FIG. 12, the data lines L0, L1, L2 and L3, which are provided for transmitting data, are arranged in a parallel relationship. The data lines L0, L1, L2 and L3 are precharged to a power source voltage VCC by a precharge circuit 158.

The precharge circuit 158 comprises a VCC power source line 159 and pMOS transistors 160-0, 160-1, 160-2 and 160-3. An on/off operation of each of the pMOS transistors 160-0, 160-1, 160-2 and 160-3 is controlled by a data line precharge signal PC.

A source of the pMOS transistor 160-0 is connected to the VCC power source line 159, and a drain of the pMOS transistor 160-0 is connected to the data line L0. A source of the pMOS transistor 160-1 is connected to the VCC power source line 159, and a drain of the pMOS transistor 160-1 is connected to the data line L1. A source of the pMOS transistor 160-2 is connected to the VCC power source line 159, and a drain of the pMOS transistor 160-2 is connected to the data line L2. A source of the pMOS transistor 160-3 is connected to the VCC power source line 159, and a drain of the pMOS transistor 160-3 is connected to the data line L3.

A precharge circuit 161-0 is provided for precharging a pair of nodes N0 and /N0. The pair of nodes N0 and /N0 are provided respectively to a pair of bit lines BL0 and /BL0 from which data stored in memory cells of a first block (not shown in figure) is read.

A sense amplifier 162-0 is provided for amplifying a potential difference between the nodes N0 and /N0 so as to latch the data read from the memory cells by setting a potential of one of the nodes having a higher potential to the H-level and a potential of the other one of the nodes having a lower potential to the L-level. A structure of the sense amplifier 162-0 is shown in FIG. 13.

Figure 13:
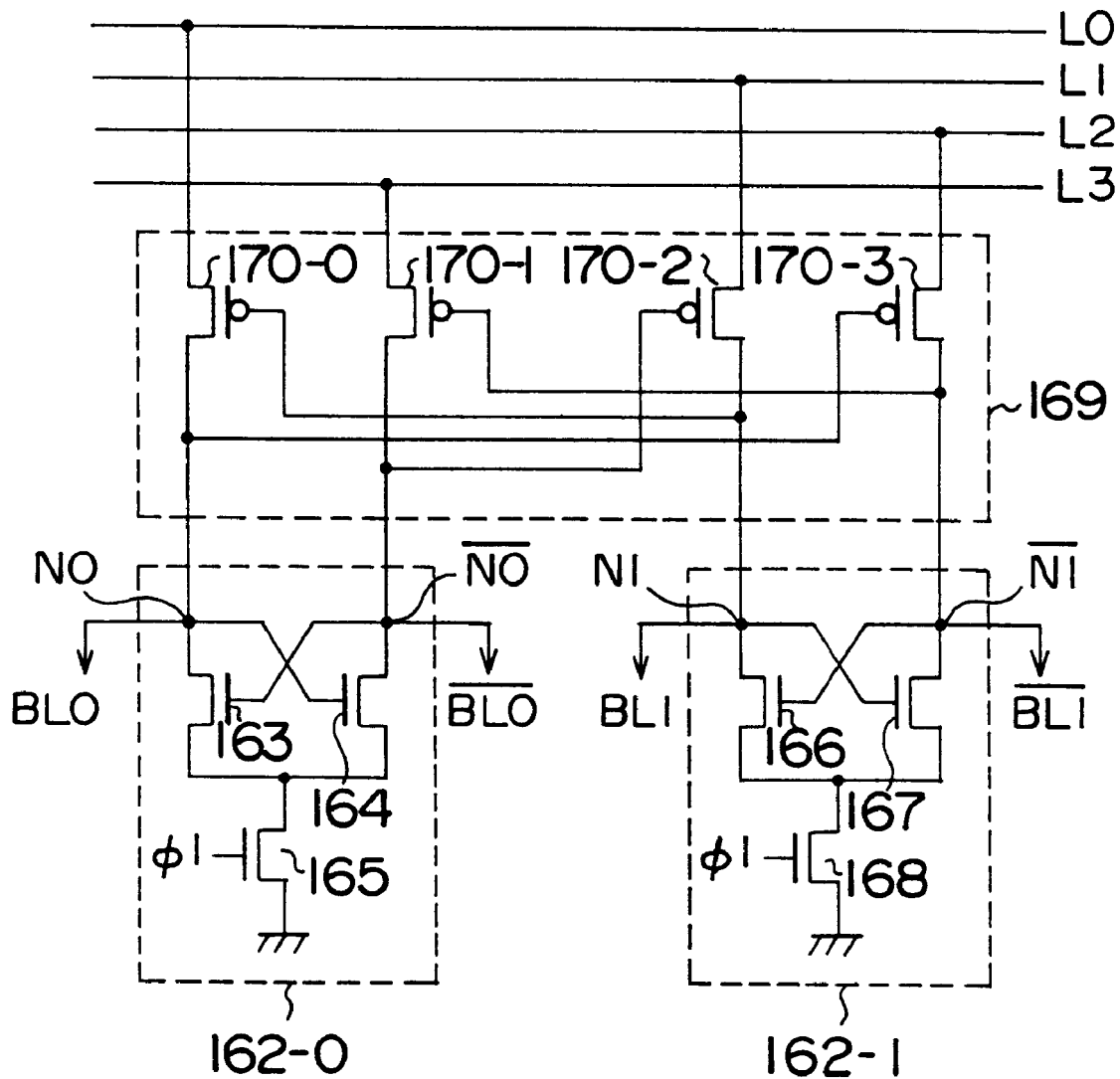
FIG. 13 is a circuit diagram of sense amplifiers shown in FIG. 12.

As shown in FIG. 13, the sense amplifier 162-0 comprises nMOS transistors 163, 164 and 165. The nMOS transistors 163 and 164 have gates which are cross connected to each other so as to perform a differential operation. An on/off operation of the nMOS transistor 165 is controlled by a latch signal φ1.

A drain of the nMOS transistor 163 is connected to the node N0. A drain of the nMOS transistor 164 is connected to the node /N0. A drain of the nMOS 165 transistor is connected to a source of each of the nMOS transistors 163 and 164. A source of the nMOS transistor 165 is grounded.

In FIG. 12, b0 and /b0 are data indicated by potentials of the nodes N0 and /N0. The data b0 indicated by the potential of the node N0 and the data /b0 indicated by the potential of the node /N0 are in a complementary relationship.

A precharge circuit 161-1 is provided for precharging a pair of nodes N1 and /N1. The pair of nodes N1 and /N1 are provided respectively to a pair of bit lines BL1 and /BL1 from which data stored in memory cells of a second block (not shown in figure) is read.

A sense amplifier 162-1 is provided for amplifying a potential difference between the nodes N1 and /N1 so as to latch the data read from the memory cells by setting a potential of one of the nodes having a higher potential to the H-level and a potential of the other one of the nodes having a lower potential to the L-level. A structure of the sense amplifier 162-1 is shown in FIG. 13.

As shown in FIG. 13, the sense amplifier 162-1 comprises nMOS transistors 166, 167 and 168. The nMOS transistors 166 and 167 have gates which are cross connected to each other so as to perform a differential operation. An on/off operation of the nMOS transistor 168 is controlled by a latch signal Φ1.

A drain of the nMOS transistor 166 is connected to the node N1. A drain of the nMOS transistor 167 is connected to the node /N1. A drain of the nMOS 168 transistor is connected to a source of each of the nMOS transistor 166 and 167. A source of the nMOS transistor 168 is grounded.

In FIG. 12, b1 and /b1 are data indicated by potentials of the nodes N1 and /N1. The data b1 indicated by the potential of the node N1 and the data /b1 indicated by the potential of the node /N1 are in a complementary relationship.

The complementary data b0 and /b0 and b1 and /b1 latched by the sense amplifier 162-0 and 162-1 are encoded by an encoder 169 so as to discharge one of the data lines L0, L1, L2 and L3 to the L-level. a structure of the encoder 169 is shown in FIG. 13.

As shown in FIG. 13, the encoder 169 comprises pMOS transistors 170-0, 170-1, 170-2 and 170-3. An on/off operation of the pMOS transistor 170-0 is controlled by a potential of the node N1, that is, the level of the data b1. An on/off operation of the pMOS transistor 170-1 is controlled by a potential of the node /N1, that is, the level of the data /b1.

An on/off operation of the pMOS transistor 170-2 is controlled by a potential of the node /N0, that is, the level of the data /b0. An on/off operation of the pMOS transistor 170-3 is controlled by a potential of the node N0, that is, the level of the data b0.

A source of the pMOS transistor 170-0 is connected to the data line L0, and a drain of the pMOS transistor 170-0 is connected to the node N0. A source of the pMOS transistor 170-1 is connected to the data line L3, and a drain of the pMOS transistor 170-1 is connected to the node /N0. A source of the pMOS transistor 170-2 is connected to the data line L1, and a drain of the pMOS transistor 170-2 is connected to the node N1. A source of the pMOS transistor 170-3 is connected to the data line L2, and a drain of the pMOS transistor 170-3 is connected to the node /N1.

Accordingly, a relationship between the logic levels of the complementary data b0, /b0 and b1, /b1 and the logic levels of the logic levels of the data lines L0, L1, L2 and L3 is represented as shown in the following Table 23.

TABLE 23

| b0 | /b0 | b1 | /b1 | L0 | L1 | L2 | L3 |
|---|---|---|---|---|---|---|---|
| L | H | L | H | L | H | H | H |
| H | L | L | H | H | L | H | H |
| L | H | H | L | H | H | L | H |
| H | L | H | L | H | H | H | L |

In the seventh embodiment of the present invention, the transceiver, which transmits the complementary data b0, /b0 and b1, /b1, is constituted by the sense amplifiers 162-0 and 162-1 and encoder 169.

Figure 14:
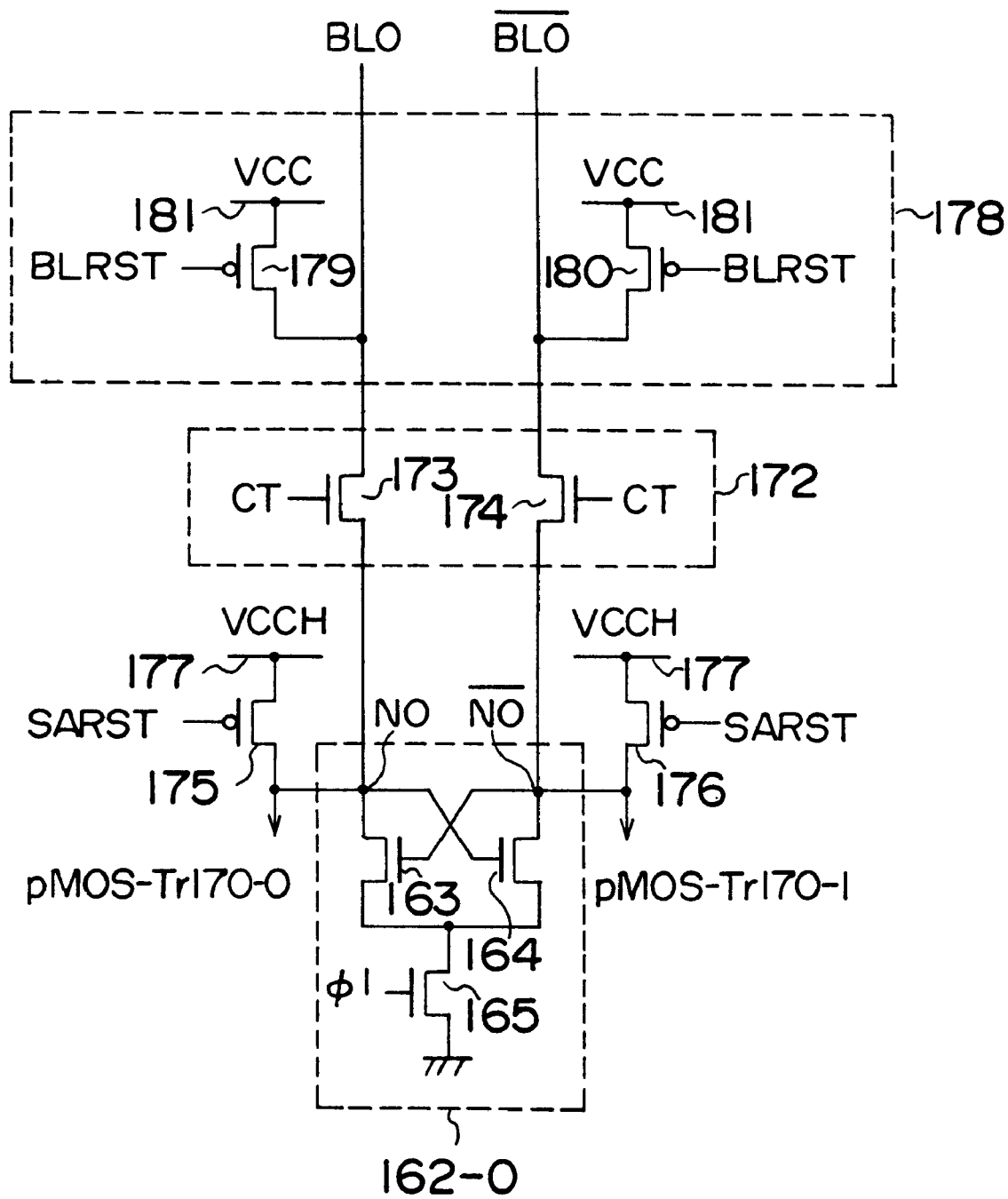
FIG. 14 is a circuit diagram of a charge transfer amplifier.

It should be noted that the sense amplifier 162-0 is connected to the bit lines BL0 and BL1 via a charge transfer amplifier when a data read operation is performed. Similarly, the sense amplifier 162-1 is connected to the bit lines BL1 and /BL1 via a charge transfer amplifier when a reading operation is performed. FIG. 14 shows a structure of the charge transfer amplifier 172 which connects the sense amplifier 162-0 to the bit lines BL0 and /BL0. A structure of the charge transfer amplifier connecting the sense amplifier 162-1 to the bit lines BL1 and /BL1 is the same as that of the charge transfer amplifier 172.

As shown in FIG. 14, the charge transfer amplifier 172 comprises nMOS transistors 173 and 174. An on/off operation of each of the nMOS transistors 173 and 174 is controlled by a charge transfer signal CT.

A drain of the nMOS transistor 173 is connected to the node N0, and a source of the nMOS transistor 173 is connected to the bit line BL0. A drain of the nMOS transistor 174 is connected to the node /N0, and a source of the nMOS transistor 174 is connected to the bit line /BL0.

pMOS transistors 175 and 176 shown in FIG. 14 constitute the precharge means 161-0 of the amplifier (shown in FIG. 12). A source of each of the pMOS transistors 175 and 176 is connected to a precharge voltage line 177 which provides a precharge voltage VCCH. The precharge voltage VCCH (for example, 1.5 volts) is greater than the power source voltage VCC (for example, 1.0 volts). An on/off operation of each of the pMOS transistor 175 and 176 is controlled by a sense amplifier reset signal SARST.

A source of the pMOS transistor 175 is connected to the precharge voltage line 177, and a drain of the pMOS transistor 175 is connected to the node N0. A source of the pMOS transistor 176 is connected to the precharge voltage line 177, and a drain of the pMOS transistor 175 is connected to the node /N0.

A bit line precharge circuit 178 is provided to the bit lines BL0 and /BL0. The bit line precharge circuit 178 comprises pMOS transistors 179 and 180. Each of the pMOS transistors 179 and 180 is connected to a precharge line 181 which provides the power source voltage VCC. An on/off operation of each of the pMOS transistors 179 and 180 is controlled by a bit line reset signal BLRST.

FIGS. 15A and 15B are waveform charts indicating operations of the charge transfer amplifier 172 and the sense amplifier 162-0. The waveform charts indicate changes in the levels of voltages of the charge transfer signal CT, the bit line reset signal BLRST, the sense amplifier activating signal (latch signal) $\phi 1$, the bit lines BL0 and /BL0, and the nodes N0 and /N0.

Referring to FIG. 12, a decoder 183, which comprises a path gate logic circuit, decodes the logic levels of the data lines L0, L1, L2 and L3 so as to regenerate the complementary data b0, /b0 and b1, /b1. The complementary data b0 and /b0 are amplified and latched by a latch circuit 184-0, and the complementary data b1 and /b1 are amplified and latched by a latch circuit 184-1. It should be noted that, in the present embodiment, the receiver for receiving the data is constituted by the decoder 183 and the latch circuits 184-0 and 184-1.

FIG. 16 is a circuit diagram of the decoder 183 and the latch circuits 184-0 and 184-1.

As shown in FIG. 16, the decoder 183 comprises pMOS transistors 186 to 193. The sense amplifier 184-0 comprises nMOS transistor 194 and 195, and the sense amplifier 184-1 comprises nMOS transistor 196 and 197. Also shown in FIG. 16 are nMOS transistors 198, 199, 200 and 201, an on/off operation of each of these nMOS transistors being controlled by a reset signal $\phi 2$.

In the decoder 183, a source of the pMOS transistors 186 is connected to a gate of the pMOS transistor 187, and a source of the pMOS transistor 187 is connected to a gate of the pMOS transistor 186. The source of the pMOS transistor 186 is also connected to the data line L3, and a drain of the pMOS transistor 186 is connected to a node N2. The source of the pMOS transistor 187 is also connected to the data line L1, and a drain of the pMOS transistor 187 is connected to the node N2.

Additionally, a source of the pMOS transistor 188 is connected to a gate of the pMOS transistor 189, and a source of the pMOS transistor 189 is connected to a gate of the pMOS transistor 188. The source of the pMOS transistor 188 is also connected to the data line L2, and a drain of the pMOS transistor 188 is connected to a node /N2. The source of the pMOS transistor 189 is also connected to the data line L0, and a drain of the pMOS transistor 189 is connected to the node /N2.

A source of the pMOS transistor 190 is connected to a gate of the pMOS transistor 191, and a source of the pMOS transistor 191 is connected to a gate of the pMOS transistor 190. The source of the pMOS transistor 190 is also connected to the data line L3, and a drain of the pMOS transistor 190 is connected to a node N3. The source of the pMOS transistor 191 is also connected to the data line L2, and a drain of the pMOS transistor 191 is connected to the node N3.

Additionally, a source of the pMOS transistor 192 is connected to a gate of the pMOS transistor 193, and a source of the pMOS transistor 193 is connected to a gate of the pMOS transistor 192. The source of the pMOS transistor 192 is also connected to the data line L1, and a drain of the pMOS transistor 192 is connected to a node /N3. The source of the pMOS transistor 193 is also connected to the data line L0, and a drain of the pMOS transistor 193 is connected to the node /N3.

In the sense amplifier 184-0, a drain of the nMOS transistor 194 is connected to a gate of the nMOS transistor 195, and a drain of the nMOS transistor 195 is connected to a gate of the nMOS transistor 194. The drain of the nMOS transistor 194 is connected to the node N2, and a source of the nMOS transistor 194 is grounded. The drain of the nMOS transistor 195 is connected to the node /N2, and a source of the nMOS transistor 195 is grounded.

In the sense amplifier 184-1, a drain of the nMOS transistor 196 is connected to a gate of the nMOS transistor 197, and a drain of the nMOS transistor 197 is connected to a gate of the nMOS transistor 196. The drain of the nMOS transistor 196 is connected to the node N3, and a source of the nMOS transistor 196 is grounded. The drain of the nMOS transistor 197 is connected to the node /N3, and a source of the nMOS transistor 197 is grounded.

Additionally, a drain of the nMOS transistor 198 is connected to the node N2, and a source of the nMOS transistor 198 is grounded. A drain of the nMOS transistor 199 is connected to the node /N2, and a source of the nMOS transistor 199 is grounded.

Similarly, a drain of the nMOS transistor 200 is connected to the node N3, and a source of the nMOS transistor 200 is grounded. A drain of the nMOS transistor 201 is connected to the node /N3, and a source of the nMOS transistor 201 is grounded.

Before the data is transmitted, the reset signal φ2 is set to the H-level and the nMOS transistors 198, 199, 200 and 201 are turned on. Thus, the nodes N2, /N2, N3 and /N3 are reset to zero volts. When the data is latched, the reset signal φ2 is set to the L-level and the nMOS transistors 198, 199, 200 and 201 are turned off.

Accordingly, the complementary data b0 and /b0 appear at the nodes N2 and /N2, respectively, and the complementary data b1 and /b1 appear at the nodes N3 and /N3, respectively.

A relationship between the logic levels of the data lines L0, L1, L2 and L3 and the regenerated complementary data b0, /b0 and b1, /b1 is represented by the following Table 24.

TABLE 24

| L0 | L1 | L2 | L3 | b0 | /b0 | b1 | /b1 |
|----|----|----|----|----|----|----|----|
| L  | H  | H  | H  | L  | H  | L  | H  |
| H  | L  | H  | H  | H  | L  | L  | H  |
| H  | H  | L  | H  | L  | H  | H  | L  |
| H  | H  | H  | L  | H  | L  | H  | L  |

According to the present embodiment, the complementary data b0, /b0 and b1, /b1 which represents 2-bit data can be transmitted by discharging one of the data lines L0, L1, L2 and L3 which are precharged to the power source voltage VCC. Thus, power consumption of the data lines L0, L1, L2 and L3 can be reduced.

Additionally, in the present embodiment, since the encoder 196 comprises a path gate logic circuit, the power consumption is further reduced and a number of transistors included in the encoder 169 can be reduced, which results in a reduction in an area of patterns and a reduction in a delay of transmission of the data.

Additionally, during a precharge period for the nodes N0, /N0, N1 and /N1, the nodes N0, /N0, N1 and /N1 are electrically disconnected from the respective data lines L0, L1, L2 and L3, and the sense amplifiers 162-0 and 162-1 are activated by the sense amplifier activating signal φ1. Thus, when the data is latched, the corresponding data line can be automatically discharged without other timing signals. Accordingly, a delay in the timing of discharge of the data lines can be prevented, and a high-speed data transmission can be achieved. Additionally, a charge and discharge current for generating a timing signal can be eliminated, and thus, the power consumption can be further reduced.

Figure 17:
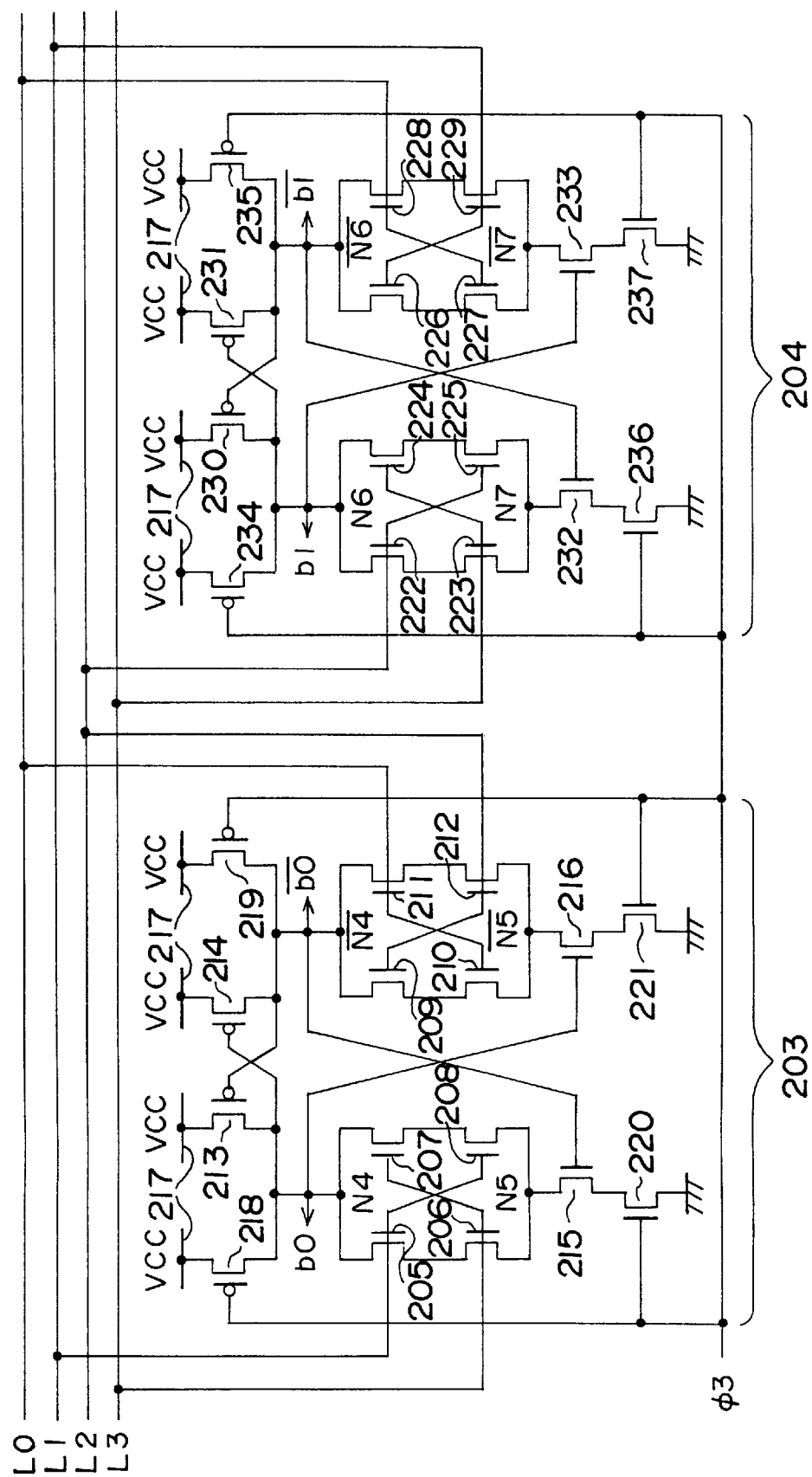
FIG. 17 is a circuit diagram of a receiver which can be used in the seventh embodiment of the present invention.

It should be noted that, in the present embodiment, the receiver comprising the decoder 183 and the latch circuits 184-0 and 184-1 may be replaced by a receiver shown in FIG. 17.

In FIG. 17, a decoder 203 decodes the levels of the data lines L0, L1, L2 and L3 so as to regenerate the complementary data b0 and /b0, and a decoder 204 decodes the levels of the data lines L0, L1, L2 and L3 so as to regenerate the complementary data b1 and /b1.

In the decoder 203, nMOS transistors 205, 206, 207 and 208 constitute an analog multiplying circuit. The nMOS transistors 205 and 206 are connected by a totem pole type connection. A drain of the nMOS transistor 205 is connected to a node N4, and a gate of the nMOS transistor 205 is connected to the data line L1. A gate of the nMOS transistor 206 is connected to the data line L3, and a source of the nMOS transistor 206 is connected to a node N5.

Additionally, the nMOS transistors 207 and 208 are connected by a totem pole type connection. A drain of the nMOS transistor 207 is connected to the node N4, and a gate of the nMOS transistor 207 is connected to the data line L3. A gate of the nMOS transistor 208 is connected to the data line L1, and a source of the nMOS transistor 208 is connected to the node N5.

Similarly, in the decoder 203, nMOS transistors 209, 210, 211 and 212 constitute an analog multiplying circuit. The nMOS transistors 209 and 210 are connected by a totem pole type connection. A drain of the nMOS transistor 209 is connected to a node /N4, and a gate of the nMOS transistor 209 is connected to the data line L2. A gate of the nMOS transistor 210 is connected to the data line L0, and a source of the nMOS transistor 210 is connected to a node /N5.

Additionally, the nMOS transistors 211 and 212 are connected by a totem pole type connection. A drain of the nMOS transistor 211 is connected to the node /N4, and a gate of the nMOS transistor 211 is connected to the data line L0. A gate of the nMOS transistor 212 is connected to the data line L2, and a source of the nMOS transistor 212 is connected to the node /N5.

In FIG. 17, a latch circuit is constituted by pMOS transistors 213 and 214 and nMOS transistors 215 and 216. A source of the pMOS transistor 213 is connected to a VCC power source line 217, a gate of the pMOS transistor 213 is connected to the node /N4, and a drain of the pMOS transistor 213 is connected to the node N4. A source of the pMOS transistor 214 is connected to the VCC power source line 217, a gate of the pMOS transistor 214 is connected to the node N4, and a drain of the pMOS transistor 214 is connected to the node /N4. Additionally, a drain of the nMOS transistor 215 is connected to the node N5, and a gate of the nMOS transistor 215 is connected to the node /N4. A drain of the nMOS transistor 216 is connected to the node /N5 and a gate of the nMOS transistor 216 is connected to the node N4.

In the decoder 203, a reset circuit is constituted by pMOS transistors 218 and 219 and nMOS transistors 220 and 221. A source of the pMOS transistor 218 is connected to the VCC power source line 217, and a drain of the pMOS transistor 218 is connected to the node N4. An on/off operation of the pMOS transistor 218 is controlled by a reset signal φ3. Similarly, a source of the pMOS transistor 219 is connected to the VCC power source line 217, and a drain of the pMOS transistor 219 is connected to the node /N4. An on/off operation of the pMOS transistor 219 is controlled by the reset signal φ3.

A source of the nMOS transistor 215 is connected to a drain of the nMOS transistor 220, and a source of the nMOS transistor 220 is grounded. An on/off operation of the nMOS transistor 220 is controlled by the reset signal φ3. Similarly, a source of the nMOS transistor 216 is connected to a drain of the nMOS transistor 221, and a source of the nMOS transistor 221 is grounded. An on/off operation of the nMOS transistor 221 is controlled by the reset signal φ3.

In the decoder 204, nMOS transistors 222, 223, 224 and 225 constitute an analog multiplying circuit. The nMOS transistors 222 and 223 are connected by a totem pole type connection. A drain of the nMOS transistor 222 is connected to a node N6, and a gate of the nMOS transistor 222 is connected to the data line L2. A gate of the nMOS transistor 223 is connected to the data line L3, and a source of the nMOS transistor 223 is connected to a node N7.

Additionally, the nMOS transistors 224 and 225 are connected by a totem pole type connection. A drain of the nMOS transistor 224 is connected to the node N6, and a gate of the nMOS transistor 224 is connected to the data line L3. A gate of the nMOS transistor 225 is connected to the data line L2, and a source of the nMOS transistor 225 is connected to the node N7.

Similarly, in the decoder 204, nMOS transistors 226, 227, 228 and 229 constitute an analog multiplying circuit. The nMOS transistors 226 and 227 are connected by a totem pole type connection. A drain of the nMOS transistor 226 is connected to a node /N6, and a gate of the nMOS transistor 226 is connected to the data line L1. A gate of the nMOS transistor 227 is connected to the data line L0, and a source of the nMOS transistor 227 is connected to a node /N7.

Additionally, the nMOS transistors 228 and 229 are connected by a totem pole type connection. A drain of the nMOS transistor 228 is connected to the node /N6, and a gate of the nMOS transistor 228 is connected to the data line L0. A gate of the nMOS transistor 229 is connected to the data line L1, and a source of the nMOS transistor 229 is connected to the node /N7.

In FIG. 17, a latch circuit is constituted by pMOS transistors 230 and 231 and nMOS transistors 232 and 233. A source of the pMOS transistor 230 is connected to the VCC power source line 217, and a gate of the pMOS transistor 230 is connected to the node /N6, and a drain of the pMOS transistor 230 is connected to the node N6. A source of the pMOS transistor 231 is connected to the VCC power source line 217, a gate of the pMOS transistor 231 is connected to the node N6, and a drain of the pMOS transistor 231 is connected to the node /N6. Additionally, a drain of the nMOS transistor 232 is connected to the node N7, and a gate of the nMOS transistor 232 is connected to the node /N6. A drain of the nMOS transistor 233 is connected to the node /N7 and a gate of the nMOS transistor 233 is connected to the node N6.

In the decoder 204, a reset circuit is constituted by pMOS transistors 234 and 235 and nMOS transistors 236 and 237. A source of the pMOS transistor 234 is connected to the VCC power source line 217, and a drain of the pMOS transistor 234 is connected to the node N6. An on/off operation of the pMOS transistor 234 is controlled by the reset signal φ3. Similarly, a source of the pMOS transistor 235 is connected to the VCC power source line 217, and a drain of the pMOS transistor 235 is connected to the node /N6. An on/off operation of the pMOS transistor 235 is controlled by the reset signal φ3.

A source of the nMOS transistor 232 is connected to a drain of the nMOS transistor 236, and a source of the nMOS transistor 236 is grounded. An on/off operation of the nMOS transistor 236 is controlled by the reset signal φ3. Similarly, a source of the nMOS transistor 233 is connected to a drain of the nMOS transistor 237, and a source of the nMOS transistor 237 is grounded. An on/off operation of the nMOS transistor 237 is controlled by the reset signal φ3.

A relationship between the logic levels of the data lines L0, L1, L2 and L3 and the regenerated complementary data b0, /b0 and b1, /b1 is represented by the following Table 25.

TABLE 25

| L0 | L1 | L2 | L3 | b0 | /b0 | b1 | /b1 |
|----|----|----|----|----|-----|----|-----|
| L  | H  | H  | H  | L  | H   | L  | H   |
| H  | L  | H  | H  | H  | L   | L  | H   |
| H  | H  | L  | H  | L  | H   | H  | L   |
| H  | H  | H  | L  | H  | L   | H  | L   |

As shown in the above Table 25, when the data line L0 is at the L-level and the data lines L1, L2 and L3 are at the H-level, the nMOS transistors 205, 206, 207 and 208 are turned on, the nMOS transistors 210 and 211 are turned off, the nMOS transistors 222, 223, 224 and 225 are turned on, and the nMOS transistors 227 and 228 are turned off.

As a result, a potential of the node N4 becomes lower than a potential of the node /N4, a potential of the node N6 becomes lower than a potential of the node /N6, the complementary data b0 is set to the L-level, the complementary data /b0 is set to the H-level, the complementary data b1 is set to the L-level, and the complementary data /b1 is set to the H-level.

Additionally, when the data line L1 is at the L-level and the data lines L0, L2 and L3 are at the H-level, the nMOS transistors 205 and 208 are turned off, the nMOS transistors 209, 210, 211 and 212 are turned on, the nMOS transistors 222, 223, 224 and 225 are turned on, and the nMOS transistors 226 and 229 are turned off.

As a result, a potential of the node N4 becomes higher than a potential of the node /N4, a potential of the node N6 becomes lower than a potential of the node /N6, the complementary data b0 is set to the H-level, the complementary data /b0 is set to the L-level, the complementary data b1 is set to the L-level, and the complementary data /b1 is set to the H-level.

Additionally, when the data line L2 is at the L-level and the data lines L0, L1 and L3 are at the H-level, the nMOS transistors 205, 206, 207 and 208 are turned on, nMOS transistors 209 and 212 are turned off, the nMOS transistors 222 and 225 are turned off, and the nMOS transistors 226, 227, 228 and 229 are turned on.

As a result, a potential of the node N4 becomes lower than a potential of the node /N4, a potential of the node N6 becomes higher than a potential of the node /N6, the complementary data b0 is set to the L-level, the complementary data /b0 is set to the H-level, the complementary data b1 is set to the H-level, and the complementary data /b1 is set to the L-level.

Additionally, when the data line L3 is at the L-level and the data lines L0, L1 and L2 are at the H-level, the nMOS transistors 206 and 207 are turned off, the nMOS transistors 209, 210, 211 and 212 are turned on, the nMOS transistors 223 and 224 are turned off, and the nMOS transistors 226, 227, 228 and 229 are turned on.

As a result, a potential of the node N4 becomes higher than a potential of the node /N4, a potential of the node N6 becomes higher than a potential of the node /N6, the complementary data b0 is set to the H-level, the complementary data /b0 is set to the L-level, the complementary data b1 is set to the H-level, and the complementary data /b1 is set to the L-level.

As mentioned above, when the receiver shown in FIG. 17 is used, the potentials of the data lines L0, L1, L2 and L3 can be decoded even when the discharge potential of the data lines L0, L1, L2 and L3 is in a middle level and an amplitude of a change in the potential of the data line being driven is small. Accordingly, a high-speed data transmission can be achieved.

Figure 18:
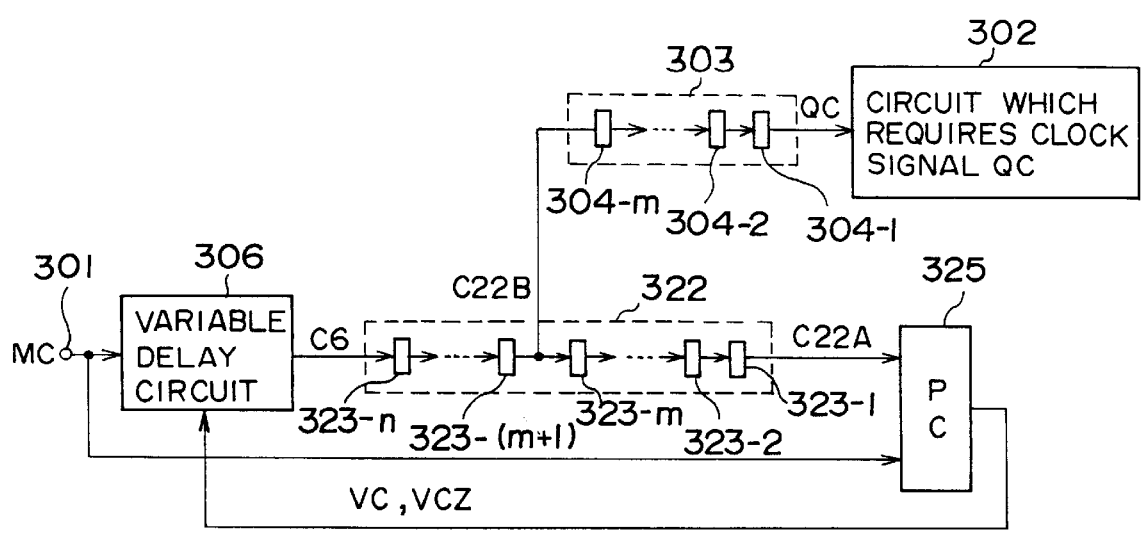
FIG. 18 is a block diagram of a part of a semiconductor integrated circuit according to an eighth embodiment of the present invention.

A description will now be given of an eighth embodiment according to the present invention. FIG. 18 is a block diagram of a part of a semiconductor integrated circuit according to the eighth embodiment of the present invention.

In FIG. 18, a main clock signal MC is input to a main clock terminal 301. The reference numeral 302 indicates a circuit which requires a clock signal QC having a phase the same as that of the main clock signal. The clock signal QC is generated from the main clock signal by delaying one period.

A clock transmission circuit 303 supplies the clock signal QC to the circuit 302 which requires the clock signal QC. The clock transmission circuit 303 comprises gate circuits (for example, CMOS inverters) 304-1, 304-2, 304-3, . . . , 304-m each of which provides a delay time TA. A main clock signal is delayed by a variable delay circuit 306 which is constructed as a circuit shown in FIG. 19, FIG. 20 or FIG. 36.

Figure 19:
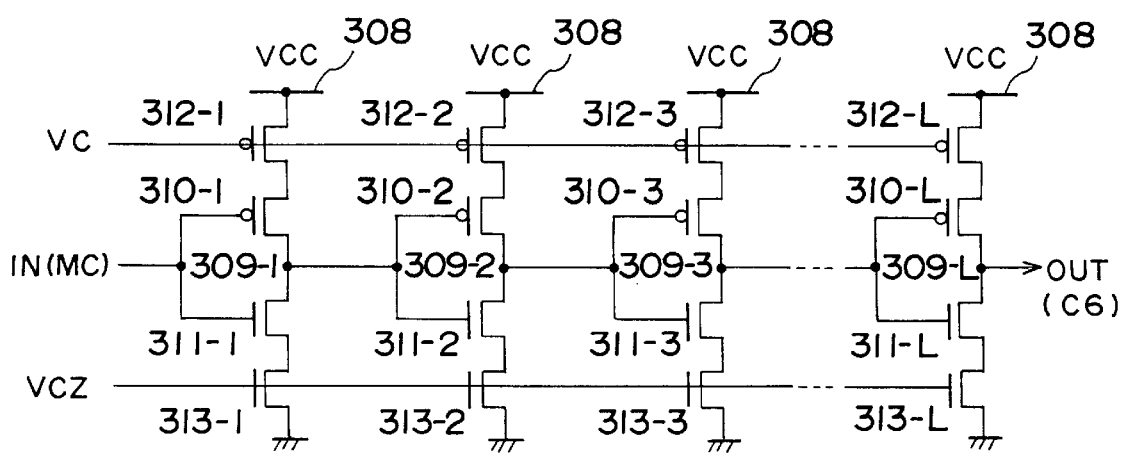
FIG. 19 is a circuit diagram of an example of a variable delay circuit shown in FIG. 18.

In FIG. 19, the variable delay circuit 306 comprises a VCC power source line 308, CMOS inverters 309-1, 309-2, 309-3, . . . , 309-L, pMOS transistors 310-1, 310-2, 310-3, . . . , 310-L, nMOS transistors 311-1, 311-2, 311-3, . . . , 311-L, pMOS transistors 312-1, 312-2, 312-3, . . . , 312-L and nMOS transistors 313-1, 313-2, 313-3, . . . , 313-L. The VCC power source line 308 supplies a power source voltage VCC. Each of the pMOS transistors 312-1, 312-2, 312-3, . . . , 312-L serves as a variable resistor element to which a delay time control voltage VC is provided at a gate thereof. Each of the nMOS transistors 313-1, 313-2, 313-3, . . . , 313-L serves as a variable resistor element to which a delay time control voltage VCZ is provided at a gate thereof.

Figure 20:
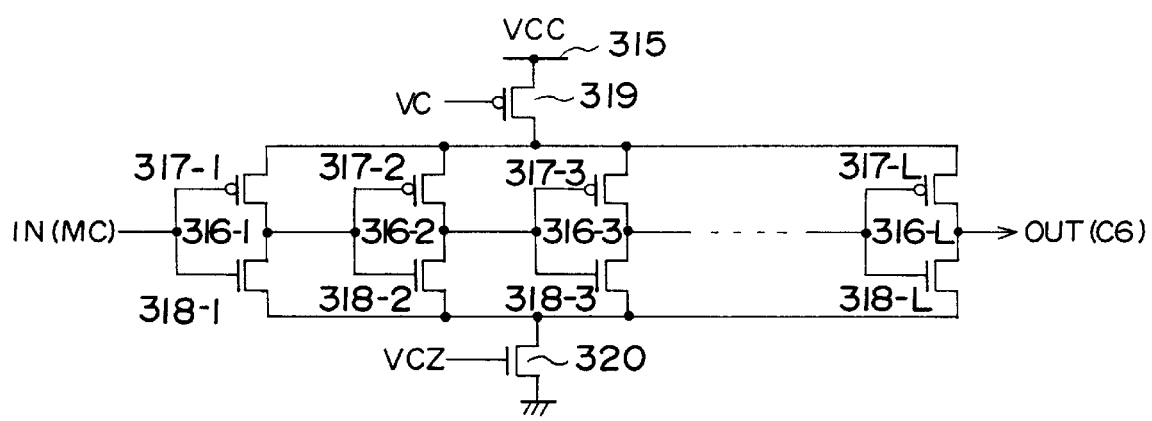
FIG. 20 is a circuit diagram of another example of the variable delay circuit shown in FIG. 18.

In FIG. 20, the variable delay circuit 306 comprises a VCC power source line 315, CMOS inverters 316-1, 316-2, 316-3, . . . , 316-L, pMOS transistors 317-1, 317-2, 317-3, . . . , 317-L, nMOS transistors 318-1, 318-2, 318-3, . . . , 318-L, a pMOS transistor 319 and an nMOS transistor 320. The pMOS transistor 319 serves as a variable resistor element to which a delay time control voltage VC is provided at a gate thereof. The nMOS transistor 320 serves as a variable resistor element to which a delay time control voltage VCZ is provided at a gate thereof.

Referring to FIG. 18, a fixed delay circuit 322, which delays an output C6 of the variable delay circuit 306, comprises gate circuits 323-1, 323-2, 323-3, . . . , 323-m, 323-(m+1), . . . , 323-n. Each of the gate circuits 323-1, 323-2, 323-3, . . . , 323-m, 323-(m+1), . . . , 323-n provides a delay time TA. A phase comparator (PC) 325 controls the variable delay circuit 306 by comparing a phase of the main clock signal MC with a phase of an output C22A of the final stage gate circuit 323-1 of the fixed delay circuit 322 so as to supply the delay time control voltages VC and VCZ to the variable delay circuit 306 so that a phase of the output C22A conforms to the phase of the main clock signal. In this embodiment, a delay locked loop circuit (DLL circuit) is constituted by the variable delay circuit 306, the fixed delay circuit 322 and the phase comparator 325.

In the fixed delay circuit 322, an output terminal of the gate circuit 323-(m+1), which is the (n−m)th gate circuit, is connected to an input terminal of the gate circuit 304-m which is the first stage gate circuit of the clock transmission circuit 303. Accordingly, a clock signal C22B output from the gate circuit 323-(m+1) of the fixed delay circuit 322 is supplied to the first stage gate circuit 304-m of the clock transmission circuit 303.

Figure 21:
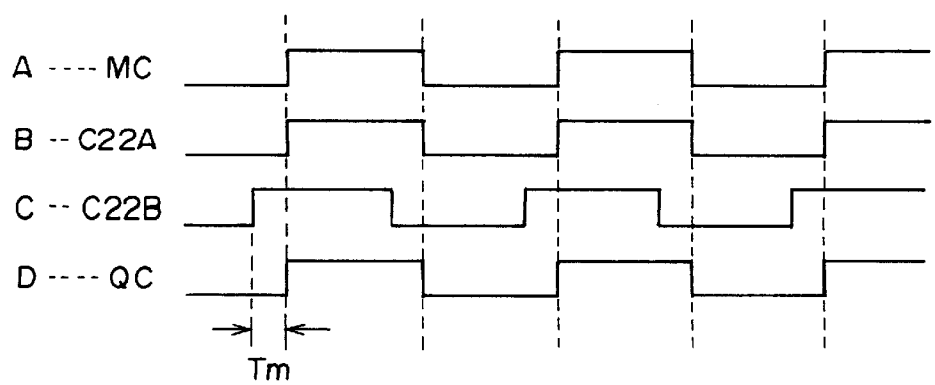
FIG. 21 is a waveform chart for explaining an operation of the circuit shown in FIG. 18.

FIG. 21 is a waveform chart for explaining an operation of the circuit shown in FIG. 18. FIG. 21-A indicates the main clock signal MC; FIG. 21-B indicates the clock signal C22A output from the final stage gate circuit 323-1 of the fixed delay circuit 322; FIG. 21-C indicates the clock signal C22B output from the (n−m)th gate circuit 323-(m+1) of the fixed delay circuit 322; and FIG. 21-D indicates the clock signal QC output from the clock transmission circuit 303.

As shown in FIG. 21, in the present embodiment, the clock signal C22A output from the final stage gate circuit 323-1 of the fixed delay circuit 322 is controlled to be in the same phase with the main clock signal MC. Accordingly, a phase of the clock signal C22B, which is output from the (n−m)th gate circuit 323-(m+1) of the fixed delay circuit 322, is in advance of the phase of the clock signal C22A, which is output from the final stage gate circuit 323-1 of the fixed delay circuit 322, by a delay time Tm which is a total of the delay time of the gate circuits 323-1 to 323-m.

Since the number of stages of the gate circuits 304-1 to 304-m of the clock transmission circuit 303 is m and the number of stages of the gate circuits 323-1 to 323-m is also m, the clock signal C22B, which is output from the (n−m)th gate circuit 323-(m+1), is subjected to a delay time of Tm by the clock transmission circuit 303. Thus, the clock signal QC output from the clock transmission circuit 303 has a phase the same as the phase of the main clock signal MC.

Accordingly, in the eighth embodiment of the present invention, the clock signal QC, which is generated by delaying the main clock MC and has the same phase as the main signal MC, can be provided to the circuit 302 which requires a clock signal having the same phase as the main signal MC irrespective of a process condition, a temperature change or a level of the power source voltage.

Figure 22:
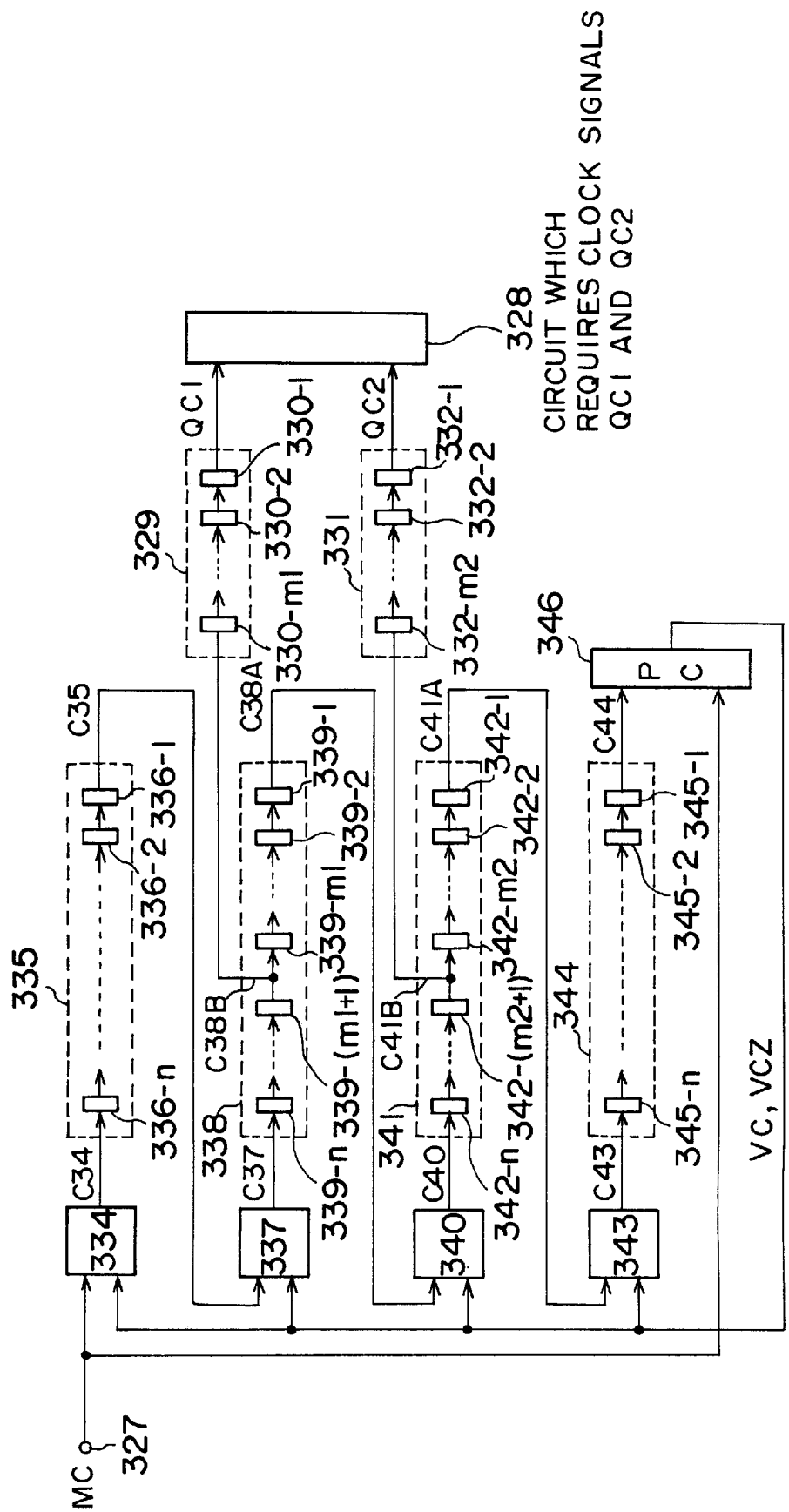
FIG. 22 is a circuit diagram of a part of a semiconductor integrated circuit according to a ninth embodiment of the present invention.

A description will now be given, with respect to FIGS. 22 and 23, of a ninth embodiment of the present invention. FIG. 22 is a circuit diagram of a part of a semiconductor integrated circuit according to the ninth embodiment of the present invention. In FIG. 22, the main clock MC is input to a main clock input terminal 327. A clock signal QC1 and a clock signal QC2 are supplied to a circuit 328 which requires these signals. The clock signal QC1 is generated by delaying a phase of the main clock signal MC by 180 degrees. The clock signal QC2 is generated by delaying a phase of the main clock signal MC by 270 degrees.

The clock signal QC1 is supplied to the circuit 328 from a clock transmission circuit 329 which comprises gate circuits (for example, CMOS inverters) 330-1, 330-2, 330-3, . . . and 330-m1. Each of the gate circuits 330-1, 330-2, 330-3, . . . , 330-m1 provides a delay time TA. The clock signal QC2 is supplied to the circuit 328 from a clock transmission circuit 331 which comprises gate circuits (for example, CMOS inverters) 332-1, 332-2, 332-3, . . . , 332-m2. Each of the gate circuits 332-1, 332-2, 332-3, . . . , 332-m2 provides a delay time TA.

Figure 36:
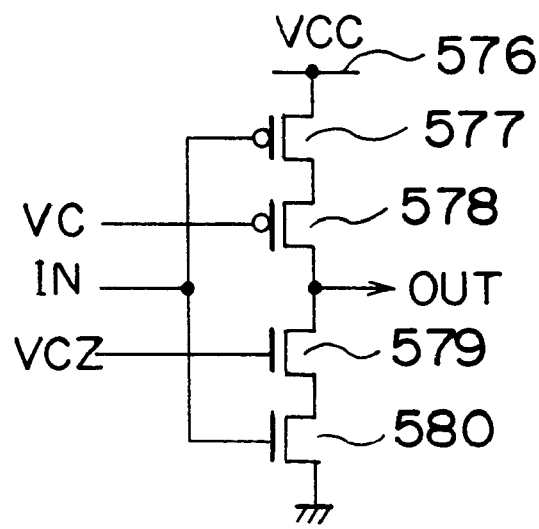
FIG. 36 is a circuit diagram of a variable delay inverter shown in FIG. 35.

A variable delay circuit 334 delays the main clock signal MC which can be constructed, for example, similar to the circuit shown in FIGS. 19, 20 or 36. A clock signal C34 output from the variable delay circuit 334 is delayed by a fixed delay circuit 335. The fixed delay circuit 335 comprises gate circuits (for example, CMOS inverters) 336-1, 336-2, . . . , 336-n each of which provides a delay time TA.

A variable delay circuit 337 delays a clock signal C35 which is output from the fixed delay circuit 335. The variable delay circuit 337 has a circuit structure the same as the circuit structure of the variable delay circuit 334. A clock signal C37 output from the variable delay circuit 337 is delayed by a fixed delay circuit 338 which has a circuit structure the same as the circuit structure of the fixed delay circuit 335. The fixed delay circuit 338 comprises gate circuits 339-1, 339-2, . . . 339-m1, 339-(m1+1), . . . , 339-n each of which provides a delay time TA.

Additionally, a variable delay circuit 340 delays a clock signal C38A which is output from the final stage gate circuit 339-1 of the fixed delay circuit 338. The variable delay circuit 340 has a circuit structure the same as the circuit structure of the variable delay circuit 334. A clock signal C40 output from the variable delay circuit 340 is delayed by a fixed delay circuit 341 which has a circuit structure the same as the circuit structure of the fixed delay circuit 335. The fixed delay circuit 341 comprises gate circuits 342-1, 342-2, . . . , 342-m2, 342-(m2+1), . . . , 342-n each of which provides a delay time TA.

Additionally, a variable delay circuit 343 delays a clock signal C41A which is output from the final stage gate circuit 342-1 of the fixed delay circuit 341. The variable delay circuit 343 has a circuit structure the same as the circuit structure of the variable delay circuit 334. A clock signal C43 output from the variable delay circuit 343 is delayed by a fixed delay circuit 344 which has a circuit structure the same as the circuit structure of the fixed delay circuit 335. The fixed delay circuit 344 comprises gate circuits 345-1, 345-2, . . . , 345-n each of which provides a delay time TA.

As mentioned above, in the ninth embodiment of the present invention, a delay circuit which delays the main clock signal MC is constituted by a first circuit unit comprising the variable delay circuit 334 and the fixed delay circuit 335, a second circuit unit comprising the variable delay circuit 337 and the fixed delay circuit 338, a third circuit unit comprising the variable delay circuit 340 and the fixed delay circuit 341 and a fourth circuit unit comprising the variable delay circuit 343 and the fixed delay circuit 344, the first to fourth circuit units being connected in series.

Additionally, a phase comparator (PC) 346 controls the variable delay circuits 334, 337, 340 and 343 by comparing a phase of the main clock MC with a phase of a clock signal C44 output from the final stage gate circuit 345-1 of the fixed delay circuit 344 so as to supply the delay time control voltages VC and VCZ to the variable delay circuits 334, 337, 340 and 343 so that a phase of the clock signal C44 conforms to the phase of the main clock signal MC. In this embodiment, a delay locked loop circuit is constituted by the variable delay circuits 334, 337, 340 and 343, the fixed delay circuits 335, 338, 341 and 344, and the phase comparator 346.

Additionally, an output terminal of the gate circuit 339-(m1+1), which is the (n−m1)th gate circuit, is connected to an input terminal of the gate circuit 330-m1 which is the first stage gate circuit of the clock transmission circuit 329. Accordingly, a clock signal C38B which is output from the gate circuit 339-(m1+1) of the fixed delay circuit 338 is supplied to the first stage gate circuit 330-m1 of the clock transmission circuit 329.

Further, an output terminal of the gate circuit 342-(m2+1), which is the (n−m2)th gate circuit, is connected to an input terminal of the gate circuit 332-m2 which is the first stage gate circuit of the clock transmission circuit 331. Accordingly, a clock signal C41B which is output from the gate circuit 342-(m2+1) of the fixed delay circuit 341 is supplied to the first stage gate circuit 332-m2 of the clock transmission circuit 331.

Figure 23:
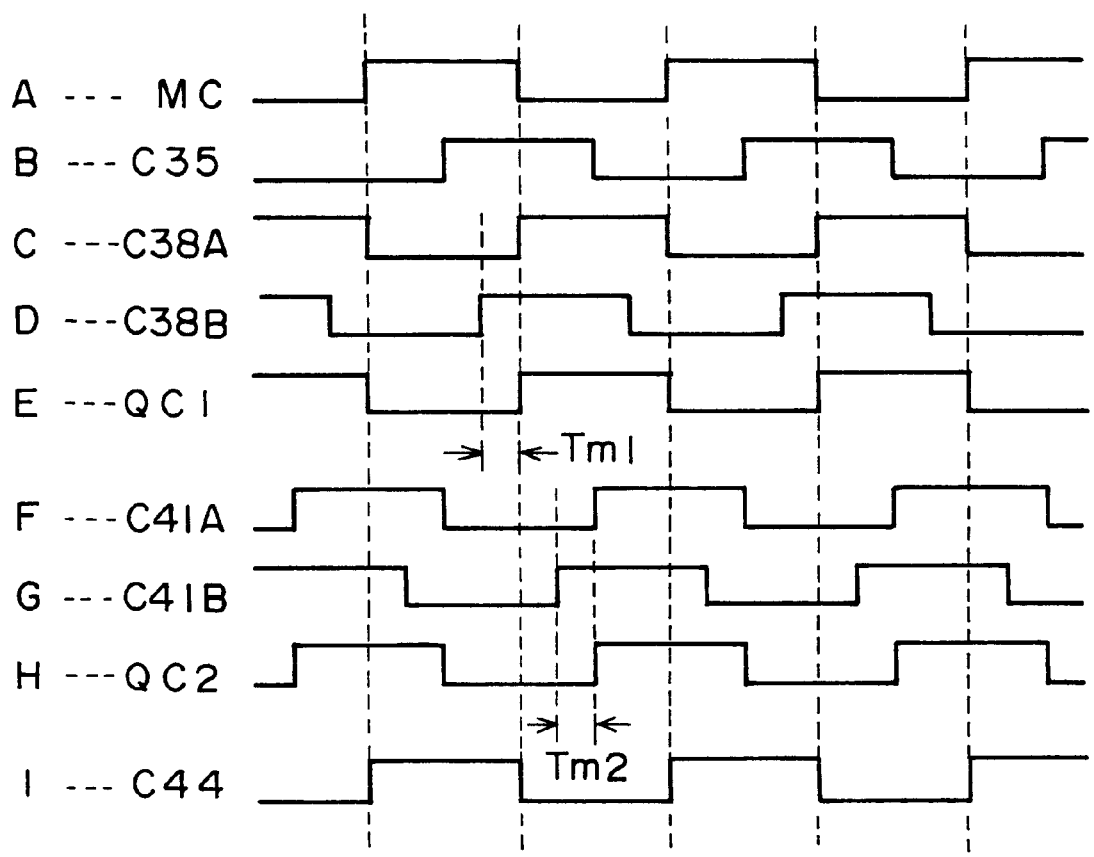
FIG. 23 is a waveform chart for explaining an operation of the semiconductor integrated circuit shown in FIG. 22.

FIG. 23 is a waveform chart for explaining an operation of the circuit shown in FIG. 22. FIG. 23-A indicates the main clock signal MC; FIG. 23-B indicates the clock signal C35 which is output from the fixed delay circuit 335; FIG. 23-C indicates the clock signal C38A which is output from the final stage gate circuit 339-1 of the fixed delay circuit 338; FIG. 23-D indicates the clock signal C38B which is output from the (n−m1)th gate circuit 339-(m1+1) of the fixed delay circuit 338; and FIG. 23-E indicates the clock signal QC1 which is output from the clock transmission circuit 329. Additionally, FIG. 23-F indicates the clock signal C41A which is output from the final stage gate circuit 342-1 of the fixed delay circuit 341; FIG. 23-G indicates the clock signal C41B which is output from the (n−m2)th gate circuit 342-(m2+1) of the fixed delay circuit 341; FIG. 23-H indicates the clock signal QC2 which is output from the clock transmission circuit 331; and FIG. 23-I indicates the clock signal C44 which is output from the fixed delay circuit 344.

In the present embodiment, each of the variable delay circuits 334, 337, 340 and 343 has an identical circuit structure, and each of the fixed delay circuits 335, 338, 341 and 344 also has an identical circuit structure.

Accordingly, a phase of the clock signal C35 which is output from the fixed delay circuit 335 is delayed by 90 degrees from the phase of the main clock signal MC; a phase of the clock signal C38A which is output from the final stage gate circuit 339-1 of the fixed delay circuit 335 is delayed by 180 degrees from the phase of the main clock signal MC; a phase of the clock signal C41A which is output from the final stage gate circuit 342-1 of the fixed delay circuit 341 is delayed by 270 degrees from the phase of the main clock signal MC; and a phase of the clock signal C44 is equal to the phase of the main clock signal MC.

As a result, a phase of the clock signal C38B, which is output from the (n−m1)th gate circuit 339-(m1+1) of the fixed delay circuit 338, is in advance of a phase of the clock signal C38A, which is output from the final stage gate circuit 339-1 of the fixed delay circuit 338, by a delay time Tm1 which is a total of the delay time of the gate circuits 339-1 to 339-m1.

Since the number of stages of the gate circuits 330-1 to 330-m1 of the clock transmission circuit 329 is m1 and the number of stages of the gate circuits 339-1 to 339-m1 is also m1, the clock signal QC1 which is output from the clock transmission circuit 329 has a phase delayed by 180 degrees from the phase of the main clock signal MC.

Additionally, a phase of the clock signal C41B, which is output from the (n−m2)th gate circuit 342-(m2+1) of the fixed delay circuit 341, is in advance of a phase of the clock signal C41A, which is output from the final stage gate circuit 342-1 of the fixed delay circuit 341, by a delay time Tm2 which is a total of the delay time of the gate circuits 342-1 to 342-m2.

Since the number of stages of the gate circuits 332-1 to 332-m2 of the clock transmission circuit 331 is m2 and the number of stages of the gate circuits 342-1 to 342-m2 is also m2, the clock signal QC2 which is output from the clock transmission circuit 331 has a phase delayed by 270 degrees from the phase of the main clock signal MC.

Accordingly, in the ninth embodiment of the present invention, the clock signal QC1, which is generated by delaying the main clock signal MC and has the phase delayed by 180 degrees, and the clock signal QC2, which is generated by delaying the main clock signal MC and has the phase delayed by 270 degrees, can be provided to the circuit 328 irrespective of a process condition, a temperature change or a level of the power source voltage.

Figure 24:
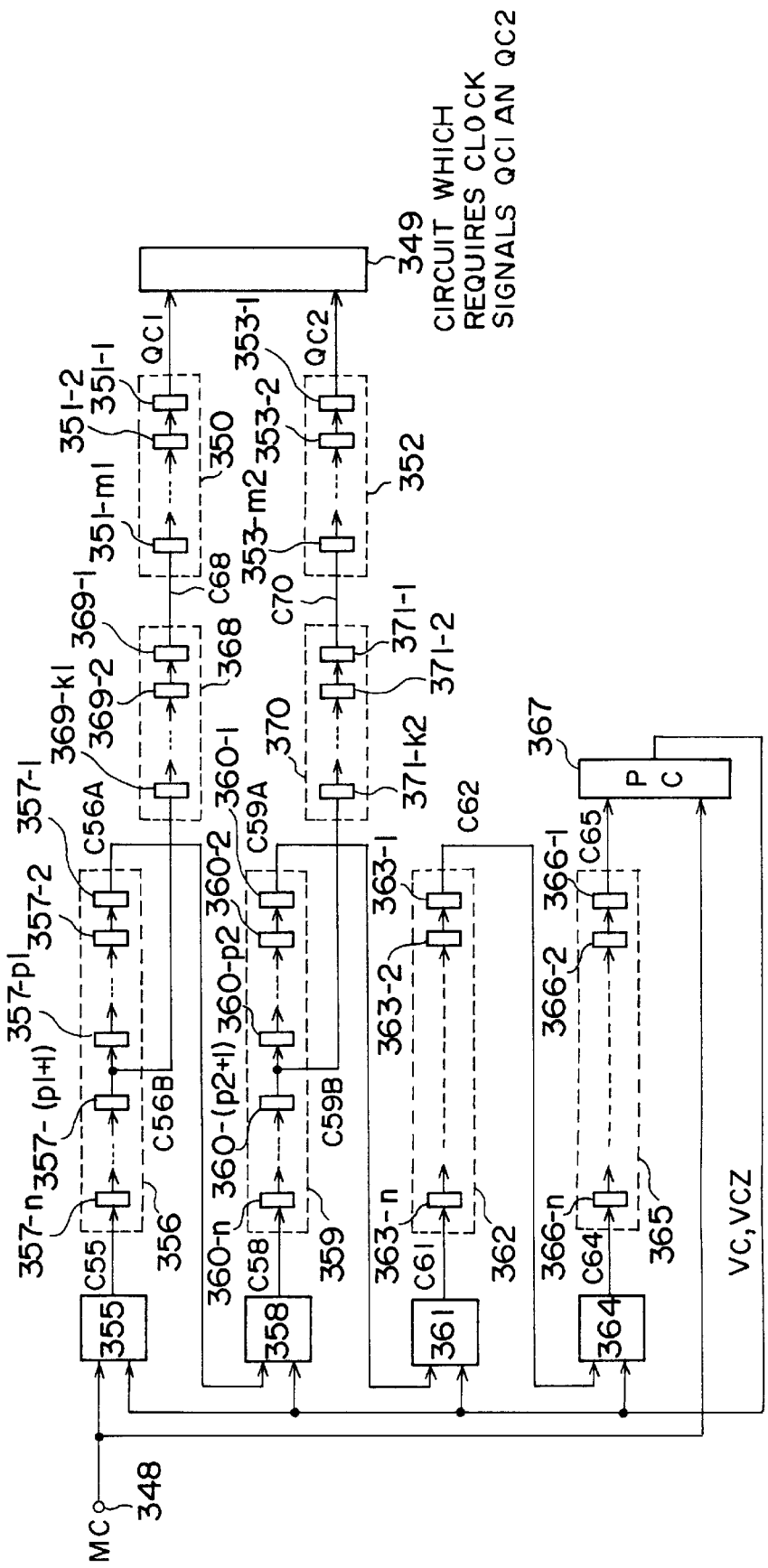
FIG. 24 is a circuit diagram of a part of a semiconductor integrated circuit according to a tenth embodiment of the present invention.

A description will now be given, with respect to FIGS. 24 and 25, of a tenth embodiment of the present invention. FIG. 24 is a circuit diagram of a part of a semiconductor integrated circuit according to the tenth embodiment of the present invention. In FIG. 24, the main clock signal MC is input to a main clock input terminal 348. A clock signal QC1 and a clock signal QC2 are supplied to a circuit 349 which requires these signals. The clock signal QC1 is generated by delaying a phase of the main clock signal MC by 180 degrees. The clock signal QC2 is generated by delaying a phase of the main clock signal MC by 270 degrees.

The clock signal QC1 is supplied to the circuit 349 from a clock transmission circuit 350 which comprises gate circuits 351-1, 351-2, ..., 351-m1. Each of the gate circuits 351-1, 351-2, ..., 351-m1 provides a delay time TA. The clock signal QC2 is supplied to the circuit 349 from a clock transmission circuit 352 which comprises gate circuits 353-1, 353-2, ..., 353-m2. Each of the gate circuits 352-1, 352-2, ... and 352-m2 provides a delay time TA.

A variable delay circuit 355 delays the main clock signal MC which can be constructed, for example, similar to the circuit shown in FIGS. 19, 20 or 36. A clock signal C55 output from the variable delay circuit 355 is delayed by a fixed delay circuit 356. The fixed delay circuit 356 comprises gate circuits 357-1, 357-2, ..., 357-p1, 357-(p1+1), ..., 357-n each of which provides a delay time TA.

A variable delay circuit 358 delays a clock signal C56A which is output from the final stage gate circuit 357-1 of the fixed delay circuit 356. The variable delay circuit 358 has a circuit structure the same as the circuit structure of the variable delay circuit 355. A clock signal C58 output from the variable delay circuit 358 is delayed by a fixed delay circuit 359 which has a circuit structure the same as the circuit structure of the fixed delay circuit 356. The fixed delay circuit 359 comprises gate circuits 360-1, 360-2, ..., 360-p2, 360-(p2+1), ..., 360-n each of which provides a delay time TA.

Additionally, a variable delay circuit 361 delays a clock signal C59A which is output from the final stage gate circuit 360-1 of the fixed delay circuit 359. The variable delay circuit 361 has a circuit structure the same as the circuit structure of the variable delay circuit 355. A clock signal C61 output from the variable delay circuit 361 is delayed by a fixed delay circuit 362 which has a circuit structure the same as the circuit structure of the fixed delay circuit 356. The fixed delay circuit 362 comprises gate circuits 363-1, 363-2, ..., 363-n each of which provides a delay time TA.

Additionally, a variable delay circuit 364 delays a clock signal C62 which is output from the fixed delay circuit 362. The variable delay circuit 364 has a circuit structure the same as the circuit structure of the variable delay circuit 355. A clock signal C64 output from the variable delay circuit 364 is delayed by a fixed delay circuit 365 which has a circuit structure the same as the circuit structure of the fixed delay circuit 356. The fixed delay circuit 365 comprises gate circuits 366-1, 366-2, ..., 366-n each of which provides a delay time TA.

As mentioned above, in the tenth embodiment of the present invention, a delay circuit which delays the main clock signal MC is constituted by a first circuit unit comprising the variable delay circuit 355 and the fixed delay circuit 356, a second circuit unit comprising the variable delay circuit 358 and the fixed delay circuit 359, a third circuit unit comprising the variable delay circuit 361 and the fixed delay circuit 362 and a fourth circuit unit comprising the variable delay circuit 364 and the fixed delay circuit 365, the first to fourth circuit units being connected in series.

Additionally, a phase comparator (PC) 367 controls the variable delay circuits 355, 358, 361 and 364 by comparing a phase of the main clock signal MC with a phase of a clock signal C65 output from the fixed delay circuit 365 so as to supply the delay time control voltages VC and VCZ to the variable delay circuits 355, 358, 361 and 364 so that a phase of the clock signal C65 conforms to the phase of the main clock signal MC. In this embodiment, a delay locked loop circuit is constituted by the variable delay circuits 355, 358, 361 and 364, the fixed delay circuits 356, 359, 362 and 365, and the phase comparator 367.

A fixed delay circuit 368 comprises gate circuits (for example, CMOS inverters) 369-1, 369-2, ..., 369-k1 each of which provides a delay time TA. It should be noted that k1 is equal to $\{(TL/TA)L+n+p1-m1\}$. Additionally, a fixed delay circuit 370 comprises gate circuits (for example, CMOS inverters) 371-1, 371-2, ..., 371-k2 each of which provides a delay time TA. It should be noted that k2 is equal to $\{(TL/TA)L+n+p2-m2\}$.

Additionally, an output terminal of the gate circuit 357-(p1+1), which is the (n–p1)th gate circuit, is connected to an input terminal of the gate circuit 369-k1 which is the first stage gate circuit of the fixed delay circuit 368. Accordingly, a clock signal C68 which is output from the gate circuit 369-1 of the fixed delay circuit 368 is supplied to the first stage gate circuit 351-m1 of the clock transmission circuit 350.

Further, an output terminal of the gate circuit 360-(p2+1), which is the (n–p2)th gate circuit, is connected to an input terminal of the gate circuit 371-k2 which is the first stage gate circuit of the fixed delay circuit 370. Accordingly, a clock signal C70 which is output from the gate circuit 371-1 of the fixed delay circuit 370 is supplied to the first stage gate circuit 353-m2 of the clock transmission circuit 352.

Figure 25:
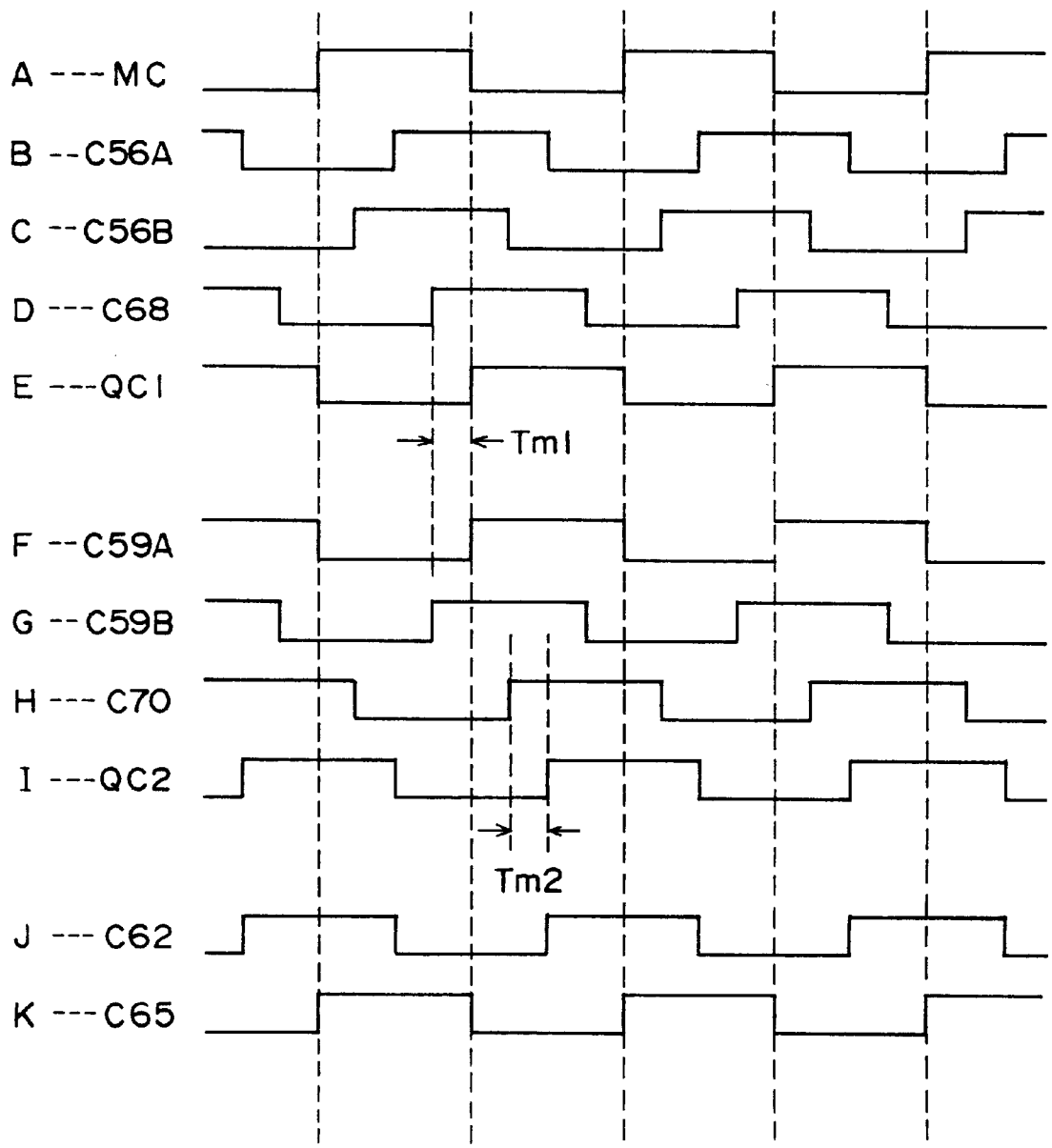
FIG. 25 is a waveform chart for explaining an operation of the semiconductor integrated circuit shown in FIG. 24.

FIG. 25 is a waveform chart for explaining an operation of the circuit shown in FIG. 24. FIG. 24-A indicates the main clock signal MC; FIG. 25-B indicates the clock signal C56A which is output from the final stage gate circuit 357-1 of the fixed delay circuit 356; FIG. 25-C indicates the clock signal C56B which is output from the (n–p1)th gate circuit 357-(p1+1) of the fixed delay circuit 356; FIG. 25-D indicates the clock signal C68 which is output from the fixed delay circuit 368; and FIG. 25-E indicates the clock signal QC1 which is output from the clock transmission circuit 350. Additionally, FIG. 25-F indicates the clock signal C59A which is output from the final stage gate circuit 360-1 of the fixed delay circuit 359; FIG. 25-G indicates the clock signal C59B which is output from the (n–p2)th gate circuit 360-(p2+1) of the fixed delay circuit 359; FIG. 25-H indicates the clock signal C70 which is output from the fixed delay circuit 370; FIG. 25-I indicates the clock signal QC2 which is output from the clock transmission circuit 352; FIG. 25-J indicates the clock signal C62 which is output from the fixed delay circuit 362; and FIG. 25-K indicates the clock signal C65 which is output from the fixed delay circuit 365.

In the present embodiment, each of the variable delay circuits 355, 358, 361 and 364 has an identical circuit structure, and each of the fixed delay circuits 356, 359, 362 and 365 also has an identical circuit structure.

Accordingly, a phase of the clock signal C56A which is output from the final stage gate circuit 357-1 of the fixed delay circuit 356 is delayed by 90 degrees from the phase of the main clock signal MC; a phase of the clock signal C59A which is output from the final stage gate circuit 360-1 of the fixed delay circuit 359 is delayed by 180 degrees from the phase of the main clock signal MC; a phase of the clock signal C62 which is output from the fixed delay circuit 362 is delayed by 270 degrees from the phase of the main clock signal MC; and a phase of the clock signal C65 is equal to the phase of the main clock signal MC.

Since the number k1 of the gate circuits of the fixed delay circuit 368 is equal to {(TL/TA)L+n+p1−m1}, a phase of the clock signal C68, which is output from the fixed delay circuit 368, is in advance of a phase of the clock signal C59A, which is output from the final stage gate circuit 360-1 of the fixed delay circuit 359, by a delay time Tm1 which is a total of the delay time of the gate circuits 351-1 to 351-m1. Thus, the phase of the clock signal QC1 which is output from the clock transmission circuit 350 is delayed from the phase of the main clock signal MC by 180 degrees.

Additionally, since the number k2 of the gate circuits of the fixed delay circuit 370 is equal to {(TL/TA)L+n+p2−m2}, a phase of the clock signal C70, which is output from the fixed delay circuit 370, is in advance of a phase of the clock signal C62, which is output from the fixed delay circuit 362, by a delay time Tm2 which is a total of the delay time of the gate circuits 353-1 to 353-m1. Thus, the phase of the clock signal QC2 which is output from the clock transmission circuit 352 is delayed from the phase of the main clock signal MC by 270 degrees.

Accordingly, in the tenth embodiment of the present invention, the clock signal QC1, which is generated by delaying the main clock signal MC and has the phase delayed by 180 degrees, and the clock signal QC2, which is generated by delaying the main clock signal MC and has the phase delayed by 270 degrees, can be provided to the circuit 349 irrespective of a process condition, a temperature change or a level of the power source voltage.

Figure 26:
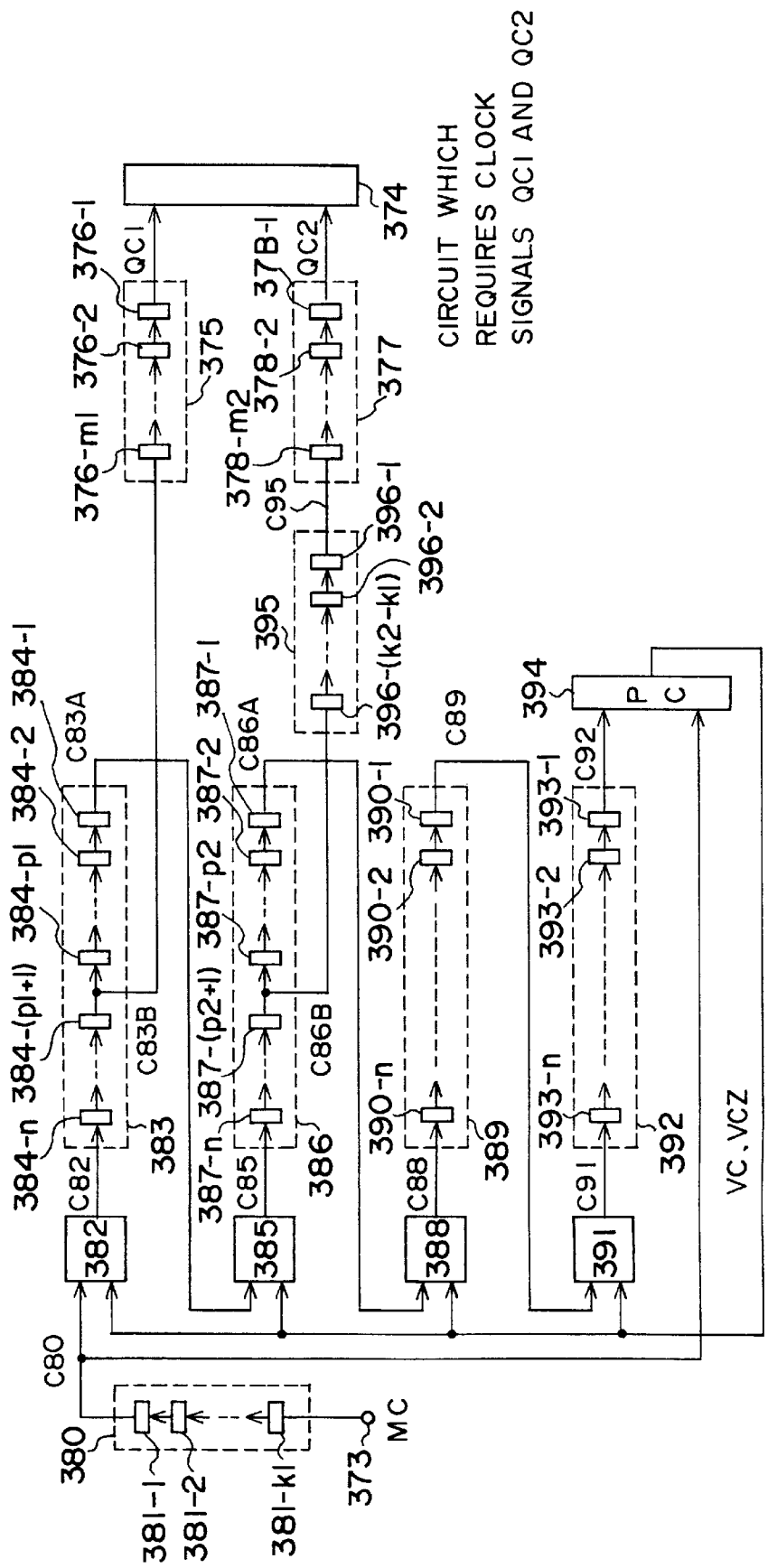
FIG. 26 is a circuit diagram of a part of a semiconductor integrated circuit according to an eleventh embodiment of the present invention.

A description will now be given, with respect to FIGS. 26 and 27, of an eleventh embodiment of the present invention. FIG. 26 is a circuit diagram of a part of a semiconductor integrated circuit according to the eleventh embodiment of the present invention. In FIG. 26, the main clock signal MC is input to a main clock input terminal 373. A clock signal QC1 and a clock signal QC2 are supplied to a circuit 374 which requires these signals. The clock signal QC1 is generated by delaying a phase of the main clock signal MC by 180 degrees. The clock signal QC2 is generated by delaying a phase of the main clock signal MC by 270 degrees.

The clock signal QC1 is supplied to the circuit 374 from a clock transmission circuit 375 which comprises gate circuits (for example, CMOS inverters) 376-1, 376-2, . . . , 376-m1. Each of the gate circuits 376-1, 376-2, . . . , 376-m1 provides a delay time TA. The clock signal QC2 is supplied to the circuit 374 from a clock transmission circuit 377 which comprises gate circuits (for example, CMOS inverters) 378-1, 378-2, . . . , 378-m2. Each of the gate circuits 378-1, 378-2, . . . , 378-m2 provides a delay time TA.

A fixed delay circuit 380 delays the main clock MC. The fixed delay circuit 380 comprises gate circuits (for example, CMOS inverters) 381-1, 381-2, . . . , 381-k1 each of which provides a delay time TA.

A variable delay circuit 382 delays a clock signal C80 which is output from the fixed delay circuit 380. The variable delay circuit 382 can be constructed, for example, similar to the circuit shown in FIGS. 19, 20 or 36, by L stages of gate circuits having a delay time TL. A clock signal C82 output from the variable delay circuit 382 is delayed by a fixed delay circuit 383. The fixed delay circuit 383 comprises gate circuits 384-1, 384-2, . . . , 384-p1, 384-(p1+1), . . . , 384-n each of which provides a delay time TA.

A variable delay circuit 385 delays a clock signal C83A which is output from the final stage gate circuit 384-1 of the fixed delay circuit 383. The variable delay circuit 385 has a circuit structure the same as the circuit structure of the variable delay circuit 382. A clock signal C85 output from the variable delay circuit 385 is delayed by a fixed delay circuit 386 which has a circuit structure the same as the circuit structure of the fixed delay circuit 383. The fixed delay circuit 386 comprises gate circuits 387-1, 387-2, . . . , 387-p2, 387-(p2+1), . . . , 387-n each of which provides a delay time TA.

Additionally, a variable delay circuit 388 delays a clock signal C86A which is output from the final stage gate circuit 387-1 of the fixed delay circuit 386. The variable delay circuit 388 has a circuit structure the same as the circuit structure of the variable delay circuit 382. A clock signal C88 output from the variable delay circuit 388 is delayed by a fixed delay circuit 389 which has a circuit structure the same as the circuit structure of the fixed delay circuit 383. The fixed delay circuit 389 comprises gate circuits 390-1, 390-2, . . . , 390-n each of which provides a delay time TA.

Additionally, a variable delay circuit 391 delays a clock signal C89 which is output from the fixed delay circuit 389. The variable delay circuit 391 has a circuit structure the same as the circuit structure of the variable delay circuit 382. A clock signal C91 output from the variable delay circuit 391 is delayed by a fixed delay circuit 392 which has a circuit structure the same as the circuit structure of the fixed delay circuit 383. The fixed delay circuit 392 comprises gate circuits 393-1, 393-2, . . . , 393-n each of which provides a delay time TA.

As mentioned above, in the eleventh embodiment of the present invention, a delay circuit which delays the main clock signal MC is constituted by a fixed delay circuit 380, a first circuit unit comprising the variable delay circuit 382 and the fixed delay circuit 383, a second circuit unit comprising the variable delay circuit 385 and the fixed delay circuit 386, a third circuit unit comprising the variable delay circuit 388 and the fixed delay circuit 389 and a fourth circuit unit comprising the variable delay circuit 391 and the fixed delay circuit 392, the first to fourth circuit units being connected in series.

Additionally, a phase comparator (PC) 394 controls the variable delay circuits 382, 385, 388 and 391 by comparing a phase of the clock signal C80 output from the fixed delay circuit 380 with a phase of a clock signal C92 output from the fixed delay circuit 392 so as to supply the delay time control voltages VC and VCZ to the variable delay circuits 382, 385, 388 and 391 so that a phase of the clock signal C92 output from the fixed delay circuit 392 conforms to the phase of the clock signal C80 output from the fixed delay circuit 380. In this embodiment, a delay locked loop circuit is constituted by the variable delay circuits 382, 385, 388 and 391, the fixed delay circuits 383, 386, 389 and 392, and the phase comparator 394.

A fixed delay circuit 395 delays a clock signal C86B which is output from the (n−p2)th gate circuit 87-(p2+1) of the fixed delay circuit 386. The fixed delay circuit 395 comprises gate circuits (for example, CMOS inverters)

396-1, 396-2, . . . , 396-(k2−k1) each of which provides a delay time TA. It should be noted that k1 is equal to {(TL/TA)L+n+p1−m1}, and k2 is equal to {(TL/TA)L+n+p2−m2}.

Additionally, an output terminal of the gate circuit 384-(p1+1), which is the (n−p1)th gate circuit of the fixed delay circuit 383, is connected to an input terminal of the gate circuit 376-m1 which is the first stage gate circuit of the clock transmission circuit 375.

Additionally, an output terminal of the (n−p2)th gate circuit 387-(p2+1) of the fixed delay circuit 386 is connected to an input terminal of the first stage gate circuit 396-(k2−k1) of the fixed delay circuit 395. An output terminal of the final stage gate circuit 396-1 of the fixed delay circuit 395 is connected to an input terminal of the first stage gate circuit 378-m2 of the clock transmission circuit 377.

Figure 27:
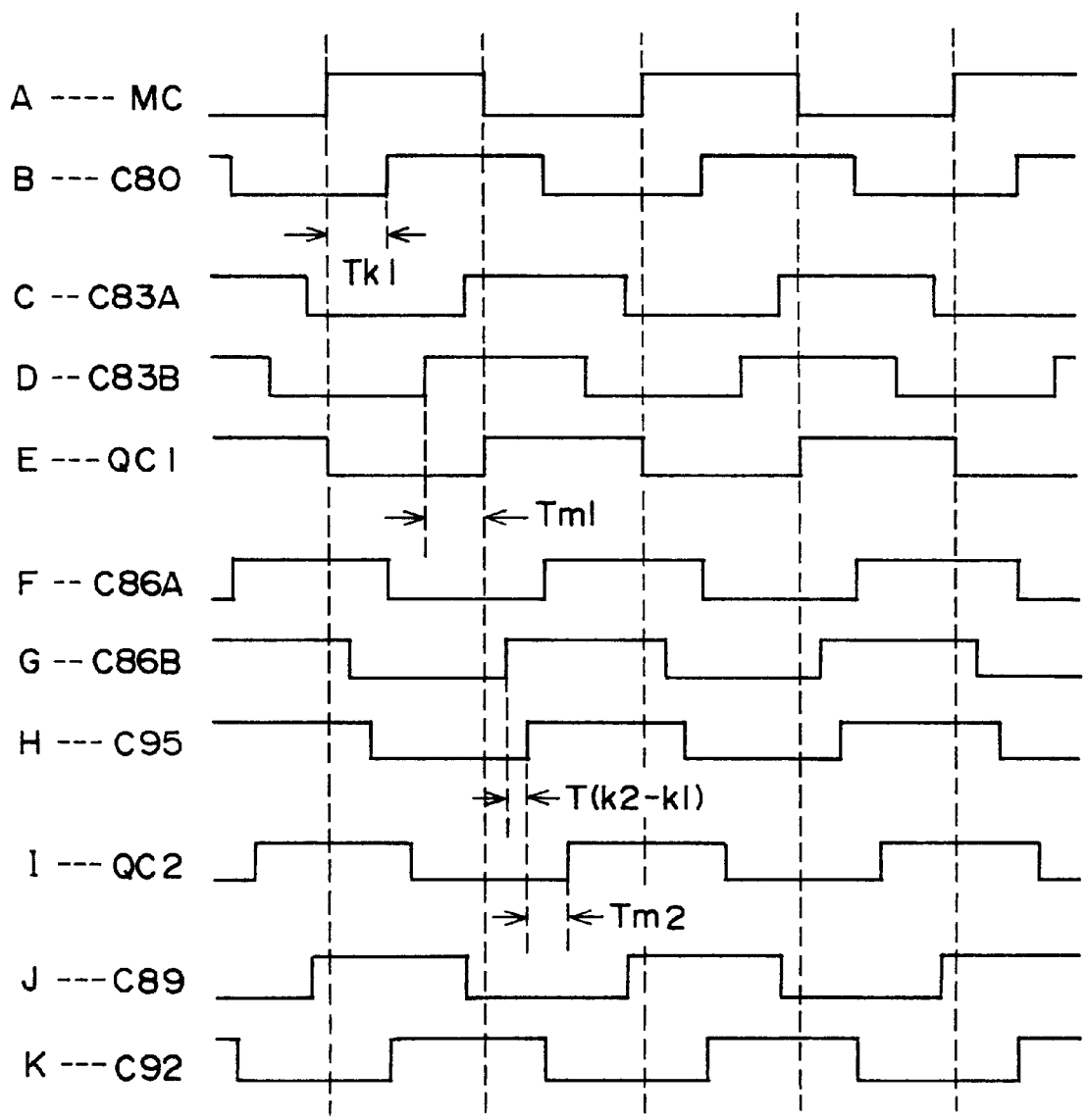
FIG. 27 is a waveform chart for explaining an operation of the semiconductor integrated circuit shown in FIG. 26.

FIG. 27 is a waveform chart for explaining an operation of the circuit shown in FIG. 26. FIG. 27-A indicates the main clock signal MC; FIG. 27-B indicates the clock signal C80 which is output from the fixed delay circuit 380; FIG. 27-C indicates the clock signal C83A which indicates output from the final stage gate circuit 384-1 of the fixed delay circuit 383; FIG. 27-D indicates the clock signal C83B which is output from the (n−p1)th gate circuit 384-(p1+1) of the fixed delay circuit 383; FIG. 27-E indicates the clock signal QC1 which is output from the clock transmission circuit 375. Additionally, FIG. 27-F indicates the clock signal C86A which is output from the final stage gate circuit 387-1 of the fixed delay circuit 386; FIG. 27-G indicates the clock signal C86B which is output from the (n−p2)th gate circuit 387-(p2+1) of the fixed delay circuit 386; FIG. 27-H indicates the clock signal C95 which is output from the fixed delay circuit 395; FIG. 25-I indicates the clock signal QC2 which is output from the clock transmission circuit 377; FIG. 27-J indicates the clock signal C89 which is output from the fixed delay circuit 389; and FIG. 27-K indicates the clock signal C92 which is output from the fixed delay circuit 392.

In the present embodiment, each of the variable delay circuits 382, 385, 388 and 391 has an identical circuit structure, and each of the fixed delay circuits 383, 386, 389 and 392 also has an identical circuit structure.

Accordingly, a phase of the clock signal C83A which is output from the final stage gate circuit 384-1 of the fixed delay circuit 383 is delayed by 90 degrees from the phase of the clock signal C80 which is output from the fixed delay circuit 380; a phase of the clock signal C86A which is output from the final stage gate circuit 387-1 of the fixed delay circuit 386 is delayed by 180 degrees from the phase of the clock signal C80 which is output from the fixed delay circuit 380; a phase of the clock signal C89 which is output from the fixed delay circuit 389 is delayed by 270 degrees from the phase of the clock signal C80 which is output from the fixed delay circuit 380; and a phase of the clock signal C92 which is output from the fixed delay circuit 392 is equal to the phase of the clock signal C80 which is output from the fixed delay circuit 380.

Since the number k1 of the gate circuits of the fixed delay circuit 380 is equal to {(TL/TA)L+n+p1−m1}, a phase of the clock signal C83B, which is output from the (n−p1)th gate circuit 384-(p1+1) of the fixed delay circuit 383, is in advance of a phase of the clock signal C86A, which is output from the final stage gate circuit 387-1 of the fixed delay circuit 386, by a delay time (Tk1+Tm1) which is a sum of the delay time Tk1 of the fixed delay circuit 380 and the delay time Tm1 of the clock transmission circuit 375. Because the clock signal C86A is delayed from the main clock MC by (Tk1+180 degrees), the phase of the clock signal QC1 which is output from the clock transmission circuit 375 is delayed from the phase of the main clock signal MC by 180 degrees.

Additionally, since the number (k2−k1) of the gate circuits of the fixed delay circuit 395 is equal to {(TL/TA)L+n+p2−m2−k1}, a phase of the clock signal C95, which is output from the fixed delay circuit 395, is in advance of a phase of the clock signal C89 by a delay time (Tk1+Tm2) which is a sum of the delay time Tk1 of the fixed delay circuit 380 and delay time Tm2 of the fixed delay circuit 377. Because the clock signal C89 is delayed from the main clock MC by (Tk1+270 degrees), the phase of the clock signal QC2 which is output from the clock transmission circuit 377 is delayed from the phase of the main clock signal MC by 270 degrees.

Accordingly, in the eleventh embodiment of the present invention, the clock signal QC1, which is generated by delaying the main clock signal MC and has the phase delayed by 180 degrees, and the clock signal QC2, which is generated by delaying the main clock signal MC and has the phase delayed by 270 degrees, can be provided to the circuit 374 irrespective of a process condition, a temperature change or a level of the power source voltage. The same operation of the tenth embodiment can be achieved with k1 less fixed delay elements.

Figure 28:
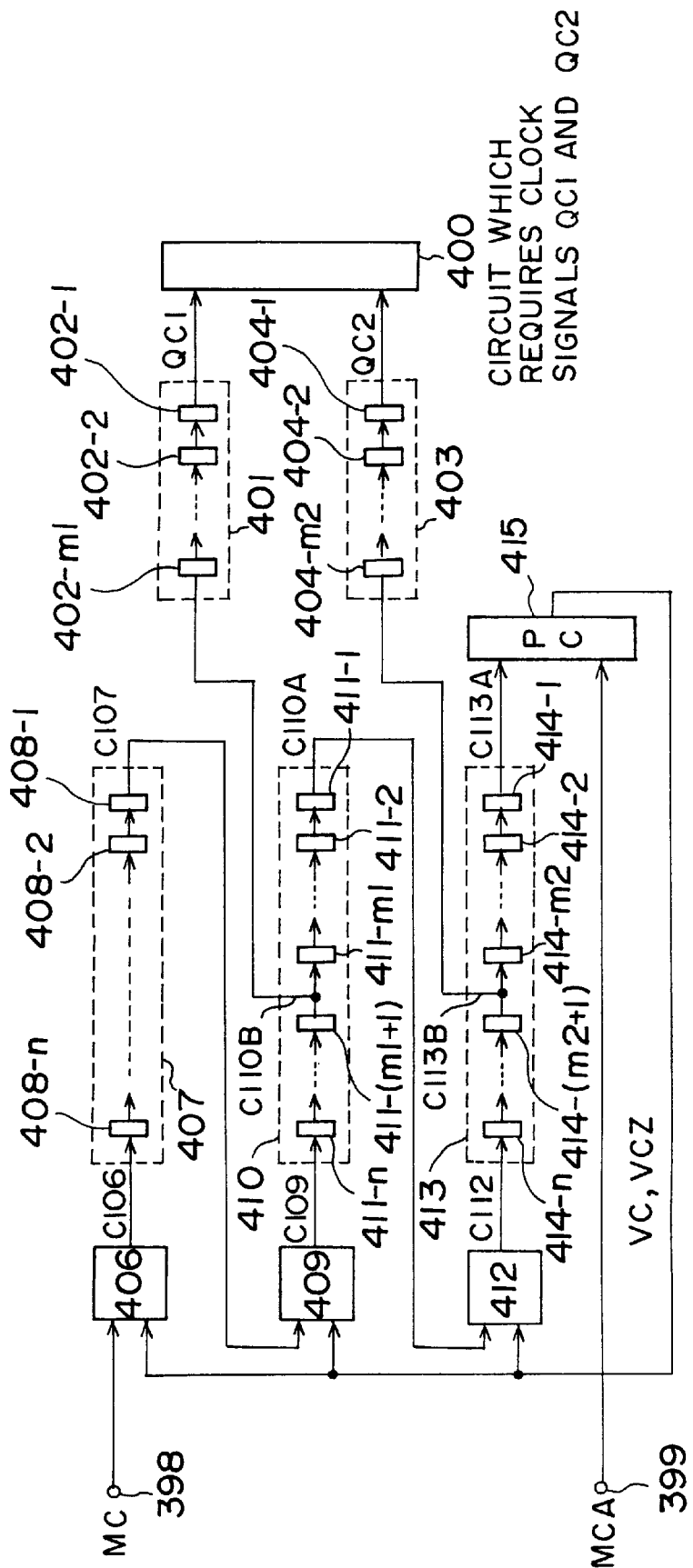
FIG. 28 is a circuit diagram of a part of a semiconductor integrated circuit according to a twelfth embodiment of the present invention.

A description will now be given, with respect to FIGS. 28 and 29, of a twelfth embodiment of the present invention. FIG. 28 is a circuit diagram of a part of a semiconductor integrated circuit according to the twelfth embodiment of the present invention. In FIG. 28, the main clock signal MC is input to a main clock input terminal 398, a clock signal MCA which is generated by delaying the phase of the main clock signal by 270 degrees is input to a clock signal input terminal 399. A clock signal QC1 and a clock signal QC2 are supplied to a circuit 400 which requires these signals. The clock signal QC1 is generated by delaying a phase of the main clock signal MC by 180 degrees. The clock signal QC2 is generated by delaying a phase of the main clock signal MC by 270 degrees.

The clock signal QC1 is supplied to the circuit 400 from a clock transmission circuit 401 which comprises gate circuits (for example, CMOS inverters) 402-1, 402-2, 402-3, . . . , 402-m1. Each of the gate circuits 402-1, 402-2, 402-3, . . . , 402-m1 provides a delay time TA. The clock signals QC2 is supplied to the circuit 400 from a clock transmission circuit 403 which comprises gate circuits (for example, CMOS inverters) 404-1, 404-2, 404-3, . . . , 404-m2. Each of the gate circuits 404-1, 404-2, 404-3, . . . and 404-m2 provides a delay time TA.

A variable delay circuit 406 delays the main clock signal MC. The variable delay circuit 406 can be constructed, for example, similar to the circuit shown in FIGS. 19, 20 or 36, which comprises L stages of gate circuits each providing a delay time TL. A clock signal C106 output from the variable delay circuit 406 is delayed by a fixed delay circuit 407. The fixed delay circuit 407 comprises gate circuits (for example, CMOS inverters) 408-1, 408-2, . . . , 408-n each of which provides a delay time TA.

A variable delay circuit 409 delays a clock signal C107 which is output from the fixed delay circuit 407. The variable delay circuit 409 has a circuit structure the same as the circuit structure of the variable delay circuit 406. A clock signal C109 output from the variable delay circuit 409 is delayed by a fixed delay circuit 410 which has a circuit structure the same as the circuit structure of the fixed delay circuit 407. The fixed delay circuit 410 comprises gate circuits 411-1, 411-2, . . . 411-m1, 411-(m1+1), . . . ,411-n each of which provides a delay time TA.

Additionally, a variable delay circuit 412 delays a clock signal C110A which is output from the final stage gate circuit 411-1 of the fixed delay circuit 410. The variable delay circuit 412 has a circuit structure the same as the circuit structure of the variable delay circuit 406. A clock signal C112 output from the variable delay circuit 412 is delayed by a fixed delay circuit 413 which has a circuit structure the same as the circuit structure of the fixed delay circuit 407. The fixed delay circuit 413 comprises gate circuits 414-1, 414-2, . . . , 414-m2, 414-(m2+1), . . . , 414-n each of which provides a delay time TA.

As mentioned above, in the twelfth embodiment of the present invention, a delay circuit which delays the main clock signal MC is constituted by a first circuit unit comprising the variable delay circuit 406 and the fixed delay circuit 407, a second circuit unit comprising the variable delay circuit 409 and the fixed delay circuit 410, a third circuit unit comprising the variable delay circuit 412 and the fixed delay circuit 413, the first to third circuit units being connected in series.

Additionally, a phase comparator (PC) 415 controls the delay time of the variable delay circuits 406, 409 and 412 by comparing a phase of the clock signal MCA with a phase of a clock signal C113A output from the final stage gate circuit 414-1 of the fixed delay circuit 413 so as to supply the delay time control voltages VC and VCZ to the variable delay circuits 406, 409 and 412 so that a phase of the clock signal C113A conforms to the phase of the given clock signal MCA. In this embodiment, a delay locked loop circuit is constituted by the variable delay circuits 406, 409 and 412, the fixed delay circuits 407, 410 and 413, and the phase comparator 415.

Additionally, an output terminal of the gate circuit 411-(m1+1), which is the (n−m1)th gate circuit of the fixed delay circuit 410, is connected to an input terminal of the gate circuit 402-m1 which is the first stage gate circuit of the clock transmission circuit 401. Accordingly, a clock signal C110B which is output from the (n−m1)th gate circuit 411-(m1+1) of the fixed delay circuit 410 is supplied to the first stage gate circuit 402-m1 of the clock transmission circuit 401.

Further, an output terminal of the gate circuit 414-(m2+1), which is the (n−m2)th gate circuit of the fixed delay circuit 413, is connected to an input terminal of the gate circuit 404-m2 which is the first stage gate circuit of the clock transmission circuit 403. Accordingly, a clock signal C113B which is output from the gate circuit 414-(m2+1) of the fixed delay circuit 413 is supplied to the first stage gate circuit 404-m2 of the clock transmission circuit 403.

Figure 29:
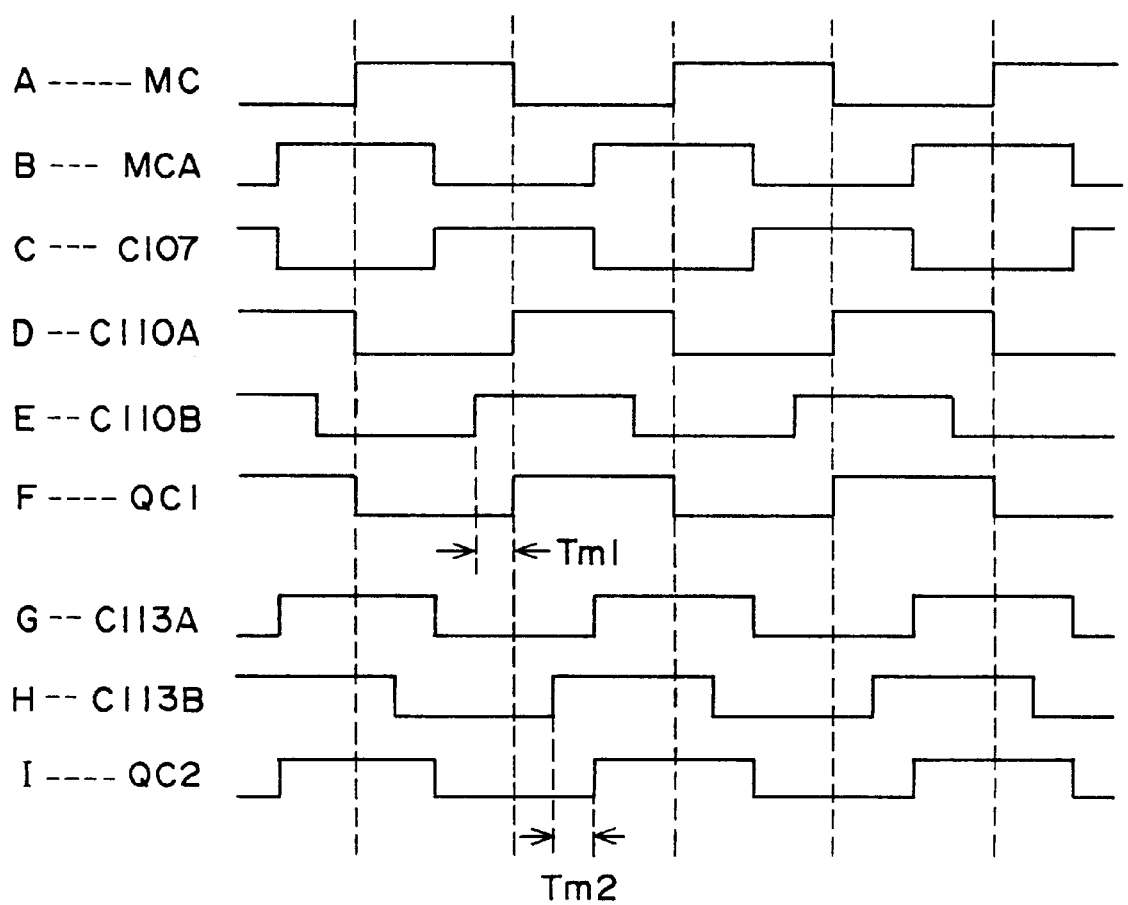
FIG. 29 is a waveform chart for explaining an operation of the semiconductor integrated circuit shown in FIG. 28.

FIG. 29 is a waveform chart for explaining an operation of the circuit shown in FIG. 28. FIG. 29-A indicates the main clock signal MC; FIG. 29-B indicates the clock signal MCA; FIG. 29-C indicates the clock signal C107 which is output from the fixed delay circuit 407; FIG. 29-D indicates the clock signal C110A which is output from the final stage gate circuit 411-1 of the fixed delay circuit 410; FIG. 29-E indicates the clock signal C110B which is output from the (n−m1)th gate circuit 411-m1+1) of the fixed delay circuit 410; and FIG. 29-F indicates the clock signal QC1 which is output from the clock transmission circuit 401. Additionally, FIG. 29-G indicates the clock signal C113A which is output from the final stage gate circuit 414-1 of the fixed delay circuit 413; FIG. 29-H indicates the clock signal C113B which is output from the (n−m2)th gate circuit 414-(m2+1) of the fixed delay circuit 413; and FIG. 29-I indicates the clock signal QC2 which is output from the clock transmission circuit 403.

In the present embodiment, each of the variable delay circuits 406, 409 and 412 has an identical circuit structure, and each of the fixed delay circuits 407, 410 and 412 also has an identical circuit structure.

Accordingly, a phase difference between the clock signals MC and MCA is divided by three delay units, and a phase of the clock signal C107 which is output from the fixed delay circuit 407 is delayed by 90 degrees from the phase of the main clock signal MC; a phase of the clock signal C110A which is output from the final stage gate circuit 411-1 of the fixed delay circuit 410 is delayed by 180 degrees from the phase of the main clock signal MC; a phase of the clock signal C113A which is output from the final stage gate circuit 414-1 of the fixed delay circuit 413 is delayed by 270 degrees from the phase of the main clock signal MC.

As a result, a phase of the clock signal C110B, which is output from the (n−m1)th gate circuit 411-m1+1) of the fixed delay circuit 410, is in advance of a phase of the clock signal C110A, which is output from the final stage gate circuit 411-1 of the fixed delay circuit 410, by a delay time Tm1 which is a total of the delay time of the gate circuits 411-1 to 411-m1.

Since the number of stages of the gate circuits 402-1 to 402-m1 of the clock transmission circuit 401 is m1 and the number of stages of the gate circuits 411-1 to 411-m1 is also m1, the clock signal QC1 which is output from the clock transmission circuit 401 has a phase delayed by 180 degrees from the phase of the main clock signal MC.

Additionally, a phase of the clock signal C113B, which is output from the n−m2)th gate circuit 414-(m2+1) of the fixed delay circuit 413, is in advance of a phase of the clock signal C113A, which is output from the final stage gate circuit 414-1 of the fixed delay circuit 413, by a delay time Tm2 which is a total of the delay time of the gate circuits 414-1 to 414-m2.

Since the number of stages of the gate circuits 404-1 to 404-m2 of the clock transmission circuit 403 is m2 and the number of stages of the gate circuits 414-1 to 414-m2 of the fixed delay circuit 413 is also m2, the clock signal QC2 which is output from the clock transmission circuit 403 has a phase delayed by 270 degrees from the phase of the main clock signal MC.

Accordingly, in the twelfth embodiment of the present invention, the clock signal QC1, which is generated by delaying the main clock signal MC and has the phase delayed by 180 degrees, and the clock signal QC2, which is generated by delaying the main clock signal MC and has the phase delayed by 270 degrees, can be provided to the circuit 400 irrespective of a process condition, a temperature change or a level of the power source voltage.

Figure 30:
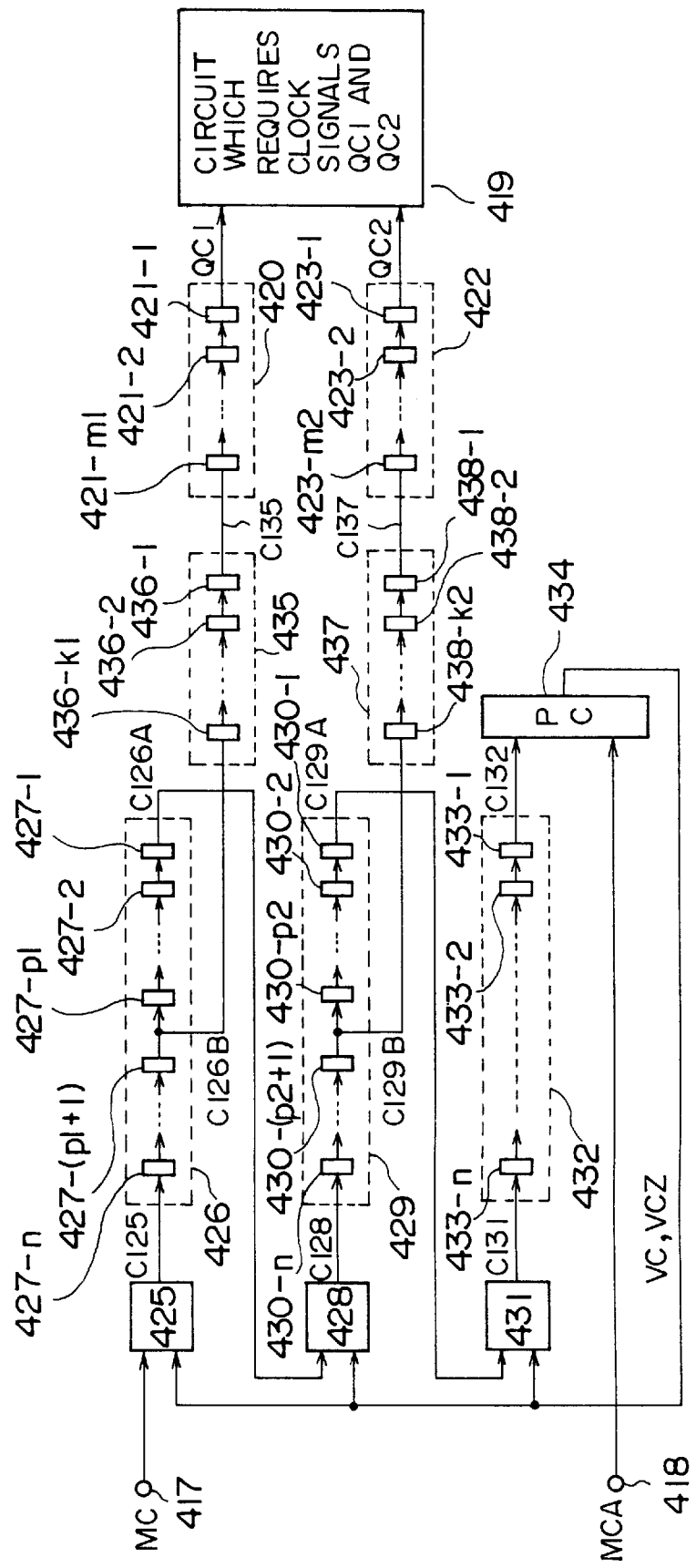
FIG. 30 is a circuit diagram of a part of a semiconductor integrated circuit according to a thirteenth embodiment of the present invention.

A description will now be given, with respect to FIGS. 30 and 31, of a thirteenth embodiment of the present invention. FIG. 30 is a circuit diagram of a part of a semiconductor integrated circuit according to the thirteenth embodiment of the present invention. In FIG. 30, the main clock signal MC is input to a main clock input terminal 417, and a clock signal MCA which has a phase delayed from the phase of the main clock signal by 270 degrees is input to a clock input terminal 418. A clock signal QC1 and a clock signal QC2 are supplied to a circuit 419 which requires these clock signals. The clock signal QC1 is generated by delaying a phase of the main clock signal MC by 180 degrees. The clock signal QC2 is generated by delaying the phase of the main clock signal MC by 270 degrees.

The clock signal QC1 is supplied to the circuit 419 from a clock transmission circuit 420 which comprises gate circuits 421-1, 421-2, ..., 421-m1. Each of the gate circuits 421-1, 421-2, ..., 421-m1 provides a delay time TA. The clock signal QC2 is supplied to the circuit 419 from a clock transmission circuit 422 which comprises gate circuits 423-1, 423-2, ..., 423-m2. Each of the gate circuits 423-1, 423-2, ..., 423-m2 provides a delay time TA.

A variable delay circuit 425 which delays the main clock signal MC can be constructed, for example, similar to the circuit shown in FIGS. 19, 20 or 36. The variable delay circuit 425 comprises L stages of the gate circuits each of which provides a delay time TL. A clock signal C125 output from the variable delay circuit 425 is delayed by a fixed delay circuit 426. The fixed delay circuit 426 comprises gate circuits 427-1, 427-2, ..., 427-pl, 427-(p1+1), ..., 427-n each of which provides a delay time TA.

A variable delay circuit 428 delays a clock signal C126A which is output from the final stage gate circuit 427-1 of the fixed delay circuit 426. The variable delay circuit 428 has a circuit structure the same as the circuit structure of the variable delay circuit 425. A clock signal C128 output from the variable delay circuit 428 is delayed by a fixed delay circuit 429 which has a circuit structure the same as the circuit structure of the fixed delay circuit 426. The fixed delay circuit 429 comprises gate circuits 430-1, 430-2, ..., 430-p2, 430-(p2+1), ..., 430-n each of which provides a delay time TA.

Additionally, a variable delay circuit 431 delays a clock signal C129A which is output from the final stage gate circuit 430-1 of the fixed delay circuit 429. The variable delay circuit 431 has a circuit structure the same as the circuit structure of the variable delay circuit 425. A clock signal C131 output from the variable delay circuit 431 is delayed by a fixed delay circuit 432 which has a circuit structure the same as the circuit structure of the fixed delay circuit 426. The fixed delay circuit 432 comprises gate circuits 433-1, 433-2, ..., 433-n each of which provides a delay time TA.

As mentioned above, in the thirteenth embodiment of the present invention, a delay circuit which delays the main clock signal MC is constituted by a first circuit unit comprising the variable delay circuit 425 and the fixed delay circuit 426, a second circuit unit comprising the variable delay circuit 428 and the fixed delay circuit 429, a third circuit unit comprising the variable delay circuit 431 and the fixed delay circuit 432.

Additionally, a phase comparator (PC) 434 controls the variable delay circuits 425, 428 and 431 by comparing a phase of the delayed clock signal MCA with a phase of a clock signal C132 output from the fixed delay circuit 432 so as to supply the delay time control voltages VC and VCZ to the variable delay circuits 425, 428 and 431 so that a phase of the clock signal C132 output from the fixed delay circuit 432 conforms to the phase of 270-degree delayed clock signal MCA. In this embodiment, a delay locked loop circuit is constituted by the variable delay circuits 425, 428 and 431, the fixed delay circuits 426, 429 and 432 and the phase comparator 434.

A fixed delay circuit 435 delays an output C126B of the gate circuit 427-(p1+1) of the fixed delay circuit 426. The fixed delay circuit 435 comprises gate circuits 436-1, 436-2, ..., 436-k1 each of which provides a delay time TA. It should be noted that k1 is equal to $\{(TL/TA)L+n+p1-m1\}$.

Additionally, a fixed delay circuit 437 delays an output C129B of the gate circuit 430-1(p2+1). The fixed delay circuit 437 comprises gate circuits 438-1, 438-2, ..., 438-k2 each of which provides a delay time TA. It should be noted that k2 is equal to $\{(TL/TA)L+n+p2-m2\}$.

Additionally, an output terminal of the gate circuit 427-(p1+1), which is the (n-p1)th gate circuit of the fixed delay circuit 426, is connected to an input terminal of the gate circuit 436-k1 which is the first stage gate circuit of the fixed delay circuit 435. An output terminal of the final stage gate circuit 436-1 of the fixed delay circuit 435 is connected to an input terminal of the first stage gate circuit 421-m1 of the clock transmission circuit 420.

Further, an output terminal of the gate circuit 430-(p2+1), which is the (n-p2)th gate circuit of the fixed delay circuit 429, is connected to an input terminal of the gate circuit 438-k2 which is the first stage gate circuit of the fixed delay circuit 437. An output terminal of the final stage gate circuit 438-1 of the fixed delay circuit 437 is connected to an input terminal of the first stage gate circuit 423-m2 of the clock transmission circuit 422.

Figure 31:
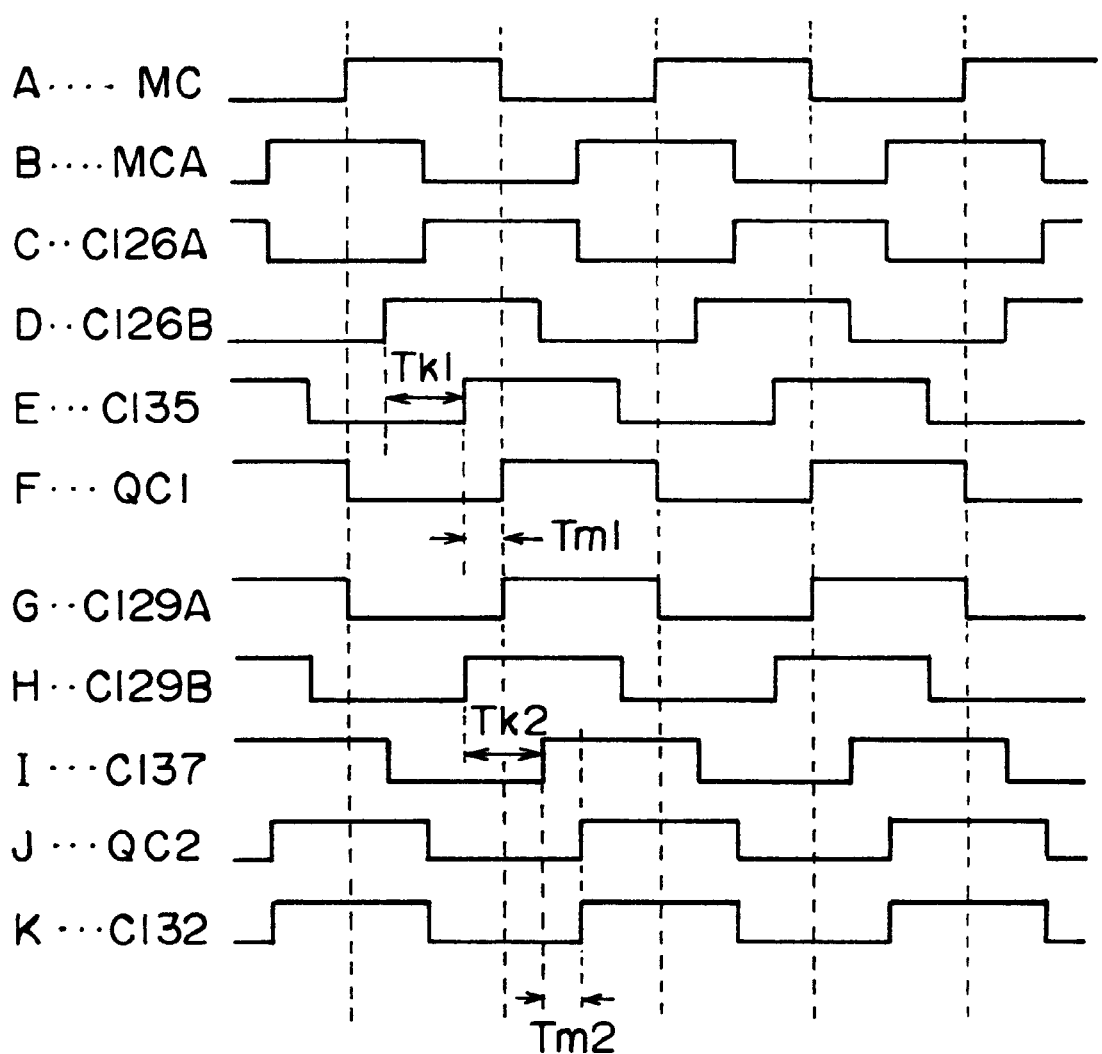
FIG. 31 is a waveform chart for explaining an operation of the semiconductor integrated circuit shown in FIG. 30.

FIG. 31 is a waveform chart for explaining an operation of the circuit shown in FIG. 30. FIG. 31-A indicates the main clock signal MC; FIG. 31-B indicates the clock signal MCA; FIG. 31-C indicates C126A which is output from the final stage gate circuit 427-1 of the fixed delay circuit 426; FIG. 31-D indicates the clock signal C126B which is output from the (n-p1)th gate circuit 427-(p1+1) of the fixed delay circuit 426; FIG. 31-E indicates the clock signal C135 which is output from the fixed delay circuit 435; and FIG. 31-F indicates the clock signal QC1 which is output from the clock transmission circuit 420. Additionally, FIG. 31-G indicates the clock signal C129A which is output from the final stage gate circuit 430-1 of the fixed delay circuit 429; FIG. 31-H indicates the clock signal C129B which is output from the (n-p2)th gate circuit 430-(p2+1) of the fixed delay circuit 429; FIG. 31-I indicates the clock signal C137 which is output from the fixed delay circuit 437; FIG. 31-J indicates the clock signal QC2 which is output from the clock transmission circuit 422; and FIG. 31-K indicates the clock signal C132 which is output from the fixed delay circuit 432.

In the present embodiment, each of the variable delay circuits 425, 428 and 431 has an identical circuit structure, and each of the fixed delay circuits 426, 429 and 432 also has an identical circuit structure.

Accordingly, a phase difference between the clock signals MC and MCA is divided by these delay units, and a phase of the clock signal C126A which is output from the final stage gate circuit 427-1 of the fixed delay circuit 426 is delayed by 90 degrees from the phase of the main clock signal MC; a phase of the clock signal C129A which is output from the final stage gate circuit 430-1 of the fixed delay circuit 429 is delayed by 180 degrees from the phase of the main clock signal MC; a phase of the clock signal C132 which is output from the fixed delay circuit 432 is delayed by 270 degrees from the phase of the main clock signal MC.

Since the number k1 of the gate circuits of the fixed delay circuit 435 is equal to $\{(TL/TA)L+n+p1-m1\}$, a phase of the clock signal C135, which is output from the fixed delay circuit 435, is in advance of a phase of the clock signal C129A, which is output from the final stage gate circuit 430-1 of the fixed delay circuit 429, by a delay time Tm1 which is a total of the delay time of the gate circuits 421-1 to 421-m1 of the clock transmission circuit 420. Thus, the phase of the clock signal QC1 which is output from the clock transmission circuit 420 is delayed from the phase of the main clock signal MC by 180 degrees.

Additionally, since the number k2 of the gate circuits of the fixed delay circuit 437 is equal to {(TL/TA)L+n+p2−m2}, a phase of the clock signal C137, which is output from the fixed delay circuit 437, is in advance of a phase of the clock signal C132, which is output from the fixed delay circuit 432, by a delay time Tm2 which is a total of the delay time of the gate circuits 423-1 to 423-m1 of the clock transmission circuit 422. Thus, the phase of the clock signal QC2 which is output from the clock transmission circuit 422 is delayed from the phase of the main clock signal MC by 270 degrees.

Accordingly, in the thirteenth embodiment of the present invention, when the phase difference between the clock signals MC and MCA is 270 degrees, the clock signal QC1, which is generated by delaying the main clock signal MC and has the phase delayed by 180 degrees, and the clock signal QC2, which is generated by delaying the main clock signal MC and has the phase delayed by 270 degrees, can be provided to the circuit 419 irrespective of a process condition, a temperature change or a level of the power source voltage.

Figure 32:
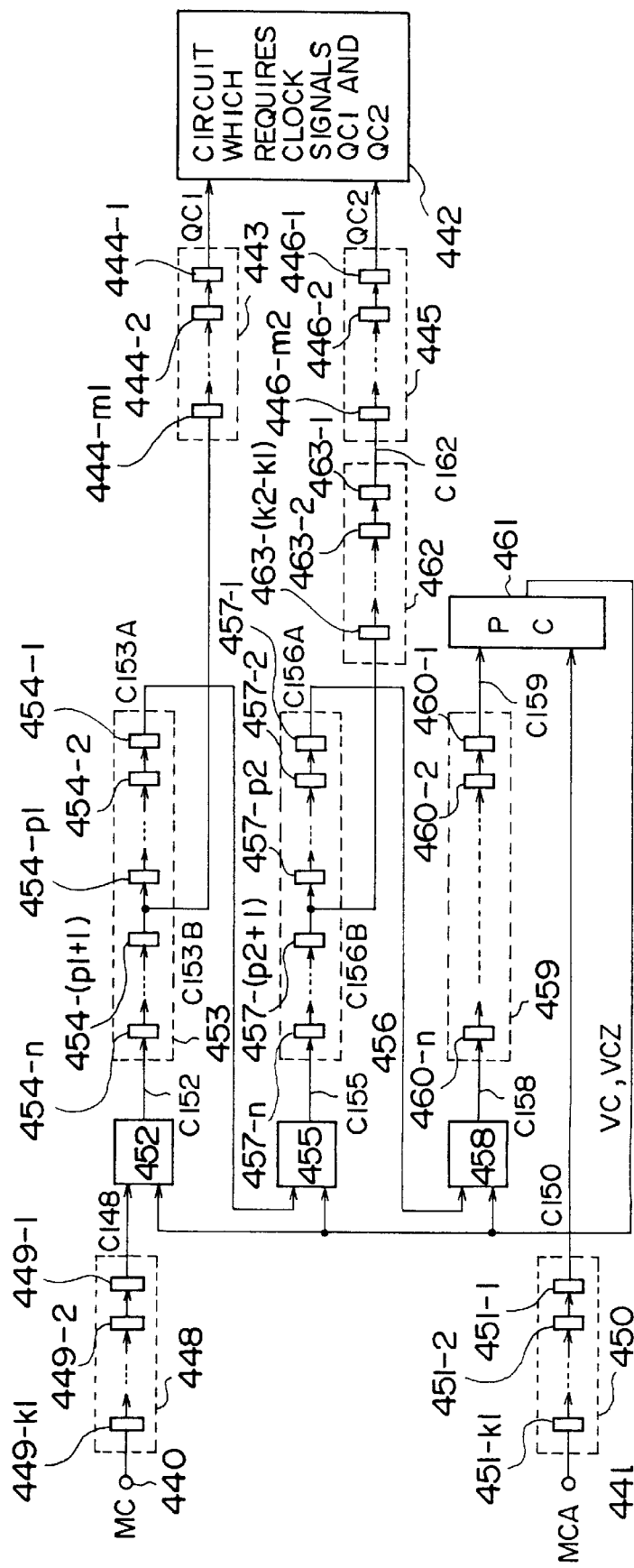
FIG. 32 is a circuit diagram of a part of a semiconductor integrated circuit according to a fourteenth embodiment of the present invention.

A description will now be given, with respect to FIGS. 32 and 33, of a fourteenth embodiment of the present invention. FIG. 32 is a circuit diagram of a part of a semiconductor integrated circuit according to the fourteenth embodiment of the present invention. In FIG. 32, the main clock signal MC is input to a main clock input terminal 440, and a clock signal MCA which has a phase delayed from the main clock signal MC by 270 degrees is input to a clock input terminal 441. A clock signal QC1 and a clock signal QC2 are supplied to a circuit 442 which requires these signals. The clock signal QC1 is generated by delaying a phase of the main clock signal MC by 180 degrees. The clock signal QC2 is generated by delaying a phase of the main clock signal MC by 270 degrees.

The clock signal QC1 is supplied to the circuit 442 from a clock transmission circuit 443 which comprises gate circuits (for example, CMOS inverters) 444-1, 444-2, . . . , 444-m1. Each of the gate circuits 444-1, 444-2, . . . , 444-m1 provides a delay time TA. The clock signal QC2 is supplied to the circuit 442 from a clock transmission circuit 445 which comprises gate circuits (for example, CMOS inverters) 446-1, 446-2, . . . , 446-m2. Each of the gate circuits 446-1, 446-2, . . . , 446-m2 provides a delay time TA.

A fixed delay circuit 448 delays the main clock signal MC. The fixed delay circuit 448 comprises gate circuits (for example, CMOS inverters) 449-1, 449-2, . . . and 449-k1 each of which provides a delay time TA. A fixed delay circuit 450 delays the clock signal MCA. The fixed delay circuit 450 comprises gate circuits (for example, CMOS inverters) 451-1, 451-2, . . . , 451-k1 each of which provides a delay time TA.

A variable delay circuit 452 delays a clock signal C148 which is output from the fixed delay circuit 448. The variable delay circuit 452 can be constructed, for example, similar to the circuit shown in FIGS. 19, 20 or 36, by L stages of gate circuits each of which provides a delay time TL. A clock signal C152 output from the variable delay circuit 452 is delayed by a fixed delay circuit 453. The fixed delay circuit 453 comprises gate circuits 454-1, 454-2, . . . , 454-p1, 454-(p1+1), . . . , 454-n each of which provides a delay time TA.

A variable delay circuit 455 delays a clock signal C153A which is output from the final stage gate circuit 454-1 of the fixed delay circuit 453. The variable delay circuit 455 has a circuit structure the same as the circuit structure of the variable delay circuit 452. A clock signal C155 output from the variable delay circuit 455 is delayed by a fixed delay circuit 456 which has a circuit structure the same as the circuit structure of the fixed delay circuit 453. The fixed delay circuit 456 comprises gate circuits 457-1, 457-2, . . . , 457-p2, 457-(p2+1), . . . , 457-n each of which provides a delay time TA.

Additionally, a variable delay circuit 458 delays a clock signal C156A which is output from the final stage gate circuit 157-1 of the fixed delay circuit 456. The variable delay circuit 458 has a circuit structure the same as the circuit structure of the variable delay circuit 452. A clock signal C158 output from the variable delay circuit 458 is delayed by a fixed delay circuit 459 which has a circuit structure the same as the circuit structure of the fixed delay circuit 453. The fixed delay circuit 459 comprises gate circuits 460-1, 460-2, . . . , 460-n each of which provides a delay time TA.

As mentioned above, in the fourteenth embodiment of the present invention, a delay circuit which delays the main clock signal MC is constituted by the fixed delay circuit 448, a first circuit unit comprising the variable delay circuit 452 and the fixed delay circuit 453, a second circuit unit comprising the variable delay circuit 455 and the fixed delay circuit 456 and a third circuit unit comprising the variable delay circuit 458 and the fixed delay circuit 459.

Additionally, a phase comparator (PC) 461 controls the variable delay circuits 452, 455 and 458 by comparing a phase of the clock signal C150 output from the fixed delay circuit 450 with a phase of a clock signal C159 output from the fixed delay circuit 459 so as to supply the delay time control voltages VC and VCZ to the variable delay circuits 452, 455 and 458 so that a phase of the clock signal C159 output from the fixed delay circuit 459 conforms to the phase of the clock signal C150 output from the fixed delay circuit 450. In this embodiment, a delay locked loop circuit is constituted by the variable delay circuits 452, 455 and 458, the fixed delay circuits 453, 456 and 459 and the phase comparator 461.

A fixed delay circuit 462 delays a clock signal C156B which is output from the (n−p2)th gate circuit 457-(p2+1) of the fixed delay circuit 456. The fixed delay circuit 462 comprises gate circuits (for example, CMOS inverters) 463-1, 463-2, . . . , 463-(k2−k1) each of which provides a delay time TA. It should be noted that k1 is equal to {(TL/TA)L+n+p1−m1}), and k2 is equal to {(TL/TA)L+n+p2−m2}.

Figure 33:
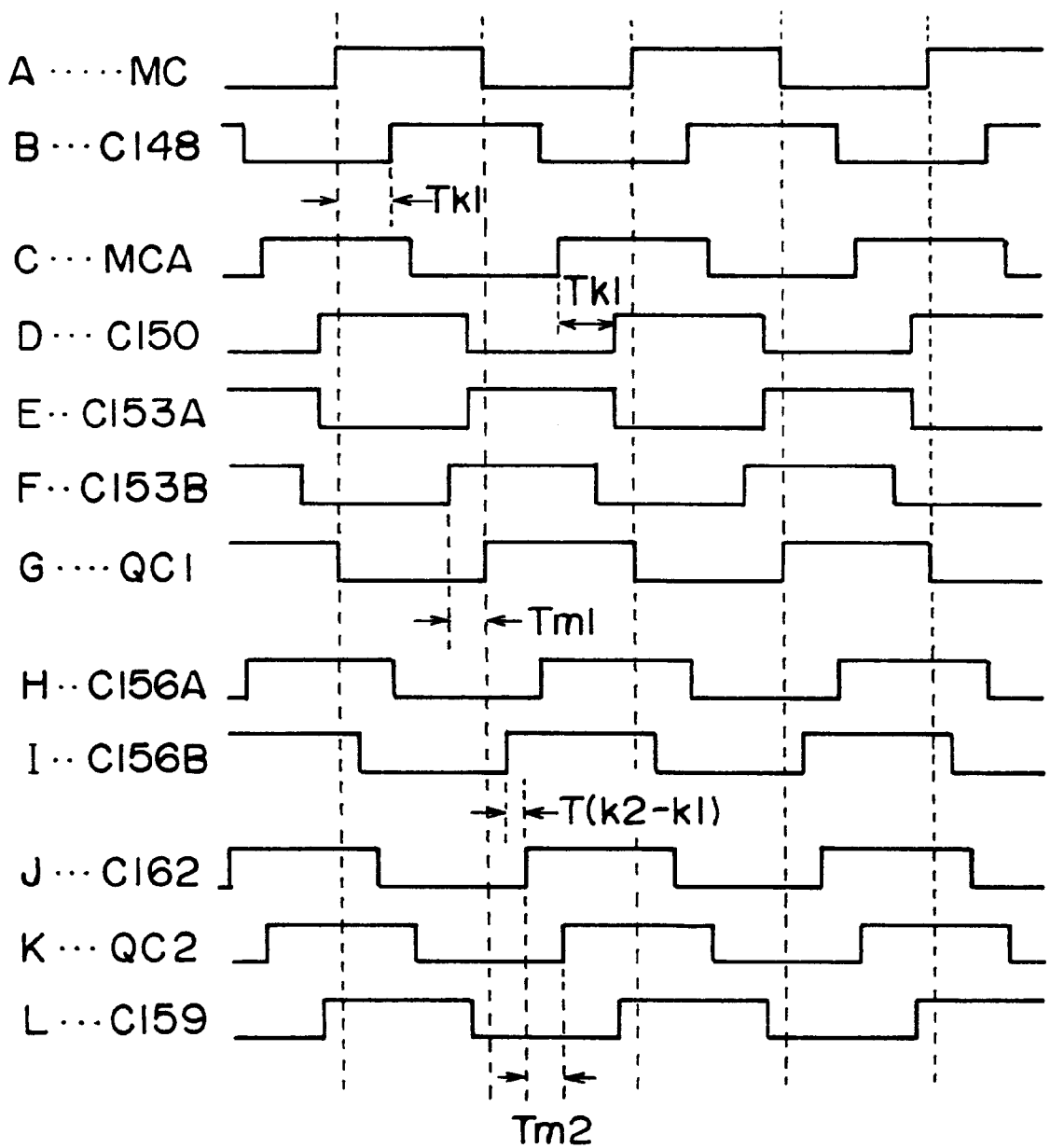
FIG. 33 is a waveform chart for explaining an operation of the semiconductor integrated circuit shown in FIG. 32.

FIG. 33 is a waveform chart for explaining an operation of the circuit shown in FIG. 32. FIG. 33-A indicates the main clock signal MC; FIG. 33-B indicates the clock signal C148 which is output from the fixed delay circuit 448; FIG. 33-C indicates the clock signal MCA; FIG. 33-D indicates the clock signal C150 which is output from the fixed delay circuit 450; FIG. 33-E indicates the clock signal C153A which is output from the final stage gate circuit 454-1 of the fixed delay circuit 453; FIG. 33-F indicates the clock signal C153B which is output from the (n−p1)th gate circuit 454-(p1+1) of the fixed delay circuit 453; FIG. 33-G indicates the clock signal QC1 which is output from the clock transmission circuit 443. Additionally, FIG. 33-H indicates the clock signal C156A which is output from the final stage gate circuit 457-1 of the fixed delay circuit 456; FIG. 33-I indicates the clock signal C156B which is output from the (n−p2)th gate circuit 457-(p2+1) of the fixed delay circuit 456; FIG. 33-J indicates the clock signal C162 which is output from the fixed delay circuit 462; FIG. 33-K indicates the clock signal QC2 which is output from the clock transmission circuit 445; and FIG. 33-L indicates the clock signal C159 which is output from the fixed delay circuit 459.

In the present embodiment, each of the variable delay circuits 452, 455 and 458 has an identical circuit structure, and each of the fixed delay circuits 453, 456 and 459 also has an identical circuit structure.

Accordingly, when the phase difference between the clock signals MC and MCA is 270 degrees, a phase of the clock signal C153A which is output from the final stage gate circuit 454-1 of the fixed delay circuit 453 is delayed by 90 degrees from the phase of the clock signal C148 which is output from the fixed delay circuit 448; a phase of the clock signal C156A which is output from the final stage gate circuit 457-1 of the fixed delay circuit 456 is delayed by 180 degrees from the phase of clock signal C148 which is output from the fixed delay circuit 448; a phase of the clock signal C159 which is output from the fixed delay circuit 459 is delayed by 270 degrees from the phase of the clock signal C148 which is output from the fixed delay circuit 448.

Since the number k1 of the gate circuits of the fixed delay circuit 448 is equal to {(TL/TA)L+n+p1−m1}, a phase of the clock signal C153B, which is output from the (n−p1)th gate circuit 454-(p1+1) of the fixed delay circuit 453, is in advance of a phase of the clock signal C156A, which is output from the final stage gate circuit 457-1 of the fixed delay circuit 456, by a delay time (Tk1+Tm1) which is a sum of a delay time Tk1 of the fixed delay circuit 448 and a delay time Tm1 of the clock transmission circuit 443. Thus, the phase of the clock signal QC1 which is output from the clock transmission circuit 443 is delayed from the phase of the main clock signal MC by 180 degrees.

Additionally, since the number (k2−k1) of the gate circuits of the fixed delay circuit 462 is equal to {(TL/TA)L+n+p2−m2−k1}, a phase of the clock signal C162, which is output from the fixed delay circuit 462, is in advance of a phase of the clock signal C159 output from the fixed delay circuit 459 by a delay time (Tk1+Tm2) which is a sum of the delay time Tk1 of the fixed delay circuit 448 and delay time Tm2 of the clock transmission circuit 445. Thus, the phase of the clock signal QC2 which is output from the clock transmission circuit 445 is delayed from the phase of the main clock signal MC by 270 degrees.

Accordingly, in the fourteenth embodiment of the present invention, the clock signal QC1, which is generated by delaying the main clock signal MC and has the phase delayed by 180 degrees, and the clock signal QC2, which is generated by delaying the main clock signal MC and has the phase delayed by 270 degrees, can be provided to the circuit 442 irrespective of a process condition, a temperature change or a level of the power source voltage.

Figure 34:
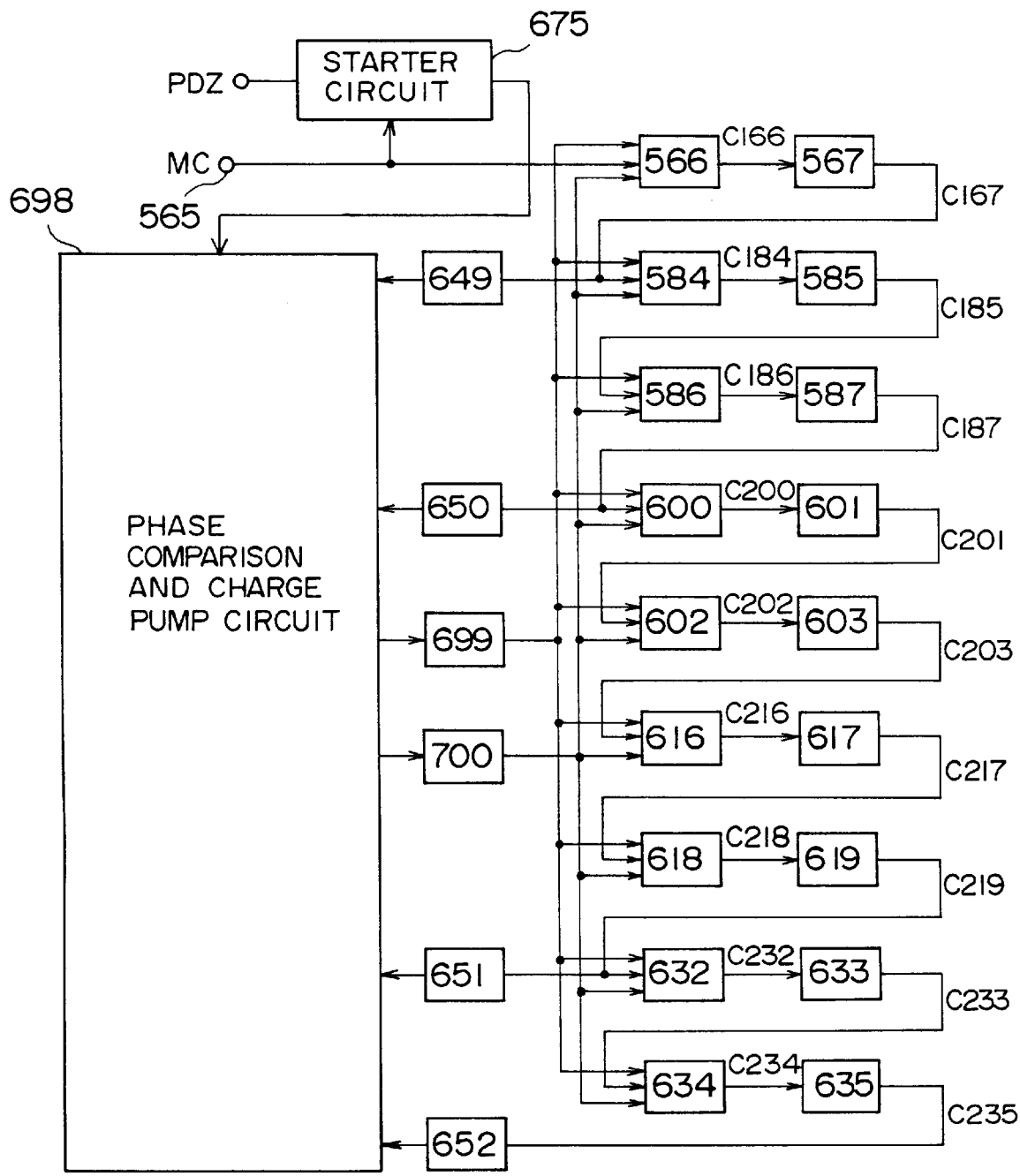
FIG. 34 is a block diagram of a part of a semiconductor integrated circuit according to a fifteenth embodiment of the present invention.

A description will now be given, with reference to FIGS. 34 to 52, of a fifteenth embodiment of the present invention. FIG. 34 is a block diagram of a part of a semiconductor integrated circuit according to the fifteenth embodiment of the present invention.

In FIG. 34, the main clock signal MC is input to a main clock terminal 565. The main clock signal MC is delayed by a variable delay circuit 566. A clock signal C166 which is output from the variable delay circuit 566 is delayed by a fixed delay circuit 567. Circuit structures of the variable delay circuit 566 and the fixed delay circuit 567 are shown in FIG. 35.

Figure 35:
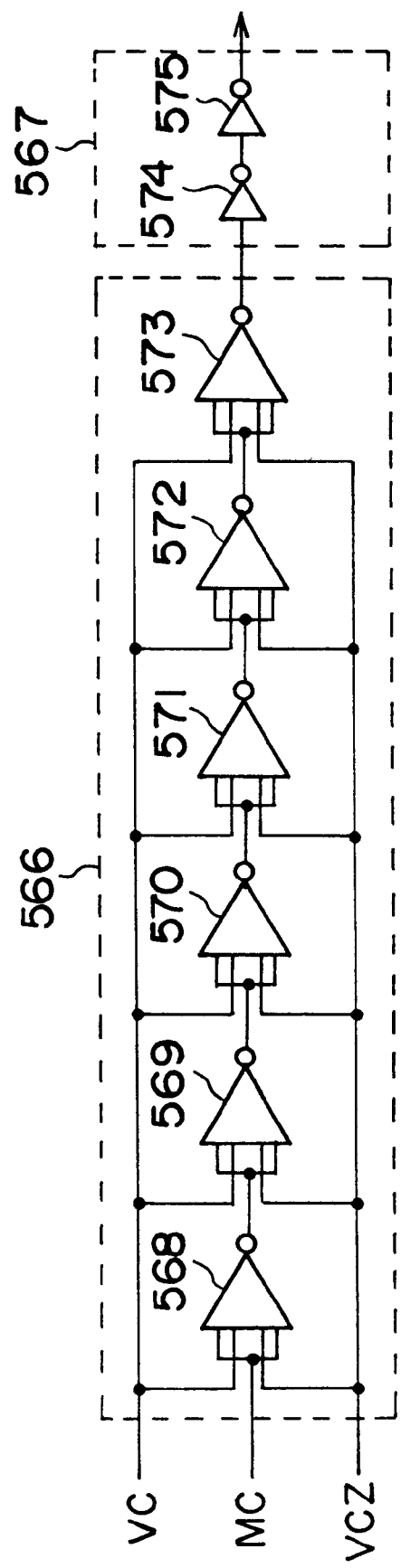
FIG. 35 is a circuit diagram of a variable delay circuit and a fixed delay circuit shown in FIG. 34.
Figure 37:
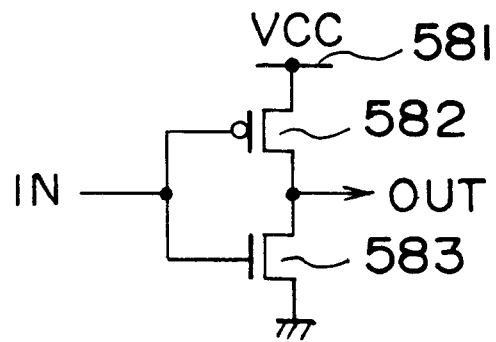
FIG. 37 is a circuit diagram of an inverter shown in FIG. 35.

As shown in FIG. 35, the variable delay circuit 566 comprises variable delay inverters 568 to 573 and inverters 574 and 575. Each of the variable delay inverters 568 to 573 provides a variable delay time. The inverters 574 and 575 each provide a fixed delay time. A circuit structure of each of the variable delay inverters 568 to 573 is shown in FIG. 36, and a circuit structure of each of the inverters 574 and 575 is shown in FIG. 37.

As shown in FIG. 36, each of the variable delay inverters 568 to 573 comprises a VCC power source line 576, pMOS transistors 577 and 578 and nMOS transistors 579 and 580. As shown in FIG. 37, each of the inverters 574 and 575 comprises a VCC power source line 581, a pMOS transistor 582 and an nMOS transistor 583.

Additionally, in FIG. 34, a clock signal C167 which is output from the fixed delay circuit 567 is delayed by a variable delay circuit 584. A clock signal C184 which is output from the variable delay circuit 584 is delayed by a fixed delay circuit 585. A clock signal C185 which is output from the fixed delay circuit 585 is delayed by a variable delay circuit 586. A clock signal C186 which is output from the variable delay circuit 586 is delayed by a fixed delay circuit 587.

Figure 38:
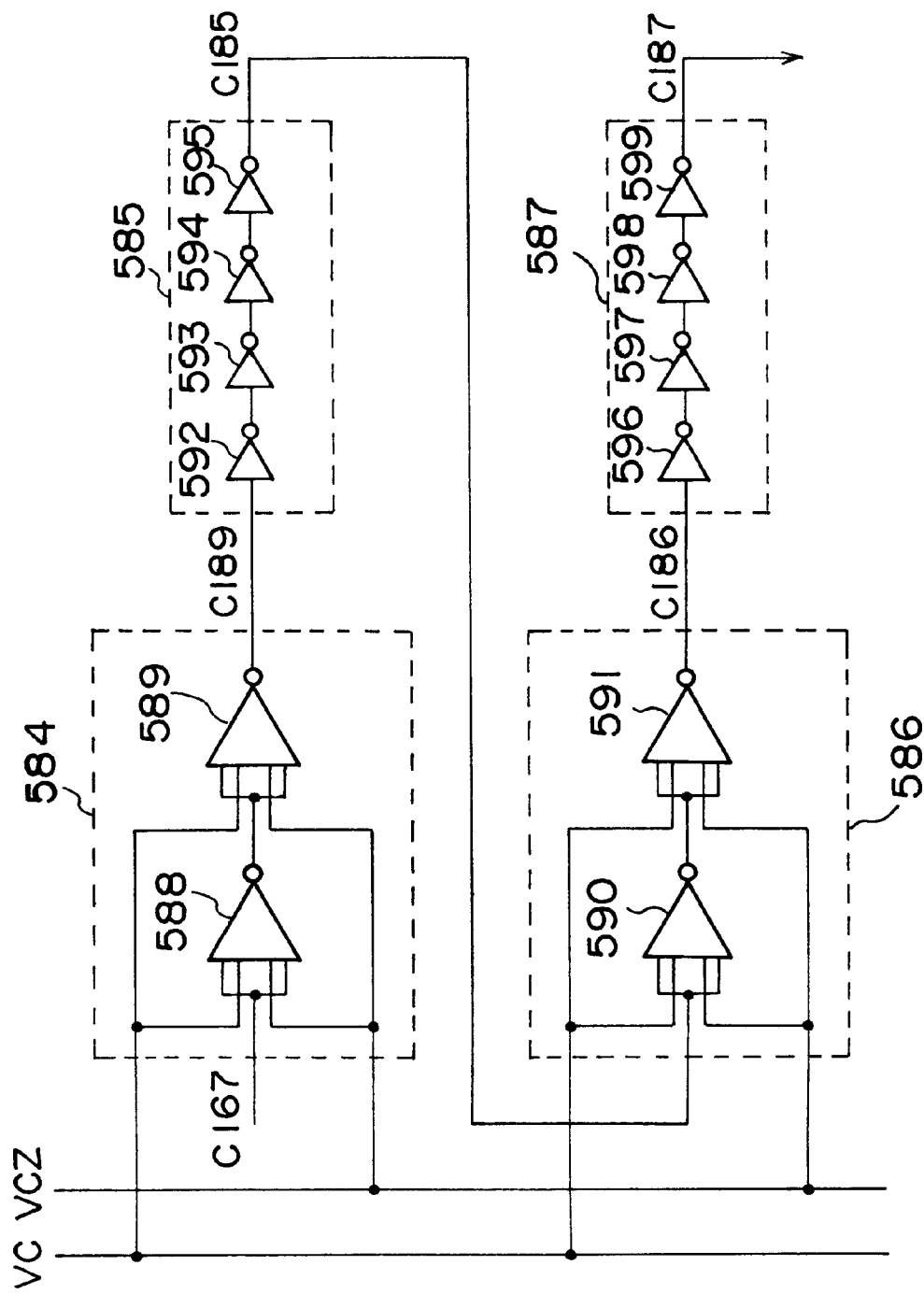
FIG. 38 is a circuit diagram of variable delay circuits and fixed delay circuits shown in FIG. 34.

FIG. 38 is a circuit diagram of the variable delay circuits 584 and 586 and the fixed delay circuits 585 and 587. The variable delay circuit 584 comprises variable delay inverters 588 and 589, and the variable delay circuit 586 comprises variable delay inverters 590 and 591. Each of the variable delay inverters 588 to 591 has a circuit structure the same as the circuit shown in FIG. 36. The fixed delay circuit 585 comprises inverters 592 to 595, and the fixed delay circuit 587 comprises inverters 596 to 599. Each of the inverters 592 to 599 has a circuit structure the same as the circuit shown in FIG. 37.

Additionally, in FIG. 34 a clock signal C187 which is output from the fixed delay circuit 587 is delayed by a variable delay circuit 600. A clock signal C200 which is output from the variable delay circuit 600 is delayed by a fixed delay circuit 601. A clock signal C201 which is output from the fixed delay circuit 601 is delayed by a variable delay circuit 602. A clock signal C202 which is output from the variable delay circuit 602 is delayed by a fixed delay circuit 603.

Figure 39:
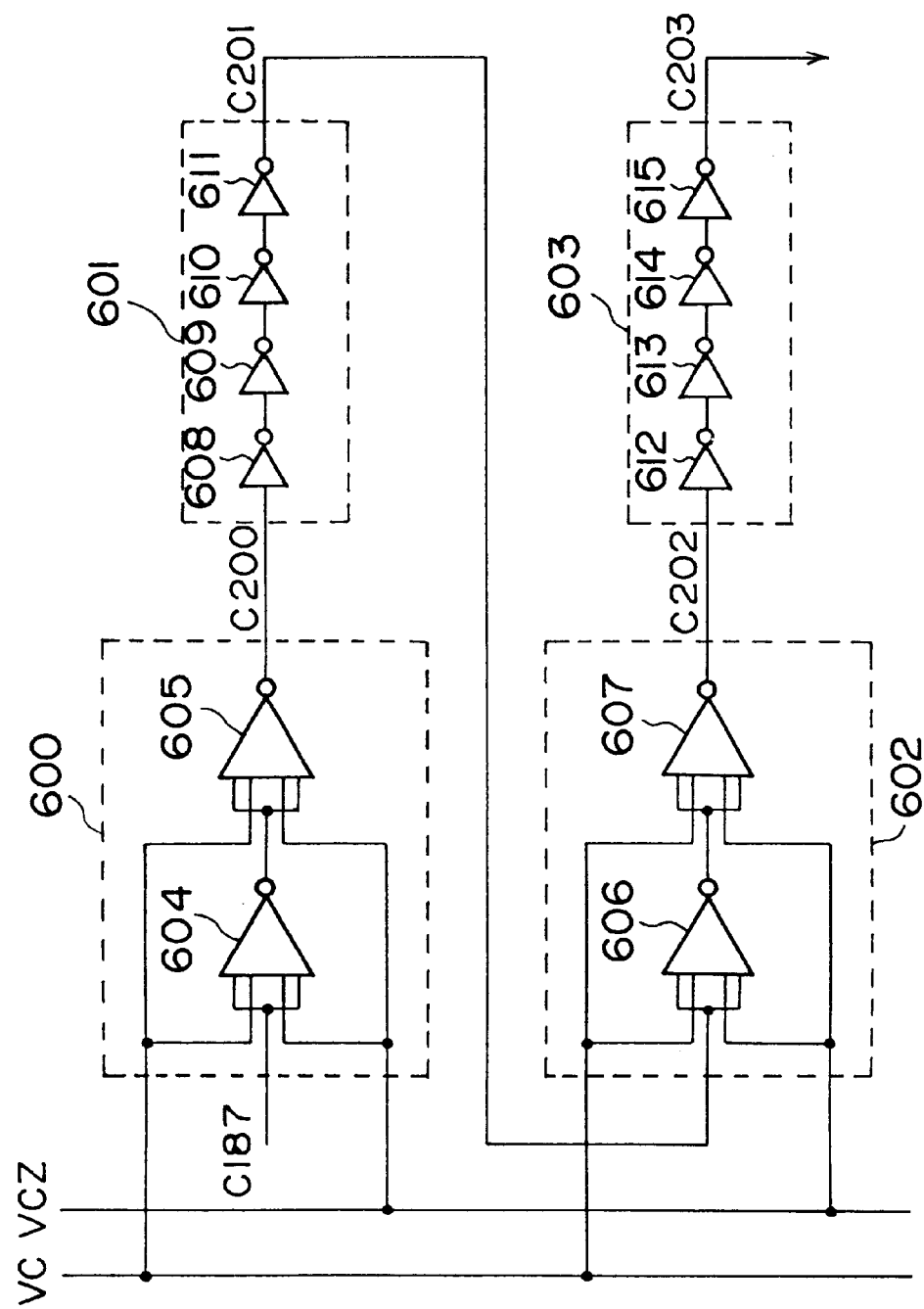
FIG. 39 is a circuit diagram of variable delay circuits and fixed delay circuits shown in FIG. 34.

FIG. 39 is a circuit diagram of the variable delay circuits 600 and 602 and the fixed delay circuits 601 and 603. The variable delay circuit 600 comprises variable delay inverters 604 and 605, and the variable delay circuit 602 comprises variable delay inverters 606 and 607. Each of the variable delay inverters 604 to 607 has a circuit structure the same as the circuit shown in FIG. 36. The fixed delay circuit 601 comprises inverters 608 to 611, and the fixed delay circuit 603 comprises inverters 612 to 615. Each of the inverters 608 to 615 has a circuit structure the same as the circuit shown in FIG. 37.

Additionally, in FIG. 34 a clock signal C203 which is output from the fixed delay circuit 603 is delayed by a variable delay circuit 616. A clock signal C216 which is output from the variable delay circuit 616 is delayed by a fixed delay circuit 617. A clock signal C217 which is output from the fixed delay circuit 617 is delayed by a variable delay circuit 618. A clock signal C218 which is output from the variable delay circuit 618 is delayed by a fixed delay circuit 619.

Figure 40:
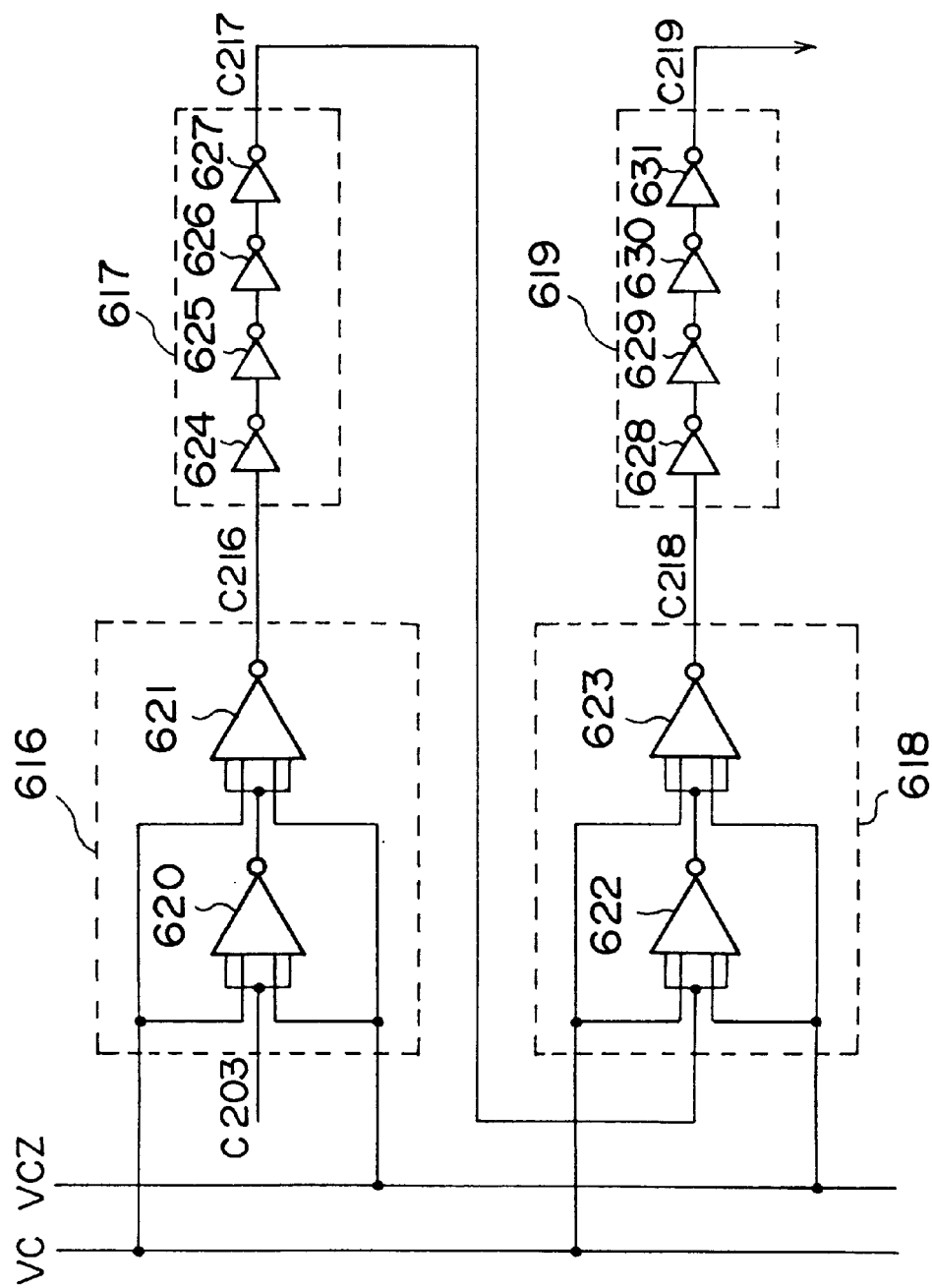
FIG. 40 is a circuit diagram of variable delay circuits and fixed delay circuits shown in FIG. 34.

FIG. 40 is a circuit diagram of the variable delay circuits 616 and 618 and the fixed delay circuits 617 and 619. The variable delay circuit 616 comprises variable delay inverters 620 and 621, and the variable delay circuit 618 comprises variable delay inverters 622 and 623. Each of the variable delay inverters 620 to 623 has a circuit structure the same as the circuit shown in FIG. 36. The fixed delay circuit 617 comprises inverters 624 to 627, and the fixed delay circuit 619 comprises inverters 628 to 631. Each of the inverters 624 to 631 has a circuit structure the same as the circuit shown in FIG. 37.

Additionally, in FIG. 34 a clock signal C219 which is output from the fixed delay circuit 619 is delayed by a variable delay circuit 632. A clock signal C232 which is output from the variable delay circuit 632 is delayed by a fixed delay circuit 633. A clock signal C233 which is output from the fixed delay circuit 633 is delayed by a variable delay circuit 634. A clock signal C234 which is output from the variable delay circuit 634 is delayed by a fixed delay circuit 635.

Figure 41:
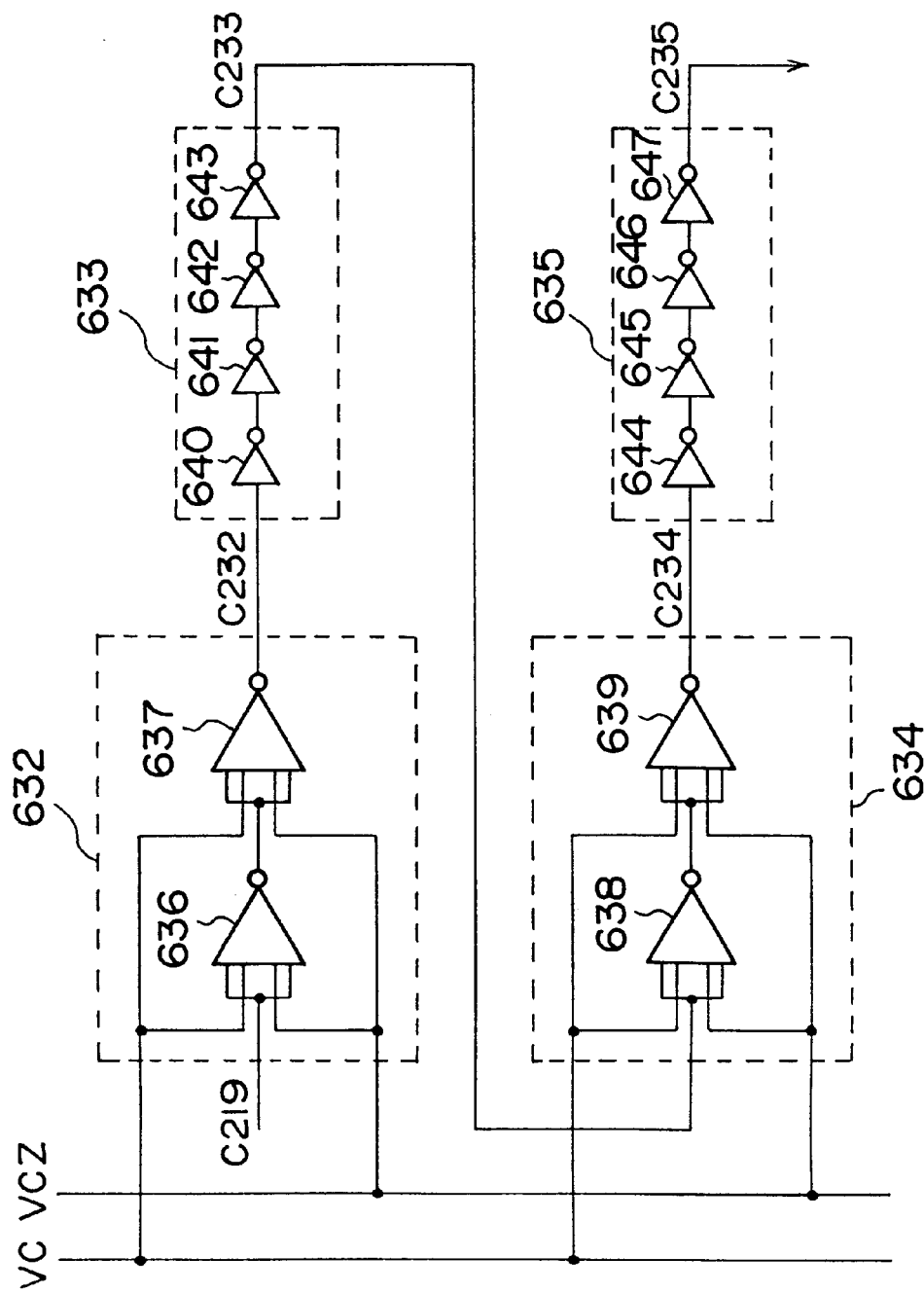
FIG. 41 is a circuit diagram of variable delay circuits and fixed delay circuits shown in FIG. 34.

FIG. 41 is a circuit diagram of the variable delay circuits 632 and 634 and the fixed delay circuits 633 and 635. The variable delay circuit 632 comprises variable delay inverters 636 and 637, and the variable delay circuit 634 comprises variable delay inverters 638 and 639. Each of the variable delay inverters 636 to 639 has a circuit structure the same as the circuit shown in FIG. 36. The fixed delay circuit 633 comprises inverters 640 to 643, and the fixed delay circuit 635 comprises inverters 644 to 647. Each of the inverters 640 to 647 has a circuit structure the same as the circuit shown in FIG. 37.

As mentioned above, in the fifteenth embodiment of the present invention, a delay circuit which delays the main clock signal MC is constituted by a first delay circuit unit comprising the variable delay circuit 566 and the fixed delay circuit 567, a second delay circuit unit comprising the variable delay circuit 584 and the fixed delay circuit 585, a third delay circuit unit comprising the variable delay circuit 586 and the fixed delay circuit 587, a fourth delay circuit unit comprising the variable delay circuit 600 and the fixed delay circuit 601, a fifth delay circuit unit comprising the variable delay circuit 602 and the fixed delay circuit 603, a sixth delay circuit unit comprising the variable delay circuit 616 and the fixed delay circuit 617, a seventh delay circuit unit comprising the variable delay circuit 618 and the fixed delay circuit 619, an eighth delay circuit unit comprising the variable delay circuit 632 and the fixed delay circuit 633 and a ninth delay circuit unit comprising the variable delay circuit 634 and the fixed delay circuit 635.

Additionally, in FIG. 34, the clock signal C167 which is output from the fixed delay circuit 567 is supplied to a fixed delay circuit 649 which generates a clock signal for driving a phase comparison and charge pump circuit 698. The clock signal C187 which is output from the fixed delay circuit 587 is supplied to a fixed delay circuit 650 which generates a clock signal for driving the phase comparison and charge pump circuit 698. The clock signal C219 which is output from the fixed delay circuit 619 is supplied to a fixed delay circuit 651 which generates a clock signal for driving the phase comparison and charge pump circuit 698. The clock signal C235 which is output from the fixed delay circuit 635 is supplied to a fixed delay circuit 652 which generates a clock signal for driving the phase comparison and charge pump circuit 698.

Figure 42A:
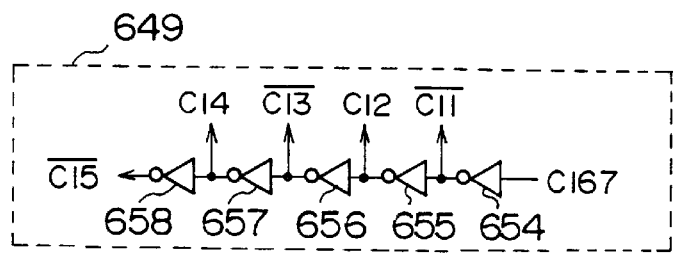
FIG. 42A is a circuit diagram of a first fixed delay circuit shown in shown in FIG. 34.
Figure 42B:
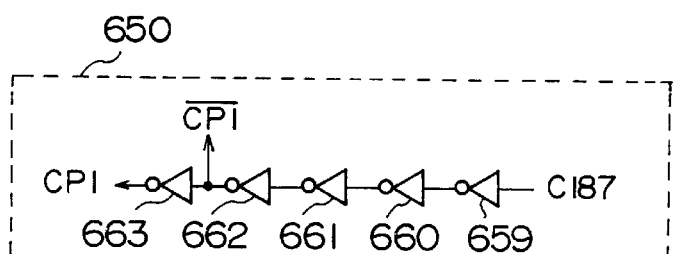
FIG. 42B is a circuit diagram of a second fixed delay circuit shown in shown in FIG. 34.
Figure 42C:
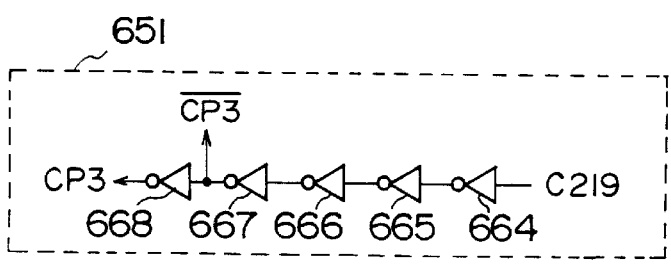
FIG. 42C is a circuit diagram of a third fixed delay circuit shown in shown in FIG. 34.
Figure 42D:
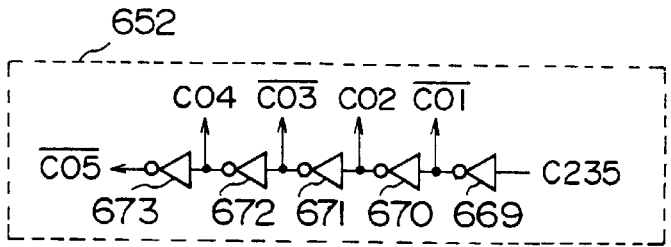
FIG. 42D is a circuit diagram of a fourth fixed delay circuit shown in shown in FIG. 34.

FIGS. 4A to 42D are circuit diagrams of the fixed delay circuits 649 to 652, respectively. As shown in FIG. 42A, the fixed delay circuit 649 comprises inverters 654 to 658 which are connected in series. As shown in FIG. 42B, the fixed delay circuit 650 comprises inverters 659 to 663 which are connected in series. As shown in FIG. 42C, the fixed delay circuit 651 comprises inverters 664 to 668 which are connected in series. As shown in FIG. 42D, the fixed delay circuit 652 comprises inverters 669 to 673 which are connected in series.

Figure 43:
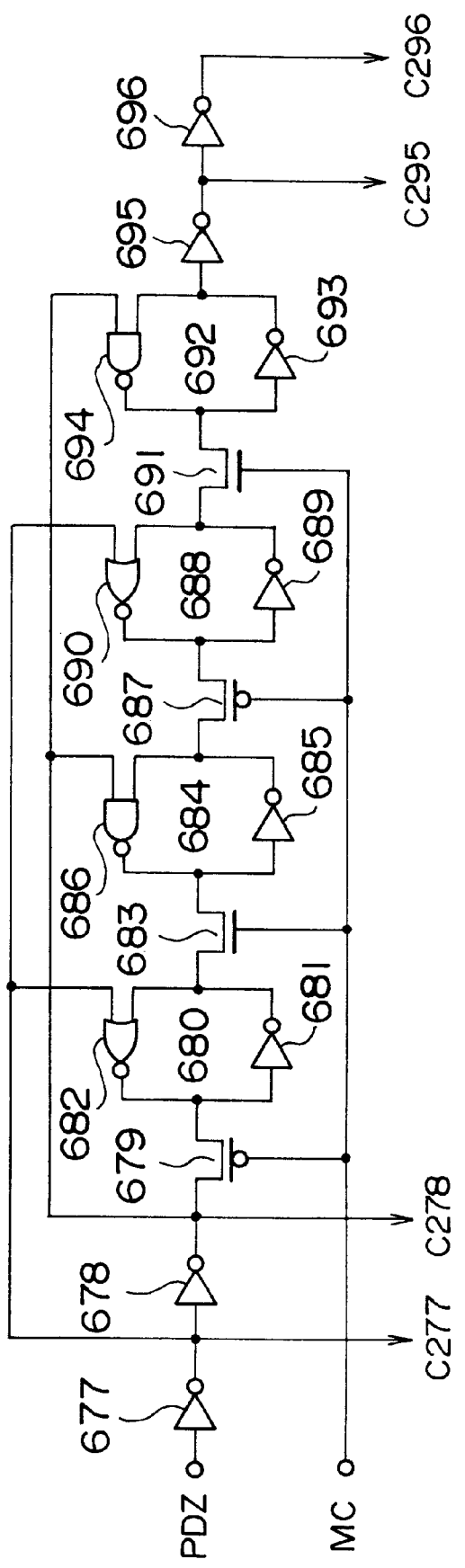
FIG. 43 is a circuit diagram of a starter circuit shown in FIG. 34.

Referring to FIG. 34, a power down signal PDZ is supplied to a starter circuit 675 which controls a start of the phase comparison and charge pump circuit 698. A circuit structure of the starter circuit 675 is shown in FIG. 43. In FIG. 43, the power down signal PDZ is inverted by an inverter 677. Then, a output of the inverter 677 is inverted by an inverter 678.

An on/off operation of a pMOS transistor 679, which is a switch element, is controlled by the main clock signal MC. A latch circuit 680 is constituted by an inverter 681 and a NOR circuit 682.

An on/off operation of an nMOS transistor 683, which is a switch element, is controlled by the main clock signal MC. A latch circuit 684 is constituted by an inverter 685 and a NAND circuit 686.

An on/off operation of a pMOS transistor 687, which is a switch element, is controlled by the main clock signal MC. A latch circuit 688 is constituted by an inverter 689 and a NOR circuit 690.

An on/off operation of an nMOS transistor 691, which is a switch element, is controlled by the main clock signal MC. A latch circuit 692 is constituted by an inverter 693 and a NAND circuit 694.

Additionally, an output of the latch circuit 692 is inverted by an inverter 695. An output of the inverter 695 is inverted by an inverter 696.

Referring to FIG. 34, the phase comparison and charge pump circuit 698 compares the clock signal C167 output from the fixed delay circuit 667 with the clock signal C235 which is output from the fixed delay circuit 635 so as to perform a pumping operation for providing a control voltage for the variable delay circuits so that the clock signal C235 synchronizes with the clock signal C167. A delay time control voltage generating and smoothing circuit 699 generates the delay time control voltage VC in response to the pumping operation of the phase comparison and charge pump circuit 698. A delay time control voltage generating and smoothing circuit 700 generates the delay time control voltage VCZ in response to the pumping operation of the phase comparison and charge pump circuit 698.

Figure 44:
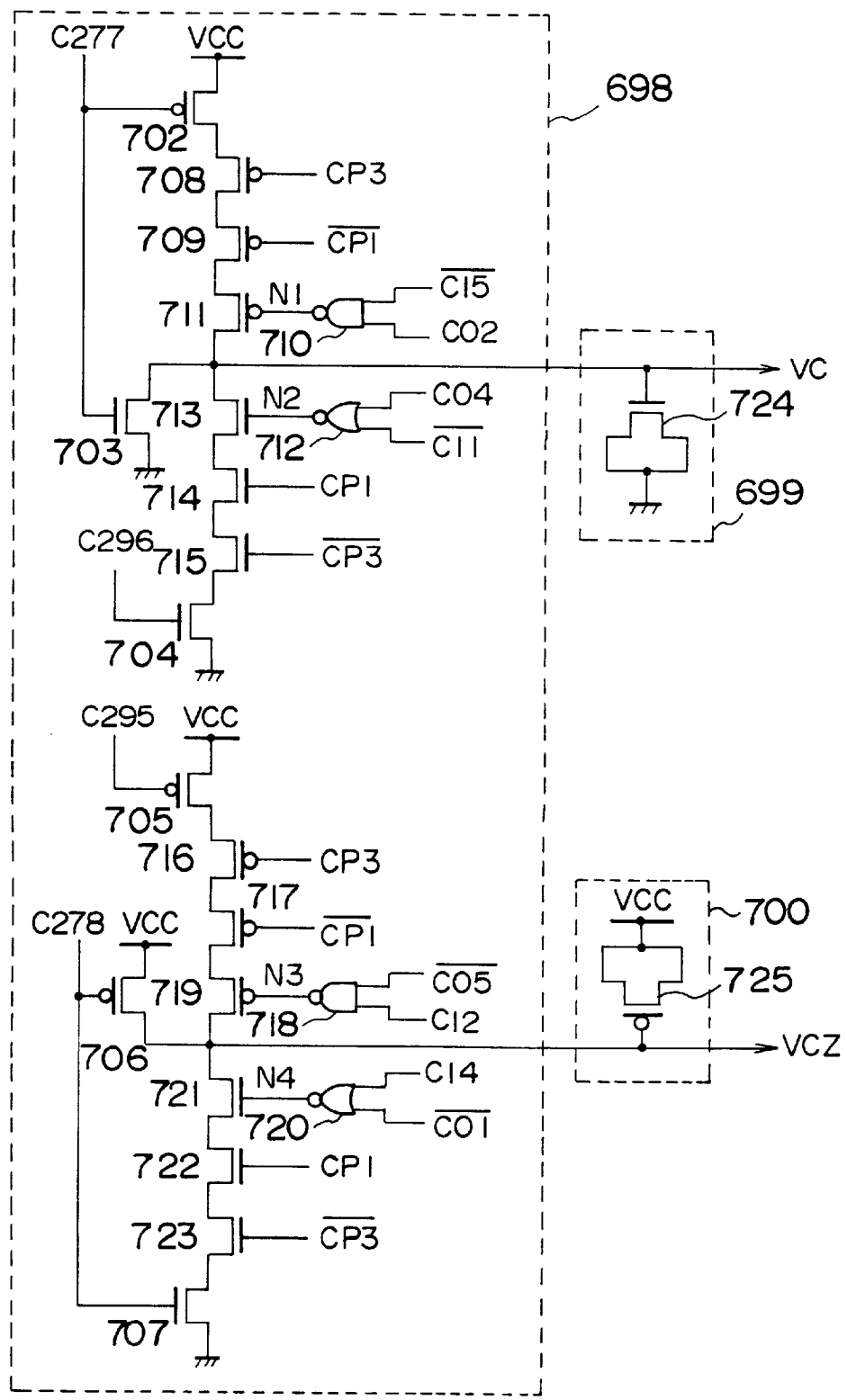
FIG. 44 is a circuit diagram of a phase comparison and charge pump circuit and delay time control voltage generating and smoothing circuits shown in FIG. 34.

FIG. 44 is a circuit diagram of the phase comparison and charge pump circuit 698 and the delay time control voltage generating and smoothing circuits 699 and 700.

In the phase comparison and charge pump circuit 698 shown in FIG. 44, an on/off operation of a pMOS transistor 702 is controlled by an output C277 of the inverter 677 of the starter circuit 675, and an on/off operation of an nMOS transistor 703 is controlled by the output C277 of the inverter 677 of the starter circuit 675. An on/off operation of an nMOS transistor 704 is controlled by an output C296 of the inverter 696 of the starter circuit 675.

Additionally, an on/off operation of a pMOS transistor 705 is controlled by an output C295 of the inverter 695 of the starter circuit 675. An on/off operation of a pMOS transistor 706 is controlled by an output C278 of the inverter 678 of the starter circuit 675. An on/off operation of an nMOS transistor 707 is controlled by the output C278 of the inverter 678 of the starter circuit 675.

An on/off operation of a pMOS transistor 708 is controlled by a clock signal CP3 which is output from the inverter 668 of the fixed delay circuit 651. An on/off operation of an inverter 709 is controlled by a clock signal /CP1 output from the inverter 662 of the fixed delay circuit 650.

A NAND circuit 710 performs a NAND operation on a clock signal /C15 output from the inverter 658 of the fixed delay circuit 649 and a clock signal C02 output from the inverter 670 of the fixed delay circuit 652. An on/off operation of a pMOS transistor 711 is controlled by an output of the NAND circuit 710.

A NOR circuit 712 performs a NOR operation on a clock signal C04 output from the inverter 672 of the fixed delay circuit 652 and a clock signal /CI1 output from the inverter 654 of the fixed delay circuit 649. An on/off operation of an nMOS transistor 713 is controlled by an output of the NOR circuit 712.

An on/off operation of an nMOS transistor 714 is controlled by a clock signal CP1 output from the inverter 663 of the fixed delay circuit 650. An on/off operation of an nMOS transistor 715 is controlled by a clock signal /CP3 output from the inverter 667 of the starter circuit 651.

An on/off operation of a pMOS transistor 716 is controlled by the clock signal CP3 which is output from the inverter 668 of the fixed delay circuit 651. An on/off operation of a pMOS transistor 717 is controlled by the clock signal /CP1 output from the inverter 662 of the fixed delay circuit 650.

A NAND circuit 718 performs a NAND operation on a clock signal /C05 output from the inverter 673 of the fixed delay circuit 652 and a clock signal CI2 output from the inverter 655 of the fixed delay circuit 649. An on/off operation of a pMOS transistor 719 is controlled by an output of the NAND circuit 718.

A NOR circuit 720 performs a NOR operation on a clock signal CI4 output from the inverter 657 of the fixed delay circuit 649 and a clock signal /CO1 output from the inverter 669 of the fixed delay circuit 652. An on/off operation of an nMOS transistor 721 is controlled by an output of the NOR circuit 720.

An on/off operation of an nMOS transistor 722 is controlled by the clock signal CP1 output from the inverter 663 of the fixed delay circuit 650. An on/off operation of an nMOS transistor 723 is controlled by the clock signal /CP3 output from the inverter 667 of the fixed delay circuit 651.

In the delay time control voltage generating and smoothing circuit 699, a capacitor 724 comprises an nMOS transistor. In the delay time control voltage generating and smoothing circuit 700, a capacitor 725 comprises a pMOS transistor.

As mentioned above, in the present embodiment, a first phase comparison and charge pump circuit is constituted by the pMOS transistors 702, 708, 709 and 711, the nMOS transistors 703, 704, 713, 714 and 715, the NAND circuit 710 and the NOR circuit 712. The first phase comparison and charge pump circuit compares the clock signal C167 which is output from the fixed delay circuit 567 with the clock signal C235 which is output from the fixed delay circuit 635 so as to perform a pumping operation for the capacitor 724.

Additionally, a second phase comparison and charge pump circuit is constituted by the pMOS transistors 705, 706, 716, 717 and 719, the nMOS transistors 707, 721, 722 and 723, the NAND circuit 718 and the NOR circuit 720. The second phase comparison and charge pump circuit compares the clock signal C167 which is output from the fixed delay circuit 567 with the clock signal C235 which is output from the fixed delay circuit 635 so as to perform a pumping operation for the capacitor 725.

It should be noted that, in the first phase comparison and charge pump circuit, the NAND circuit 710 and the NOR circuit 712 serve a main function of a comparator which compares the clock signal C167 output from the fixed delay circuit 567 with the clock signal C235 output from the fixed delay circuit 635. Additionally, the pMOS transistor 702 and the nMOS transistor 703 serve to cut a current during a power down period. Further, the nMOS transistor 704 serves as a starter. The pMOS transistors 708 and 709 and the nMOS transistors 714 and 715 perform a pull-in operation when a large phase offset occurs.

Additionally, in the second phase comparison and charge pump circuit, the NAND circuit 718 and the NOR circuit 720 serve a main function of a comparator which compares the clock signal C167 output from the fixed delay circuit 567 with the clock signal C235 output from the fixed delay circuit 635. Additionally, the pMOS transistor 706 and the nMOS transistor 707 serve to cut a current during a power down period. Further, the pMOS transistor 707 serves as a starter. The pMOS transistors 716 and 717 and the nMOS transistors 722 and 723 perform a pull-in operation when a large phase offset occurs.

In the starter circuit 675 of the present embodiment, the power down signal PDZ is at a low level (L-level) before the phase comparison and charge pump circuit 698 is started. As a result, in the starter circuit 675, the output C277 of the inverter 677 is at a high level (H-level), the output C278 of the inverter 678 is at the L-level, the output C295 of the inverter 695 is at the H-level, and the output C296 of the inverter 696 is at the L-level.

As a result, in the phase comparison and charge pump circuit 698, the pMOS transistor 702 is turned off, the nMOS transistor 703 is turned on, the nMOS transistor 704 is turned off, the pMOS transistor 705 is turned off, the pMOS transistor 706 is turned on, and the nMOS transistor 707 is turned off.

Accordingly, in this case, the nMOS capacitor 724 and the pMOS capacitor 725 are in a discharged state, and the delay time control voltage VC is equal to zero volts and the delay time control voltage VCZ is equal to the power source voltage VCC.

When the power down signal PDZ is changed to the H-level, the output C277 of the inverter 677 is changed to the L-level and the output C278 of the inverter 678 is changed to the H-level.

As a result, in the phase comparison and charge pump circuit 698, the pMOS transistor 702 is turned on, the nMOS transistor 703 is turned off, the pMOS transistor 706 is turned off, and the nMOS transistor 707 is turned on. Thus, the nMOS capacitor 724 and the pMOS capacitor 725 are rapidly charged because nMOS transistor 704 and the pMOS transistor 705 are still off.

Thereafter, when two periods of the main clock signal MC has passed, the output C295 of the inverter 695 is changed to the L-level, and the output C296 of the inverter 696 is changed to the H-level.

As a result, in the phase comparison and charge pump circuit 698, the nMOS transistor 704 is turned on and the pMOS transistor 705 is turned on. Thus, the phase comparison and charge pump circuit 698 is set in a state where a regular operation is performed.

Figure 45:
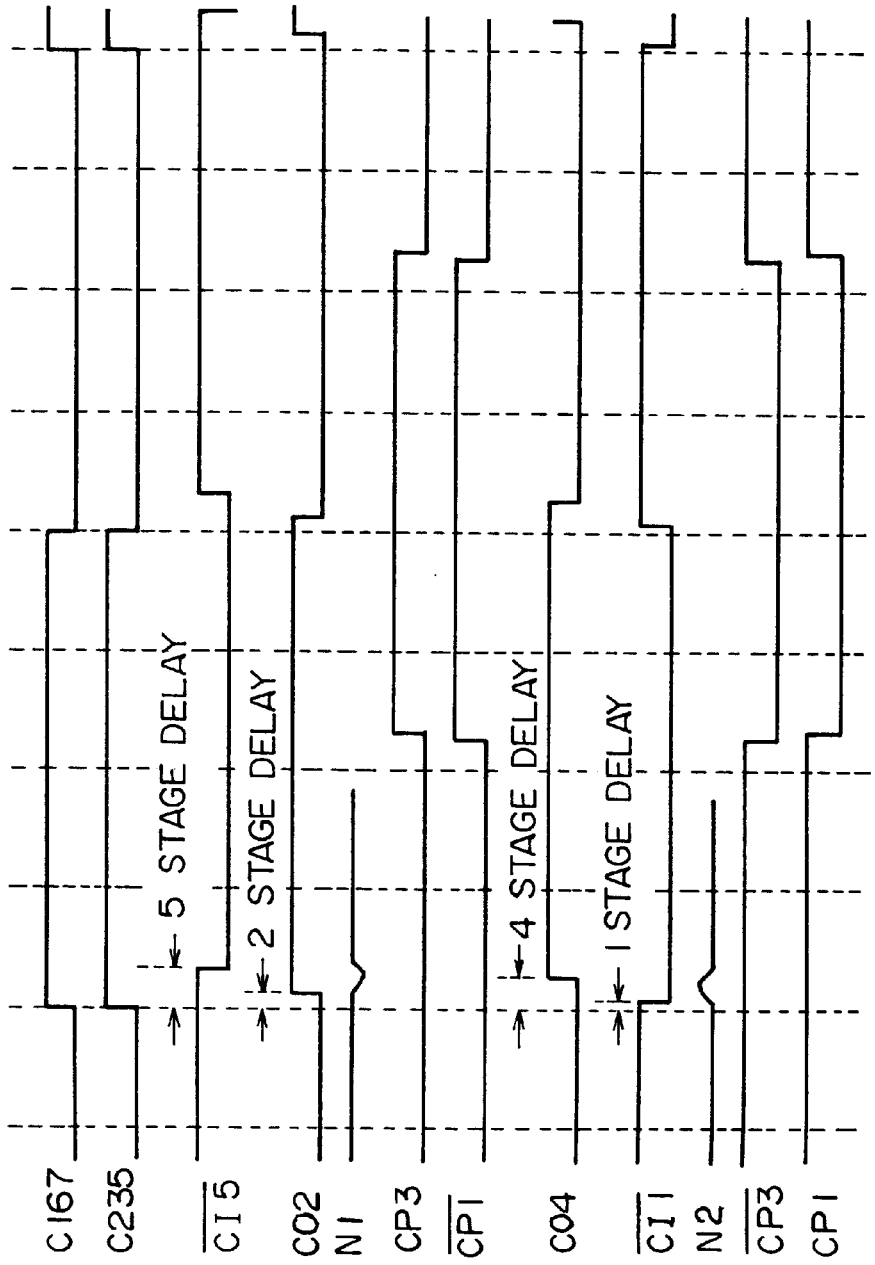
FIG. 45 is a waveform chart of an operation of the phase comparison and charge pump circuit shown in FIG. 34.
Figure 46:
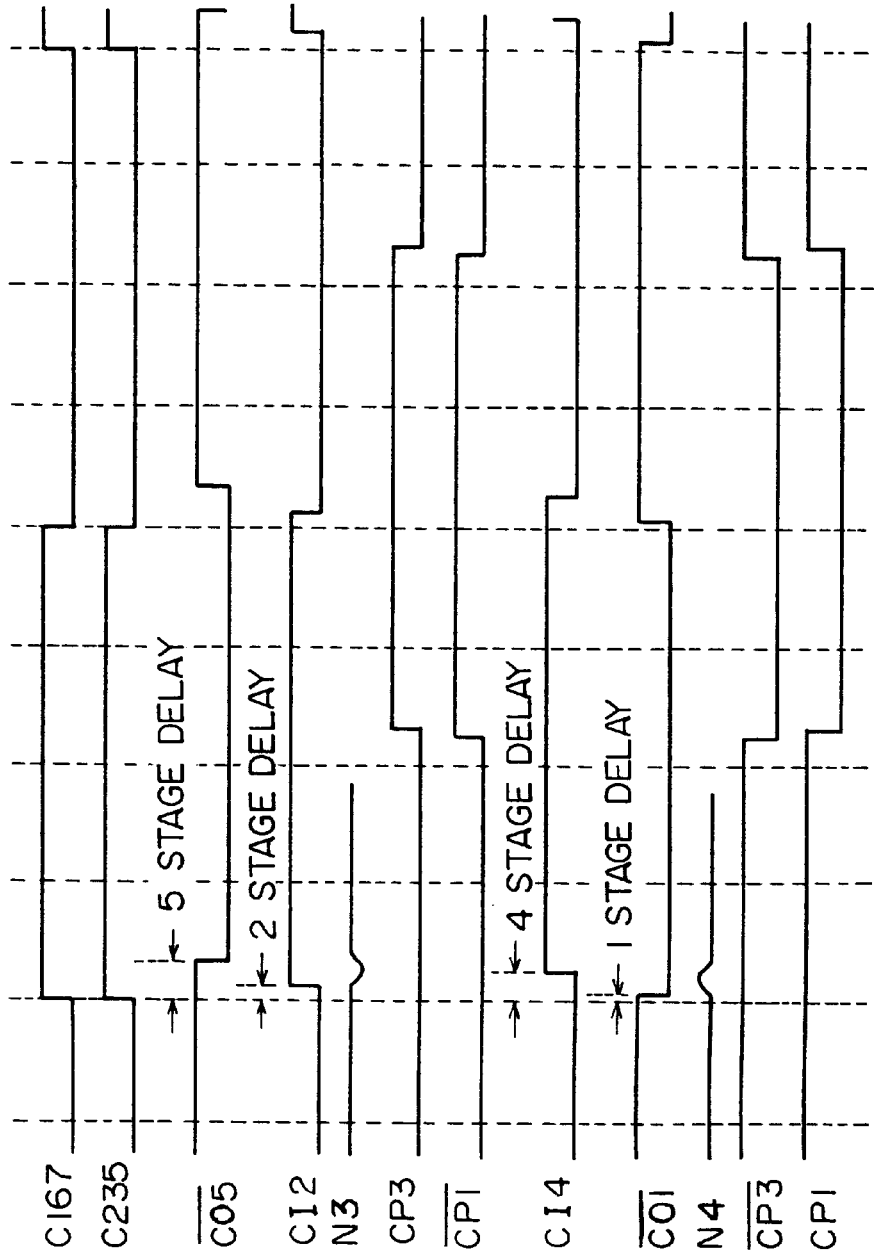
FIG. 46 is a waveform chart of an operation of the phase comparison and charge pump circuit shown in FIG. 34.

FIGS. 45 to 52 are waveform charts for explaining an operation of the phase comparison and charge pump circuit 698. FIGS. 45 and 46 show a case in which the clock signal C235 output from the fixed delay circuit 635 synchronizes with the clock signal C167 output from the fixed delay circuit 567.

In this case, as shown in FIG. 45, a period, during which the clock signal /CI5 output from the inverter 658 of the fixed delay circuit 649 overlaps the clock signal C02 output from the inverter 670 of the fixed delay circuit 652 at the H-level, corresponds to a total delay time of the gate circuits corresponding to three stages. Thus, a voltage which is sufficient for turning on the pMOS transistor 711 is not output from the NAND circuit 710.

Additionally, as shown in FIG. 45, a period, during which the clock signal C04 output from the inverter 672 of the fixed delay circuit 652 overlaps the clock signal /CI1 output from the inverter 654 of the fixed delay circuit 649 at the L-level, corresponds to a total delay time of the gate circuits corresponding to three stages. Thus, a voltage which is sufficient for turning on the nMOS transistor 713 is not output from the NOR circuit 712.

As shown in FIG. 46, a period, during which the clock signal /CO5 output from the inverter 673 of the fixed delay circuit 652 overlaps the clock signal CI2 output from the inverter 655 of the fixed delay circuit 649 at the H-level, corresponds to a total delay time of the gate circuits corresponding to three stages. Thus, a voltage which is sufficient for turning on the pMOS transistor 719 is not output from the NAND circuit 718.

Additionally, as shown in FIG. 46, a period, during which the clock signal CI4 output from the inverter 657 of the fixed delay circuit 649 overlaps the clock signal /CO1 output from the inverter 669 of the fixed delay circuit 652 at the L-level, corresponds to a total delay time of the gate circuits corresponding to three stages. Thus, a voltage which is sufficient for turning on the nMOS transistor 721 is not output from the NOR circuit 720.

Figure 47:
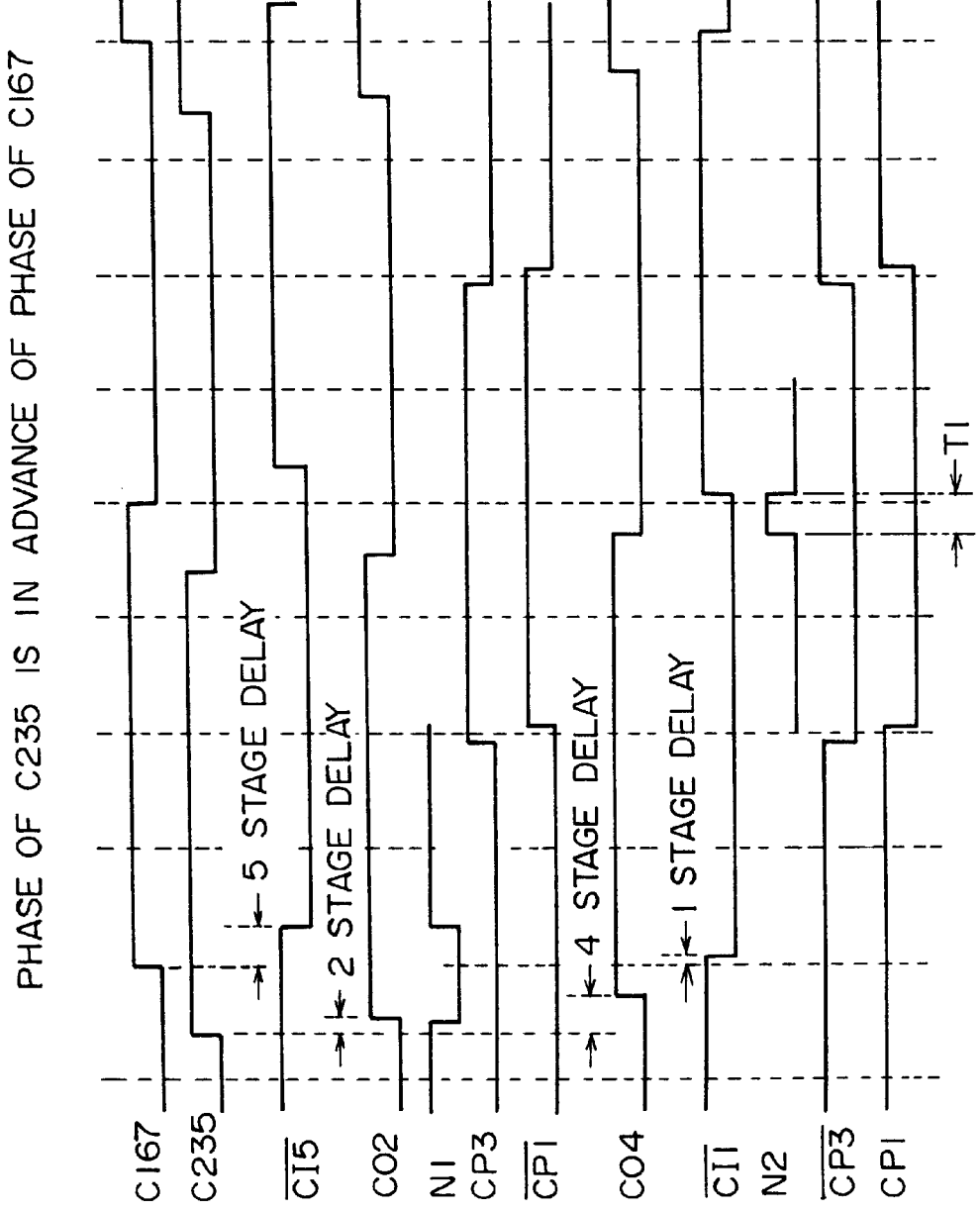
FIG. 47 is a waveform chart of an operation of the phase comparison and charge pump circuit shown in FIG. 34.
Figure 48:
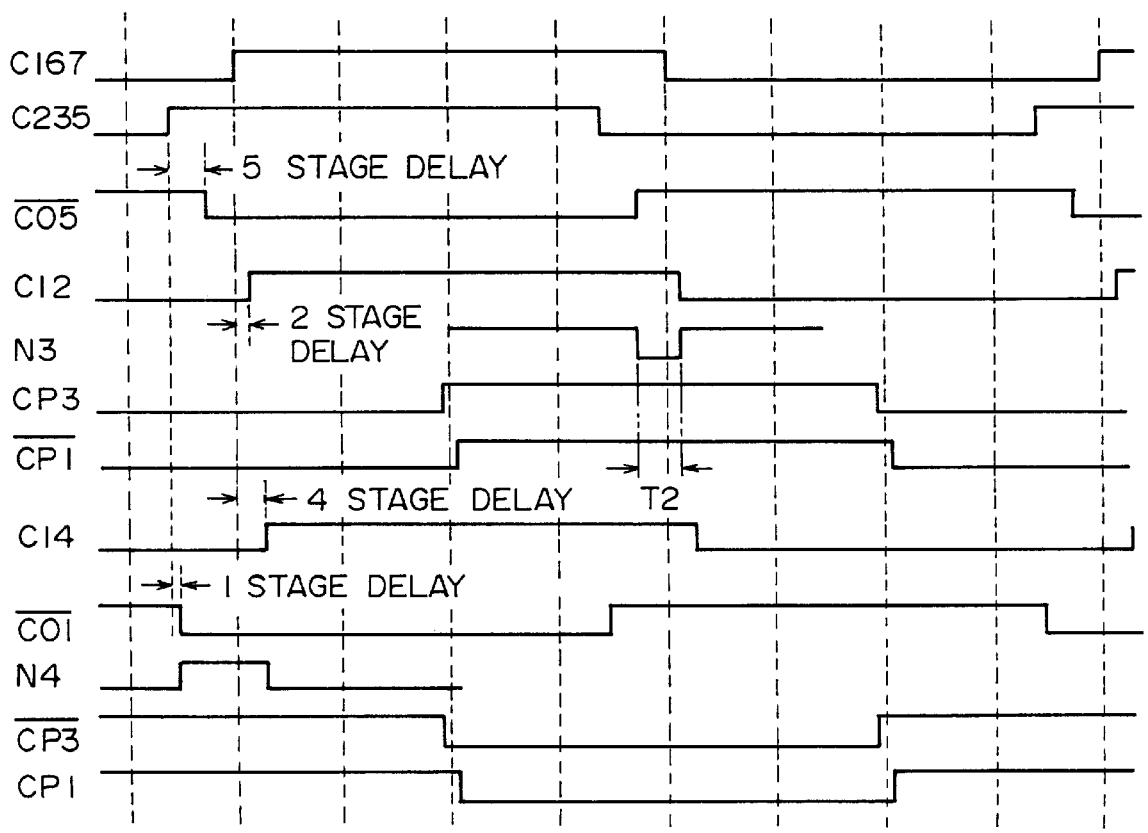
FIG. 48 is a waveform chart of an operation of the phase comparison and charge pump circuit shown in FIG. 34.

FIGS. 47 and 48 show a case in which a phase of the clock signal C235 output from the fixed delay circuit 635 is in advance of a phase of the clock signal C167 output from the fixed delay circuit 567.

In this case, as shown in FIG. 47, a period, during which the clock signal /CI5 output from the inverter 658 of the fixed delay circuit 649 overlaps the clock signal C02 output from the inverter 670 of the fixed delay circuit 652 at the H-level, is longer than a total delay time of the gate circuits corresponding to three stages. Thus, a pulsed voltage is output from the NAND circuit 710, and the pulsed voltage periodically turns on the pMOS transistor 711. In this case, since the pMOS transistor 702 is turned on, a pull-up operation is performed by the pMOS transistors 702, 708, 709 and 711. Accordingly, the delay time control voltage VC is increased.

It should be noted that, during a time period T1 shown in FIG. 47, the nMOS transistor 713 is turned on whereas the nMOS transistors 714 and 715 are maintained to be off. Thus, a pull-down operation is not performed by the nMOS transistors 713, 714, 715 and 704.

Additionally, as shown in FIG. 48, a period, during which the clock signal CI4 output from the inverter 657 of the fixed delay circuit 649 overlaps the clock signal /CO1 output from the inverter 669 of the fixed delay circuit 652 at the L-level, is longer than a total delay time of the gate circuits corresponding to three stages. Thus, a pulsed voltage is output from the NOR circuit 720, and the pulsed voltage periodically turns on the nMOS transistor 721. In this case, since the nMOS transistors 722 and 723 are turned on, a pull-down operation is performed by the nMOS transistors 721, 722, 723 and 707. Accordingly, the delay time control voltage VCZ is decreased.

It should be noted that, during a time period T2 shown in FIG. 48, the pMOS transistor 719 is turned on whereas the pMOS transistors 716 and 717 are maintained to be off. Thus, a pull-up operation is not performed by the pMOS transistors 705, 716, 717 and 719.

Accordingly, when the phase of the clock signal C235 output from the fixed delay circuit 635 is in advance of the phase of the clock signal C167 output from the fixed delay circuit 567, the delay time of each of the variable delay circuits 566, 584, 586, 600, 602, 616, 618, 632 and 634 is increased so that a delay control is performed so as to synchronize the clock signal C235 with the clock signal C167.

Figure 49:
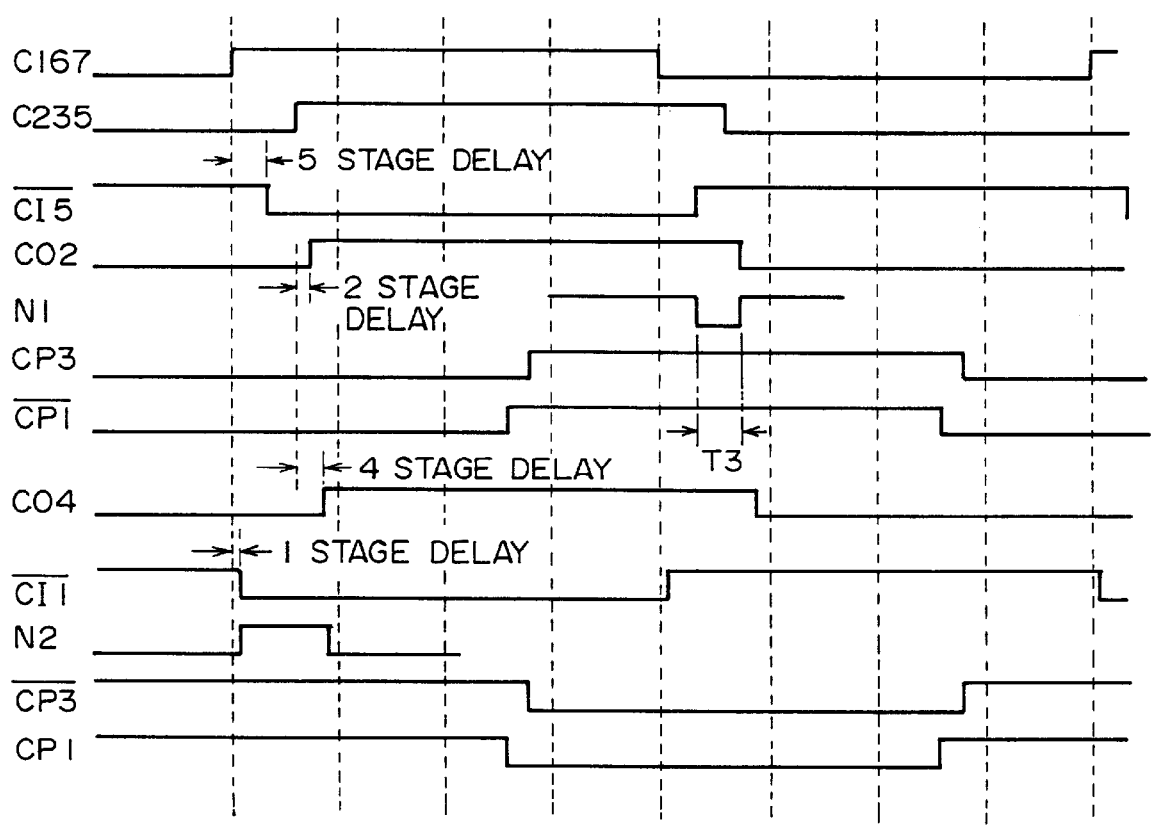
FIG. 49 is a waveform chart of an operation of the phase comparison and charge pump circuit shown in FIG. 34.
Figure 50:
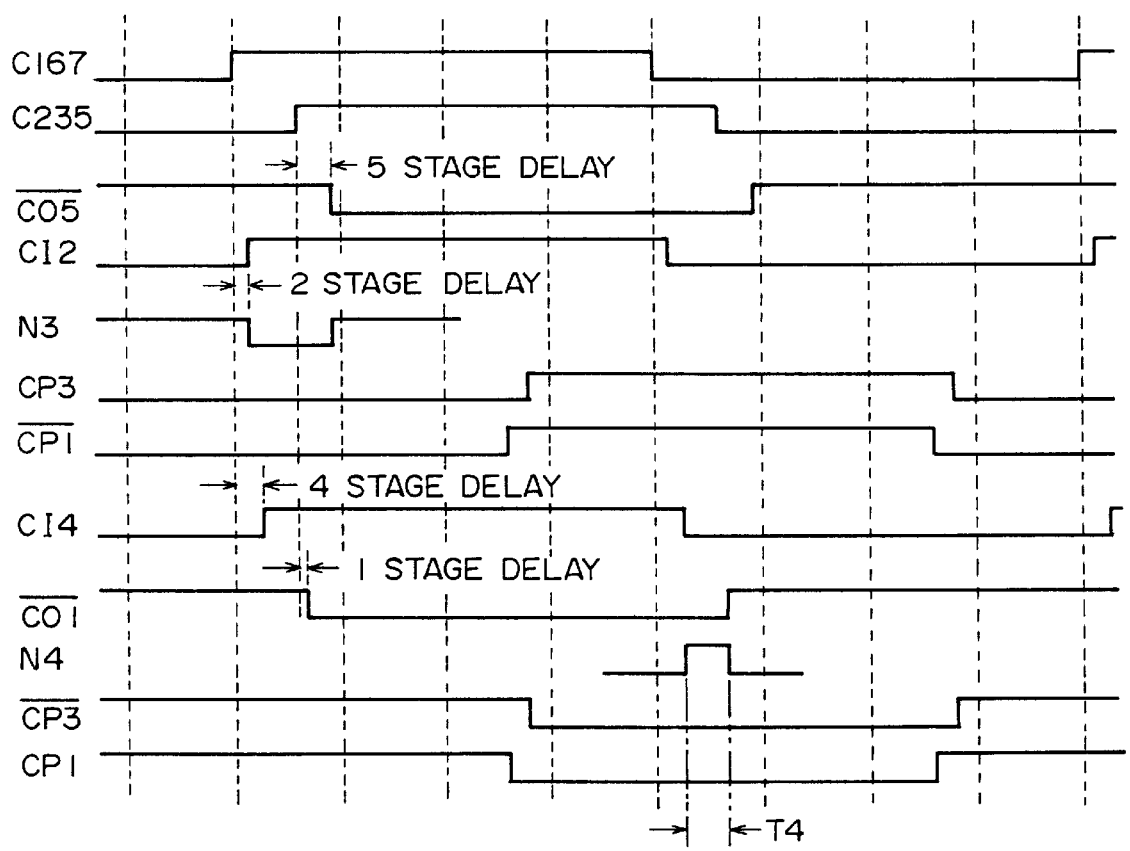
FIG. 50 is a waveform chart of an operation of the phase comparison and charge pump circuit shown in FIG. 34.

FIGS. 49 and 50 show a case in which a phase of the clock signal C235 output from the fixed delay circuit 635 is delayed from a phase of the clock signal C167 output from the fixed delay circuit 567.

In this case, as shown in FIG. 49, a period, during which the clock signal CO4 output from the inverter 672 of the fixed delay circuit 652 overlaps the clock signal /CI1 output from the inverter 654 of the fixed delay circuit 649 at the L-level, is longer than a total delay time of the gate circuits corresponding to three stages. Thus, a pulsed voltage is output from the NOR circuit 712, and the pulsed voltage periodically turns on the nMOS transistor 713. In this case, since the nMOS transistors 714 and 715 are turned on, a pull-down operation is performed by the nMOS transistors 713, 714, 715 and 704. Accordingly, the delay time control voltage VC is decreased.

It should be noted that, during a time period T3 shown in FIG. 49, the pMOS transistor 711 is turned on whereas the pMOS transistors 708 and 709 are maintained to be off. Thus, a pull-up operation is not performed by the pMOS transistors 702, 708, 709 and 711.

Additionally, as shown in FIG. 50, a period, during which the clock signal /CO5 output from the inverter 673 of the fixed delay circuit 652 overlaps the clock signal CI2 output from the inverter 655 of the fixed delay circuit 649 at the L-level, is longer than a total delay time of the gate circuits corresponding to three stages. Thus, a pulsed voltage is output from the NAND circuit 718, and the pulsed voltage periodically turns on the pMOS transistor 719. In this case, since the pMOS transistors 716 and 717 are turned on, a pull-up operation is performed by the pMOS transistors 705, 716, 717 and 719. Accordingly, the delay time control voltage VCZ is increased.

It should be noted that, during a time period T4 shown in FIG. 50, the nMOS transistor 721 is turned on whereas the nMOS transistors 722 and 723 are maintained to be off. Thus, a pull-down operation is not performed by the nMOS transistors 721, 722, 723 and 707.

Accordingly, when the phase of the clock signal C235 output from the fixed delay circuit 635 is delayed from the phase of the clock signal C167 output from the fixed delay circuit 567, the delay time of each of the variable delay circuits 566, 584, 586, 600, 602, 616, 618, 632 and 634 is decreased so that a delay control is performed so as to synchronize the clock signal C235 with the clock signal C167.

Figure 51:
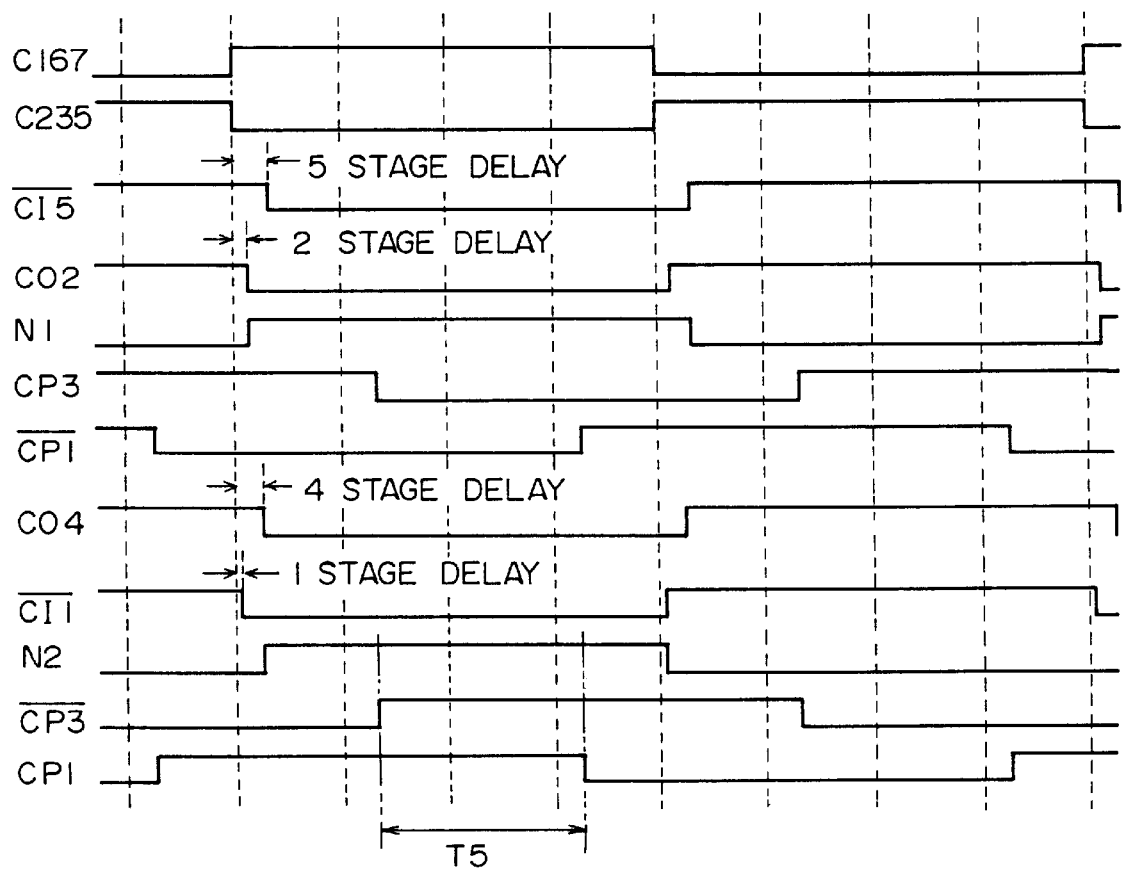
FIG. 51 is a waveform chart of an operation of the phase comparison and charge pump circuit shown in FIG. 34.
Figure 52:
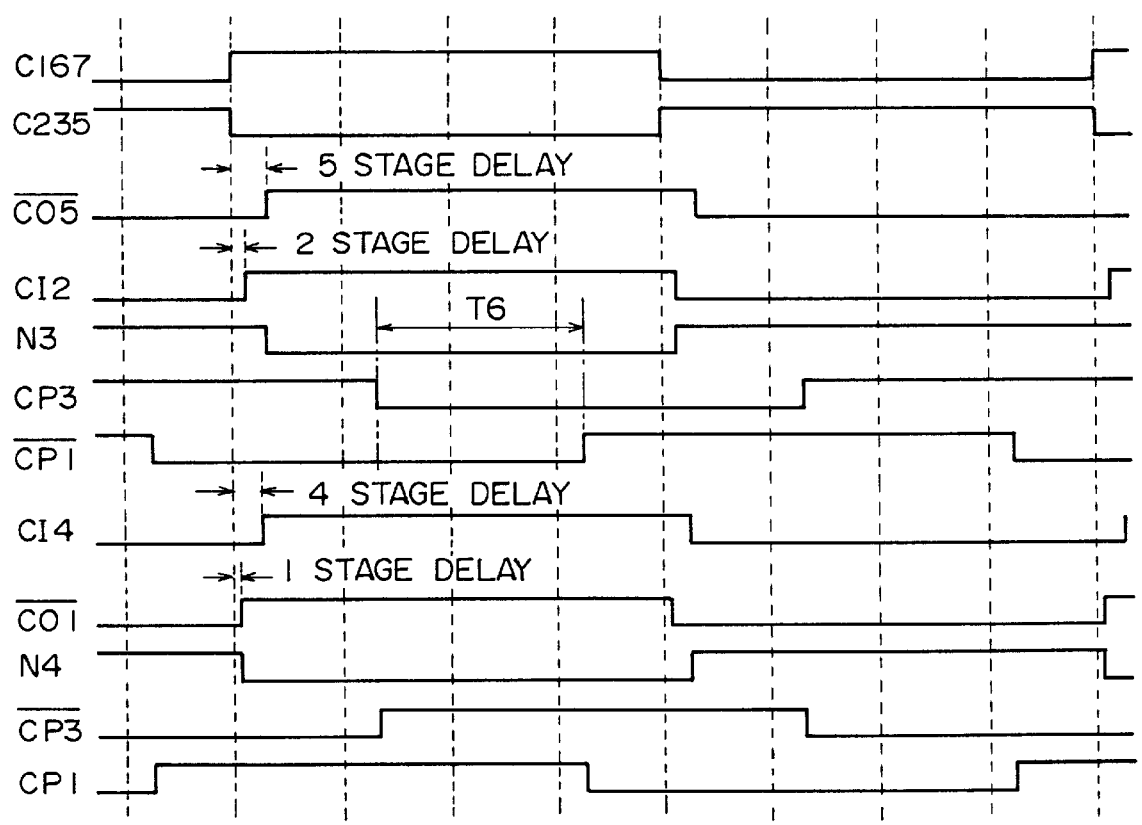
FIG. 52 is a waveform chart of an operation of the phase comparison and charge pump circuit shown in FIG. 34.

FIGS. 51 and 52 show a case in which a phase of the clock signal C235 output from the fixed delay circuit 635 is delayed from a phase of the clock signal C167 output from the fixed delay circuit 567 by 180 degrees.

In this case, during a time period T5 shown in FIG. 51, since nMOS transistors 713, 714 and 715 are all turned on, a pull-down operation is performed by the nMOS transistors 713, 714, 715 and 704. Thus, the delay time control voltage VC is rapidly decreased.

Additionally, during a time period T6 shown in FIG. 52, since pMOS transistors 716, 717 and 719 are all turned on, a pull-up operation is performed by the pMOS transistors 705, 716, 717 and 719. Thus, the delay time control voltage VCZ is rapidly increased.

It should be noted that, in this case, there in no possibility that all of the pMOS transistors 708, 709 and 711 are turned on simultaneously. Also, it is prevented that all of the nMOS transistors 721, 722 and 723 are turned on simultaneously.

Accordingly, when the phase of the clock signal C235 output from the fixed delay circuit 635 is delayed from the phase of the clock signal C167 output from the fixed delay circuit 567 by 180 degrees, the delay time of each of the variable delay circuits 584, 586, 600, 602, 616, 618, 632 and 634 is rapidly decreased so that a delay control is performed so as to rapidly shift the phase of the clock signal C235 toward the phase of the clock signal C167.

In the present embodiment, each of the eight variable delay circuits 584, 586, 600, 602, 616, 618, 632 and 634 has an identical circuit structure, and each of the eight fixed delay circuits 585, 587, 601, 603, 617, 619, 633 and 635 has an identical circuit structure. Additionally, a control is performed so that the clock signal C235 output from the fixed delay circuit 635 synchronizes with the clock signal C167 output from the fixed delay circuit 567.

Accordingly, the phase of the clock signal C185 output from the fixed delay circuit 585 is delayed from the phase of the clock signal C167 output from the fixed delay circuit 567 by 45 degrees. The phase of the clock signal C187 output from the fixed delay circuit 587 is delayed from the phase of the clock signal C167 output from the fixed delay circuit 567 by 90 degrees.

Additionally, the phase of the clock signal C201 output from the fixed delay circuit 601 is delayed from the phase of the clock signal C167 output from the fixed delay circuit 567 by 135 degrees. The phase of the clock signal C203 output from the fixed delay circuit 603 is delayed from the phase of the clock signal C167 output from the fixed delay circuit 567 by 180 degrees.

The phase of the clock signal C217 output from the fixed delay circuit 617 is delayed from the phase of the clock signal C167 output from the fixed delay circuit 567 by 225 degrees. The phase of the clock signal C219 output from the fixed delay circuit 619 is delayed from the phase of the clock signal C167 output from the fixed delay circuit 567 by 270 degrees.

Additionally, the phase of the clock signal C233 output from the fixed delay circuit 633 is delayed from the phase of the clock signal C167 output from the fixed delay circuit 567 by 315 degrees. The phase of the clock signal C235 output from the fixed delay circuit 635 is delayed from the phase of the clock signal C167 output from the fixed delay circuit 567 by 360 degrees.

As a result, when the clock signals which are output from the variable output circuits 584, 586, 600, 602, 616, 618, 632 and 634 or the clock signals which are obtained at the output terminals of a predetermined gate circuit other than the final stage gate circuits among the gate circuits included in the fixed delay circuits 585, 587, 601, 603, 617, 619, 633 and 635 are supplied to a circuit which requires a clock signal, a clock signal having a phase different from the phase of the main clock signal MC by 0 degrees, 45 degrees, 90 degrees, 135 degrees, 180 degrees, 225 degrees, 270 degrees or 315 degrees can be supplied irrespective of a process condition, a temperature change or a level of a power source voltage even when a data transmission circuit is provided.

For example, when a clock signal is supplied to a circuit which requires the clock signal, which clock signal is output from the first stage inverter 592 of the fixed delay circuit 585, through a data transmission circuit comprising three stages of the gate circuits, a clock signal having a phase difference of 45 degrees with respect to the clock signal C167 which is output from the fixed delay circuit 567 can be supplied irrespective of a process condition, a temperature change or a level of a power source voltage.

It should be appreciated that the features of the eighth embodiment to the fifteenth embodiment can be combined within the scope of the present invention. For example, the starter circuit and the phase comparison and charge pump circuit described with reference to the fifteenth embodiment may be applied to the eighth embodiment.

The present invention is not limited to the specifically disclosed embodiments, and variations and modifications may be made without departing from the scope of the present invention.

What is claimed is:

1. A semiconductor integrated circuit comprising:
   a plurality of data lines which are reset to a predetermined potential prior to transmitting data;
   a transceiver connected to said data lines, said transceiver encoding transmission data which is to be transmitted so as to change a potential of one of said data lines in accordance with contents of the data to be transmitted, the transmission data comprising a plurality of parallel bits; and
   a receiver connected to said data lines, said receiver decoding potentials of said data lines so as to regenerate the transmission data.

2. The semiconductor integrated circuit as claimed in claim 1, further comprising a data line precharge circuit which resets said plurality of said data lines by precharging said plurality of said data lines to a high potential level, wherein said transceiver includes a plurality of transceiver units, each of said transceiver units comprising:
   a plurality of n-channel insulated gate type field effect transistors each of which is provided to a corresponding one of said plurality of said data lines, a drain of each of said n-channel insulated gate type field effect transistors being connected to the corresponding one of said data lines, a source of each of said n-channel insulated gate type field effect transistors being grounded;
   an encoder controlled to be in one of an active state and an inactive state by a control signal, said encoder encoding the transmission data so that one of said plurality of said n-channel insulated gate type field effect transistors is turned on and the rest of said plurality of said n-channel insulated gate type field effect transistors are turned off in accordance with contents of the transmission data when said encoder is set to said active state, all of said plurality of said n-channel insulated gate type field effect transistors being turned off when said encoder is set to said inactive state.

3. The semiconductor integrated circuit as claimed in claim 1, further comprising a data line precharge circuit which resets said plurality of said data lines by precharging said plurality of said data lines to a high potential level, wherein said transceiver includes a plurality of transceiver units, each of said transceiver units comprising:
   a plurality of p-channel insulated gate type field effect transistors each of which is provided to a corresponding one of said plurality of said data lines, a source of each of said p-channel insulated gate type field effect transistors being connected to the corresponding one of said data lines, a drain of each of said p-channel insulated gate type field effect transistors being grounded;

an encoder controlled to be in one of an active state and an inactive state by a control signal, said encoder encoding the transmission data so that one of said plurality of said p-channel insulated gate type field effect transistors is turned on and the rest of said plurality of said p-channel insulated gate type field effect transistors are turned off in accordance with contents of the transmission data when said encoder is set to said active state, all of said plurality of said p-channel insulated gate type field effect transistors being turned off when said encoder is set to said inactive state.

4. The semiconductor integrated circuit as claimed in claim 3, wherein said encoder comprises a path gate logic circuit.

5. The semiconductor integrated circuit as claimed in claim 1, further comprising a data line precharge circuit which resets said plurality of said data lines by precharging said plurality of said data lines to a high potential level, wherein said transceiver comprises:

a plurality of latch circuits which hold data read from memory cells as complementary data; and a first path gate logic circuit connected between said plurality of said data lines and complementary data holding nodes of said plurality of said latch circuits, said first path gate logic circuit encoding the complementary data held by said plurality of said latch circuits as the transmission data so as to discharge one of said plurality of said data lines in accordance with contents of the complementary data.

6. The semiconductor integrated circuit as claimed in claim 5, wherein said receiver comprises:

a second path gate logic circuit which decodes potentials of said plurality of said data lines so as to regenerate the complementary data held by said plurality of said latch circuits; and an amplifying circuit which amplifies an output of said second path gate logic circuit.

7. The semiconductor integrated circuit as claimed in claim 5, wherein said receiver comprises:

an analog multiplying circuit which decodes potentials of said plurality of said data lines so as to regenerate the complementary data held by said plurality of said latch circuits; and an amplifying circuit which amplifies an output of said analog multiplying circuit.

8. The semiconductor integrated circuit as claimed in claim 5, wherein a number of said plurality of data lines is four, and said plurality of said latch circuits includes a first latch circuit and a second latch circuit, wherein said first latch circuit includes a first n-channel insulated gate type field effect transistor and a second n-channel insulated gate type field effect transistor, drains and gates of said first and second n-channel insulated gate type field effect transistors being cross connected, said drains of said first and second n-channel insulated gate type field effect transistors being connected to a pair of a first bit line and a second bit line which are connected to said memory cells when the transmission data is read from said memory cells; and said second latch circuit includes a third n-channel insulated gate type field effect transistor and a fourth n-channel insulated gate type field effect transistor, drains and gates of said third and fourth n-channel insulated gate type field effect transistors being cross connected, said drains of said third and fourth n-channel insulated gate type field effect transistors being connected to a pair of a third bit line and a fourth bit line which are connected to said memory cells when the transmission data is read from said memory cells.

9. The semiconductor integrated circuit as claimed in claim 8, wherein said first path gate logic circuit includes first, second, third and fourth p-channel insulated gate type field effect transistors, a source of each of said first, second, third and fourth p-channel insulated gate type field effect transistors being connected to a corresponding one of said data lines, a drain of each of said first, second, third and fourth p-channel insulated gate type field effect transistors being connected to a corresponding one of said complementary data holding nodes of said first and second latch circuits, a gate of each of said first, second, third and fourth p-channel insulated gate type field effect transistors being connected to a corresponding one of said complementary data holding nodes of said first and second latch circuits so that one of said four data lines is discharged in accordance with contents of the complementary data held by said first and second latch circuits when the transmission data is transmitted.

10. The semiconductor integrated circuit as claimed in claim 9, wherein said receiver comprises:

a second path gate logic circuit which includes fifth, sixth, seventh, eighth, ninth, tenth, eleventh and twelfth p-channel insulated gate type field effect transistors, sources and gates of said fifth and sixth p-channel insulated gate type field effect transistors being cross connected, said drains of said fifth and sixth p-channel insulated gate type field effect transistors being connected to a first node, each of said sources of said fifth and sixth p-channel insulated gate type field effect transistors being connected to a corresponding one of said plurality of said four data lines, sources and gates of said seventh and eighth p-channel insulated gate type field effect transistors being cross connected, said drains of said seventh and eighth p-channel insulated gate type field effect transistors being connected to a second node, each of said sources of said seventh and eighth p-channel insulated gate type field effect transistors being connected to a corresponding one of said plurality of said four data lines, sources and gates of said ninth and tenth p-channel insulated gate type field effect transistors being cross connected, said drains of said ninth and tenth p-channel insulated gate type field effect transistors being connected to a third node, each of said sources of said ninth and tenth p-channel insulated gate type field effect transistors being connected to a corresponding one of said plurality of said four data lines, sources and gates of said eleventh and twelfth p-channel insulated gate type field effect transistors being cross connected, said drains of said eleventh and twelfth p-channel insulated gate type field effect transistors being connected to a fourth node, each of said sources of said eleventh and twelfth p-channel insulated gate type field effect transistors being connected to a corresponding one of said plurality of said four data lines;

a reset circuit which resets said first, second, third and fourth nodes to a ground potential prior to a transmission of the transmission data;

a third latch circuit including fifth and sixth n-channel insulated gate type field effect transistors, drains and gates of said fifth and sixth n-channel insulated gate type field effect transistors being cross connected, said drains of said fifth and sixth n-channel insulated gate type field effect transistors being connected to said first and second nodes, respectively; and a fourth latch circuit including seventh and eighth n-channel insulated gate type field effect transistors, drains and gates of said seventh and eighth n-channel insulated gate type field effect transistors being cross connected, said drains of said seventh and eighth n-channel insulated gate type field effect transistors being connected to said third and fourth nodes, respectively.

11. The semiconductor integrated circuit as claimed in claim 9, wherein said receiver comprises a first decoder which regenerates the complementary data held by said first latch circuit and a second decoder which regenerates the complementary data held by said second latch circuit, said first decoder including:

a first analog amplifying circuit including ninth, tenth, eleventh and twelfth n-channel insulated gate type field effect transistors, wherein a drain of said ninth n-channel insulated gate type field effect transistor is connected to a fifth node, a gate of said ninth n-channel insulated gate type field effect transistor being connected to a corresponding one of said data lines, a drain of said tenth n-channel insulated gate type field effect transistor being connected to a source of said ninth n-channel insulated gate type field effect transistor, a gate of said tenth n-channel insulated gate type field effect transistor being connected to a corresponding one of said data lines, a source of said tenth n-channel insulated gate type field effect transistor being connected to a sixth node, a drain of said eleventh n-channel insulated gate type field effect transistor being connected to said fifth node, a gate of said eleventh n-channel insulated gate type field effect transistor being connected to a gate of said tenth n-channel insulated gate type field effect transistor, a drain of said twelfth n-channel insulated gate type field effect transistor being connected a source of said eleventh n-channel insulated gate type field effect transistor, a gate of said twelfth n-channel insulated gate type field effect transistor being connected to a gate of said ninth n-channel insulated gate type field effect transistor, a source of said twelfth n-channel insulated gate type field effect transistor being connected to said sixth node;

a second analog amplifying circuit including thirteenth, fourteenth, fifteenth and sixteenth n-channel insulated gate type field effect transistors, wherein a drain of said thirteenth n-channel insulated gate type field effect transistor is connected to a seventh node, a gate of said thirteenth n-channel insulated gate type field effect transistor being connected to a corresponding one of said data lines, a drain of said fourteenth n-channel insulated gate type field effect transistor being connected to a source of said thirteenth n-channel insulated gate type field effect transistor, a gate of said fourteenth n-channel insulated gate type field effect transistor being connected to a corresponding one of said data lines, a source of said fourteenth n-channel insulated gate type field effect transistor being connected to an eighth node, a drain of said fifteenth n-channel insulated gate type field effect transistor being connected to said seventh node, a gate of said fifteenth n-channel insulated gate type field effect transistor being connected to said gate of said fourteenth n-channel insulated gate type field effect transistor, a drain of said sixteenth n-channel insulated gate type field effect transistor being connected to a source of said fifteenth n-channel insulated gate type field effect transistor, a gate of said sixteenth n-channel insulated gate type field effect transistor being connected to said gate of said thirteenth n-channel insulated gate type field effect transistor, a source of said sixteenth n-channel insulated gate type field effect transistor being connected to said eighth node;

a fifth latch circuit including thirteenth and fourteenth p-channel insulated gate type field effect transistors and seventeenth and eighteenth n-channel insulated gate type field effect transistors, wherein gates and drains of said thirteenth and fourteenth p-channel insulated gate type field effect transistors are cross connected, said drains of said thirteenth and fourteenth p-channel insulated gate type field effect transistors being connected to said fifth and seventh nodes, respectively, a power source voltage being provided to sources of said thirteenth and fourteenth p-channel insulated gate type field effect transistors, a drain of said seventeenth n-channel insulated gate type field effect transistor being connected to said sixth node, a gate of said seventeenth n-channel insulated gate type field effect transistor being connected to said seventh node, a drain of said eighteenth n-channel insulated gate type field effect transistor being connected to said eighth node, a gate of said eighteenth n-channel insulated gate type field effect transistor being connected to said fifth node; and a first reset circuit including fifteenth and sixteenth p-channel insulated gate type field effect transistors and nineteenth and twentieth n-channel insulated gate type field effect transistors, wherein a drain of said fifteenth p-channel insulated gate type field effect transistor is connected to said fifth node, the power source voltage being provided to a source of said fifteenth p-channel insulated gate type field effect transistor, an on/off operation of said fifteenth p-channel insulated gate type field effect transistor being controlled by a reset signal, a drain of said sixteenth p-channel insulated gate type field effect transistor being connected to said seventh node, the power source voltage being provided to a source of said sixteenth p-channel insulated gate type field effect transistor, an on/off operation of said sixteenth p-channel insulated gate type field effect transistor being controlled by the reset signal, a drain of said nineteenth n-channel insulated gate type field effect transistor being connected to a source of said seventeenth n-channel insulated gate type field effect transistor, a ground voltage being provided to a source of said nineteenth n-channel insulated gate type field effect transistor, an on/off operation of said nineteenth n-channel insulated gate type field effect transistor being controlled by the reset signal, a drain of said twentieth n-channel insulated gate type field effect transistor being connected to a source of said eighteenth n-channel insulated gate type field effect transistor, the ground voltage being provided to a source of said twentieth n-channel insulated gate type field effect transistor, an on/off operation of said twentieth n-channel insulated gate type field effect transistor being controlled by the reset signal, and said second decoder including:
a third analog amplifying circuit including twenty-first, twenty-second, twenty-third and twenty-fourth n-channel insulated gate type field effect transistors, wherein a drain of said twenty-first n-channel insulated gate type field effect transistor is connected to a ninth node, a gate of said twenty-first n-channel insulated gate type field effect transistor being connected to a corresponding one of said data lines, a drain of said twenty-second n-channel insulated gate type field effect transistor being connected to a source of said twenty-first n-channel insulated gate type field effect transistor, a gate of said twenty-second n-channel insulated gate type field effect transistor being connected to a corresponding one of said data lines, a source of said twenty-second n-channel insulated gate type field effect transistor being connected to a tenth node, a drain of said twenty-third n-channel insulated gate type field effect transistor being connected to said ninth node, a gate of said twenty-third n-channel insulated gate type field effect transistor being connected to a gate of said twenty-second n-channel insulated gate type field effect transistor, a drain of said twenty-fourth n-channel insulated gate type field effect transistor being connected a source of said twenty-third n-channel insulated gate type field effect transistor, a gate of said twenty-fourth n-channel insulated gate type field effect transistor being connected to a gate of said twenty-first n-channel insulated gate type field effect transistor, a source of said twenty-fourth n-channel insulated gate type field effect transistor being connected to said tenth node;
a fourth analog amplifying circuit including twenty-fifth, twenty-sixth, twenty-seventh and twenty-eighth n-channel insulated gate type field effect transistors, wherein a drain of said twenty-fifth n-channel insulated gate type field effect transistor is connected to an eleventh node, a gate of said twenty-fifth n-channel insulated gate type field effect transistor being connected to a corresponding one of said data lines, a drain of said twenty-sixth n-channel insulated gate type field effect transistor being connected to a source of said twenty-fifth n-channel insulated gate type field effect transistor, a gate of said twenty-sixth n-channel insulated gate type field effect transistor being connected to a corresponding one of said data lines, a source of said twenty-sixth n-channel insulated gate type field effect transistor being connected to a twelfth node, a drain of said twenty-seventh n-channel insulated gate type field effect transistor being connected to said eleventh node, a gate of said twenty-seventh n-channel insulated gate type field effect transistor being connected to said gate of said twenty-sixth n-channel insulated gate type field effect transistor, a drain of said twenty-eighth n-channel insulated gate type field effect transistor being connected to a source of said twenty-seventh n-channel insulated gate type field effect transistor, a gate of said twenty-eighth n-channel insulated gate type field effect transistor being connected to said gate of said twenty-fifth n-channel insulated gate type field effect transistor, a source of said twenty-eighth n-channel insulated gate type field effect transistor being connected to said twelfth node;
a sixth latch circuit including seventeenth and eighteenth p-channel insulated gate type field effect transistors and twenty-ninth and thirtieth n-channel insulated gate type field effect transistors, wherein gates and drains of said seventeenth and eighteenth p-channel insulated gate type field effect transistors are cross connected, said drains of said seventeenth and eighteenth p-channel insulated gate type field effect transistors being connected to said ninth and eleventh nodes, respectively, the power source voltage being provided to sources of said seventeenth and eighteenth p-channel insulated gate type field effect transistors, a drain of said twenty-ninth n-channel insulated gate type field effect transistor being connected to said tenth node, a gate of said twenty-ninth n-channel insulated gate type field effect transistor being connected to said eleventh node, a drain of said thirtieth n-channel insulated gate type field effect transistor being connected to said twelfth node, a gate of said thirtieth n-channel insulated gate type field effect transistor being connected to said ninth node; and
a second reset circuit including nineteenth and twentieth p-channel insulated gate type field effect transistors and thirty-first and thirty-second n-channel insulated gate type field effect transistors, wherein a drain of said nineteenth p-channel insulated gate type field effect transistor is connected to said ninth node, the power source voltage being provided to a source of said nineteenth p-channel insulated gate type field effect transistor, an on/off operation of said nineteenth p-channel insulated gate type field effect transistor being controlled by the reset signal, a drain of said twentieth p-channel insulated gate type field effect transistor being connected to said eleventh node, the power source voltage being provided to a source of said twentieth p-channel insulated gate type field effect transistor, an on/off operation of said twentieth p-channel insulated gate type field effect transistor being controlled by the reset signal, a drain of said thirty-first n-channel insulated gate type field effect transistor being connected to a source of said twenty-ninth n-channel insulated gate type field effect transistor, the ground voltage being provided to a source of said thirty-first n-channel insulated gate type field effect transistor, an on/off operation of said thirty-first n-channel insulated gate type field effect transistor being controlled by the reset signal, a drain of said thirty-second n-channel insulated gate type field effect transistor being connected to a source of said thirtieth n-channel insulated gate type field effect transistor, the ground voltage being provided to a source of said thirty-second n-channel insulated gate type field effect transistor, an on/off operation of said thirty-second n-channel insulated gate type field effect transistor being controlled by the reset signal.

* * * * *

UNITED STATES PATENT AND TRADEMARK OFFICE
CERTIFICATE OF CORRECTION

PATENT NO.   : 6,292,408 B1
DATED        : September 18, 2001
INVENTOR(S)  : Kawashima et al.

It is certified that error appears in the above-identified patent and that said Letters Patent is hereby corrected as shown below:

<u>Title page,</u>
Below Item [76] Inventors, please insert the Assignee information -- Fujitsu Limited, Kawasaki, Japan --.

Signed and Sealed this

Tenth Day of June, 2003

JAMES E. ROGAN
*Director of the United States Patent and Trademark Office*